United States Patent
Higashi et al.

(10) Patent No.: US 6,475,700 B1
(45) Date of Patent: Nov. 5, 2002

(54) LITHOGRAPHIC PRINTING PLATE PRECURSOR

(75) Inventors: Tatsuji Higashi; Kazuhiro Fujimaki, both of Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 48 days.

(21) Appl. No.: 09/695,143

(22) Filed: Oct. 25, 2000

(30) Foreign Application Priority Data

Oct. 27, 1999 (JP) .......................................... 11-305734

(51) Int. Cl.$^7$ ............................. G03F 7/09; G03F 7/028
(52) U.S. Cl. .................................. 430/278.1; 430/284.1
(58) Field of Search ............................ 430/278.1, 284.1

(56) References Cited

U.S. PATENT DOCUMENTS 5,952,154  9/1999  Barr et al. ................ 430/284.1

FOREIGN PATENT DOCUMENTS

| EP | 0452139 A2 | 10/1991 |
| EP | 0602292 A1 | 6/1994 |
| JP | B-2712564 | 10/1997 |

OTHER PUBLICATIONS

Nakamura et al, CA 115: 38696, ACS, English Abstract of JP 03004225 A2 published Jan. 1999, one page, Online Chemical Abstracts.*

* cited by examiner

*Primary Examiner*—Cynthia Hamilton
(74) *Attorney, Agent, or Firm*—Burns, Doane, Swecker & Mathis, LLP

(57) ABSTRACT

A lithographic printing plate precursor is disclosed, comprising an aluminum support having thereon a photopolymerizable photosensitive layer which contains (1) an alkali-soluble urethane binder having at least one ethylenically unsaturated polymerizable group on the side chain thereof, (2) an addition polymerizable compound having an ethylenically unsaturated double bond, and (3) a photopolymerization initiator.

7 Claims, No Drawings

LITHOGRAPHIC PRINTING PLATE PRECURSOR

FIELD OF THE INVENTION

This invention relates to a lithographic printing plate precursor comprising a photopolymerizable composition. More particularly, it relates to a negatively working lithographic printing plate precursor having high sensitivity to visible light, high mechanical strength and, especially, excellent highlight characteristics.

BACKGROUND OF THE INVENTION

Negatively working lithographic printing plate precursors are widely known and include various types according to the photosensitive layer, such as a diazo resin-containing type, a photopolymerizable type, and photo-crosslinkable type. A lithographic printing plate is generally produced from these negatively working lithographic printing plate precursors by imagewise exposure to ultraviolet light with a transparent negative film original (lith film) in contact with the photosensitive layer, which is a laborious and time-consuming process.

The recent development of image formation techniques has enabled production of a printing plate without using a film original. For example, a printing plate precursor having a highly sensitive photopolymerizable layer fit for non-contact projection alignment or visible laser beam scanning is scanned with a laser beam of small diameter to directly form an image.

However, conventional printing plates of this type do not necessarily have strong adhesion between the photosensitive layer and the support and tend to produce such defects as missing of a solid image, a fine line or a highlight when used for high-speed large-volume printing Further, when a printing plate as mounted on a printing machine is wiped with a plate cleaner to remove ink scum in the course of printing, the highlight tends to come off because of weak adhesion to the support. In large-volume printing, too, the weak adhesion to the support also causes fine lines and highlights to successively vanish as in the case of wiping with a plate cleaner.

There have recently been keen market demands that the exposure time be shortened for improvement of productivity and that the laser be used at a lower output for extension of its service life. It is a perennial subject in the art to increase the sensitivity of a lithographic printing plate precursor capable of direct platemaking. However, under the present situation it is very difficult to develop a photopolymerizable lithographic printing plate or a precursor thereof which has higher sensitivity and sufficient adhesion between the photosensitive layer and the support thereby retaining its initial tone reproducibility even when wiped with a plate cleaner in the course of printing or when used for producing hundred thousands of prints and also which is resistant to staining.

JP-B-2712564 proposes incorporating a polyurethane resin having an allyl group into a photosensitive layer as a binder for the purpose of improving abrasion resistance. However, application of the disclosed technique fails to obtain a lithographic printing plate precursor with sufficient characteristics.

SUMMARY OF THE INVENTION

Accordingly, an object of the present invention is to provide a negatively working photopolymerizable lithographic printing plate precursor having high sensitivity and strong adhesion between the photosensitive layer and the support and capable of direct writing with a laser thereby providing. a lithographic printing plate which is excellent in press life and stain resistance and does not suffer from missing of fine lines or highlights.

As a result of extensive investigation, the present inventors have found that the above object of the invention is accomplished by incorporating an alkali-soluble urethane binder having at least one ethylenically unsaturated polymerizable group in the side chain thereof as a binder component of a photopolymerizable photosensitive layer.

The present invention provides a lithographic printing plate precursor comprising an aluminum support having thereon a photopolymerizable photosensitive layer which contains (1) an alkali-soluble urethane binder having at least one ethylenically unsaturated polymerizable group on the side chain thereof, (2) an addition polymerizable compound having an ethylenically unsaturated double bond, and (3) a photopolymerization initiator.

In a highly preferred embodiment of the invention, the urethane binder is a reaction product between (A) an ethylenically unsaturated group-containing diisocyanate compound obtained by allowing (A1) a compound having three or more isocyanate groups per molecule and (A2) an ethylenically unsaturated compound having an active hydrogen atom to react and (B) a diol compound having an alkali-soluble group.

While the mechanism of action of the urethane binder according to the invention is not necessarily clear, it is considered that the ethylenically unsaturated polymerizable group in the side chain causes the urethane binder itself to undergo radical polymerization to afford a denser crosslinked structure. According to JP-B-2712564, on the other hand, since the side chain possessed by the urethane binder is an allyl group, the urethane binder itself does not undergo such a radical polymerization reaction as to form a sufficiently dense crosslinked structure.

DETAILED DESCRIPTION OF THE INVENTION

[I] Alkali-soluble Urethane Binder Having at Last One Ethylenically Unsaturated Polymerizable Group in the Side Chain The urethane binder, which is to be incorporated into the photopolymerizable photosensitive layer of the lithographic printing plate precursor according to the invention, is the most essential element of the present invention. While the urethane binder is not particularly limited as long as it is alkali-soluble and carries at least one ethylenically unsaturated polymerizable group in its side chain, it is preferably a polyurethane resin obtained by the reaction between (A) a diisocyanate compound containing an ethylenically unsaturated group and (B) a diol compound containing an alkali-soluble group.

(A) Ethylenically Unsaturated Group-containing Diisocyanate Compound

The method of obtaining the ethylenically unsaturated group-containing diisocyanate compound (A) is not particularly restricted. For example, it is obtainable by allowing (A1) a compound having three or more isocyanate groups (hereinafter simply referred to as a polyisocyanate compound) and (A2) an ethylenically unsaturated compound having an active hydrogen group to react in such a manner as to leave two isocyanate groups of the polyisocyanate compound unreacted.

Where the polyisocyanate compound (A1) is a triisocyanate compound having three isocyanate groups, it is allowed to addition react with an equivalent of an ethylenically unsaturated compound having one active hydrogen group. Where the polyisocyanate compound is a tetraisocyanate compound having four isocyanate groups, it is allowed to addition react with two equivalents of an ethylenically unsaturated compound having one active hydrogen group or an equivalent of an ethylenically unsaturated compound having two active hydrogen groups.

The polyisocyanate compound is not particularly limited, but a triisocyanate compound is preferred for its availability. Suitable triisocyanate compounds are shown below.

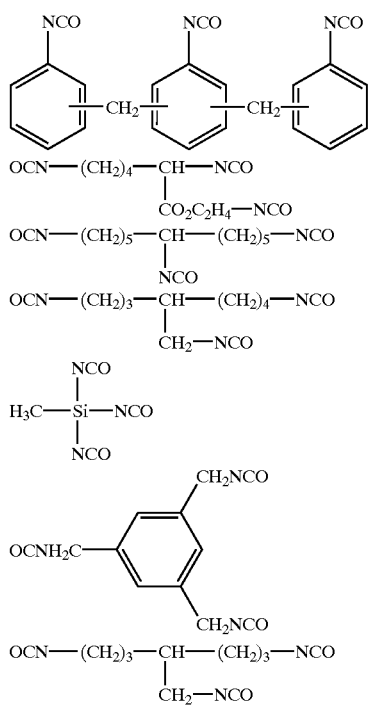

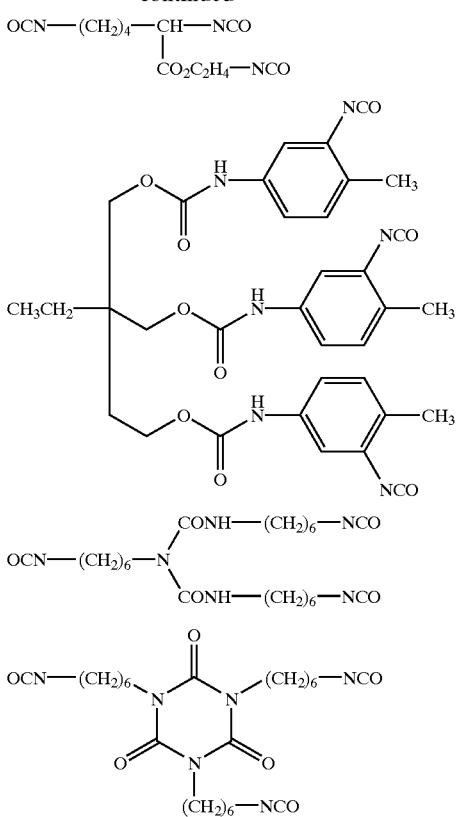

The ethylenically unsaturated compound having an active hydrogen group (A2) is not particularly limited. Useful ones include monofunctional alcohol or amine compounds having an ethylenically unsaturated group. Illustrative examples of suitable monofunctional alcohol or amine compounds having an ethylenically unsaturated group are listed below.

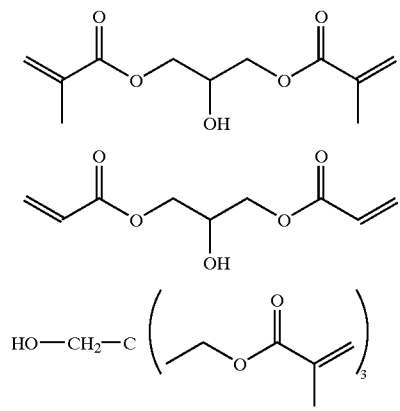

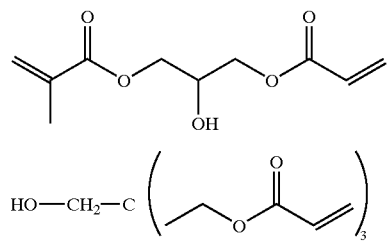

-continued
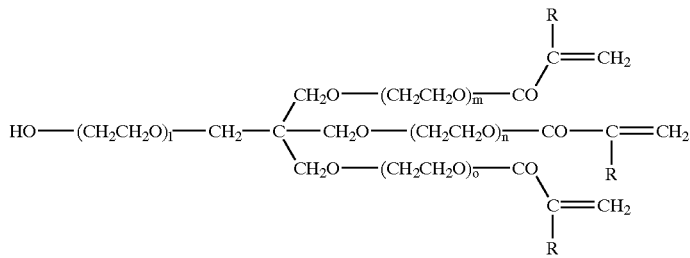
R = a hydrogen atom or a methyl group
l, m, n, o = an integer of 1–20
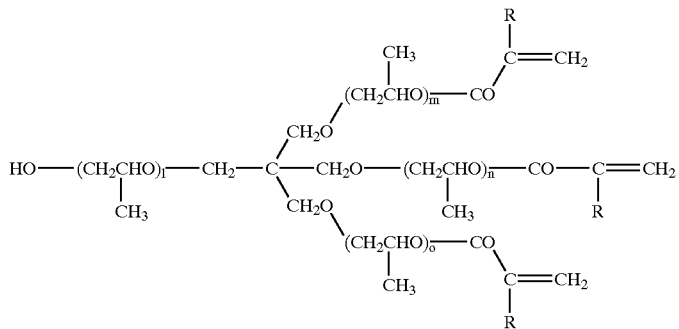
R = a hydrogen atom or a methyl group
l, m, n, o = an integer of 1–20
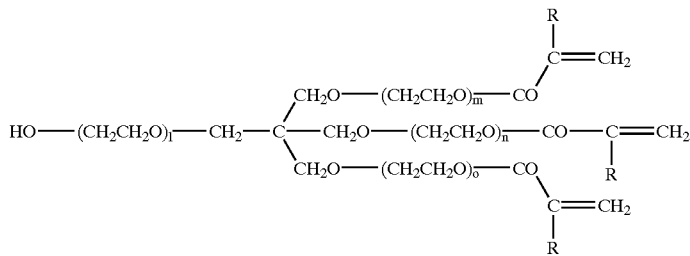
R = a hydrogen atom or a methyl group
l, m, n, o = an integer of 1–20
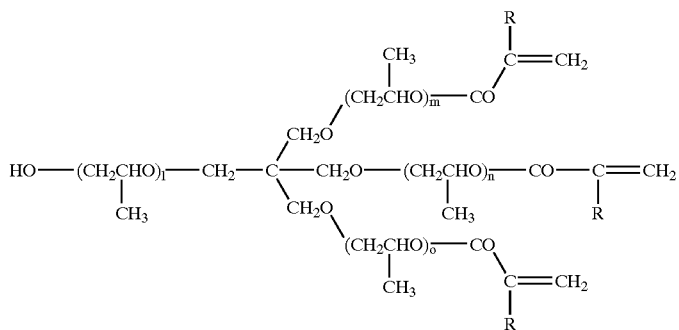
R = a hydrogen atom or a methyl group
l, m, n, o = an integer of 1–20
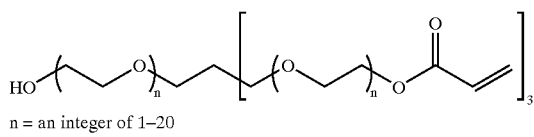
n = an integer of 1–20
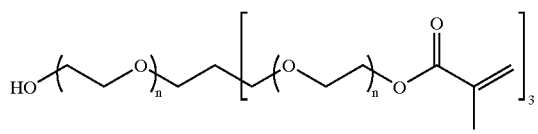
n = an integer of 1–20
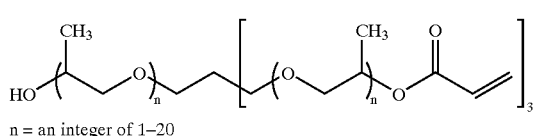
n = an integer of 1–20
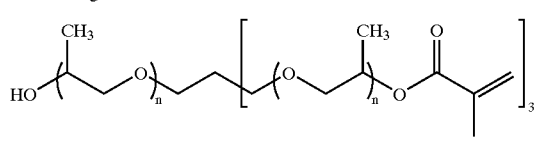
n = an integer of 1–20

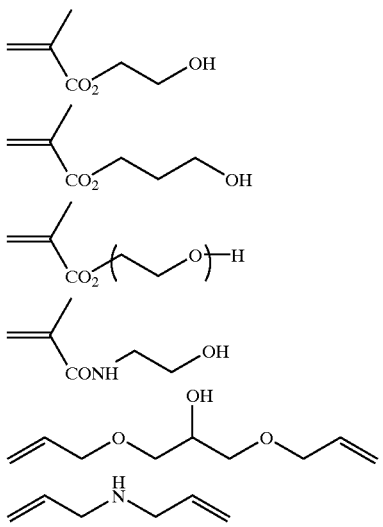
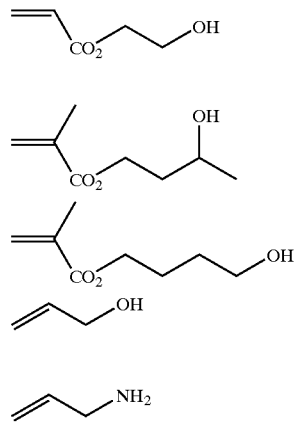
Illustrative examples of the ethylenically unsaturated group-containing diisocyanate compound (A) which is obtained by the reaction between (A1′) a triisocyanate compound and (A2′) an equivalent of a monofunctional alcohol or amine compound having an ethylenically unsaturated group are shown below.
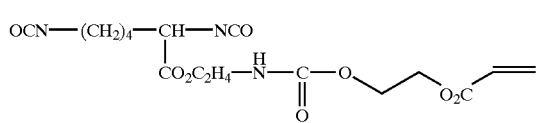
(1)
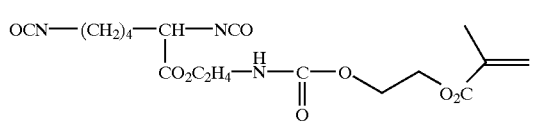
(2)
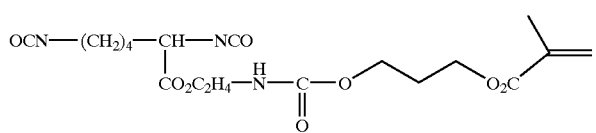
(3)
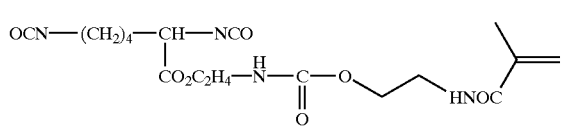
(4)
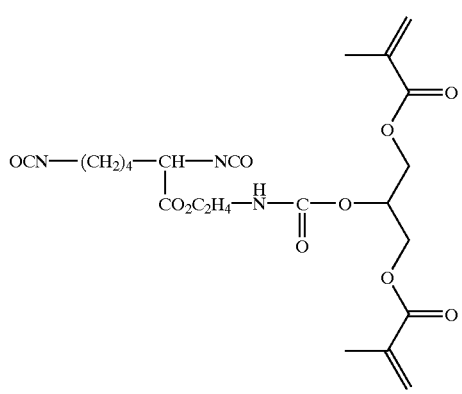
(5)

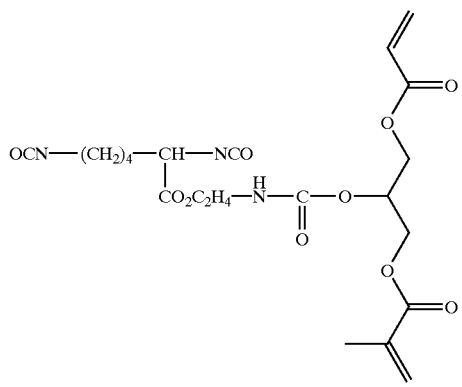
(6)
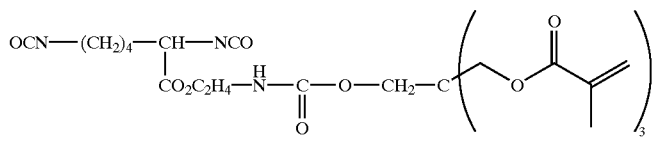
(7)
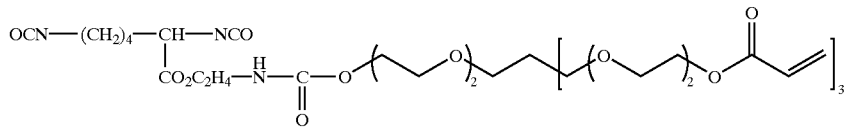
(8)
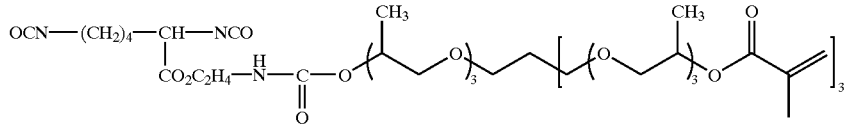
(9)
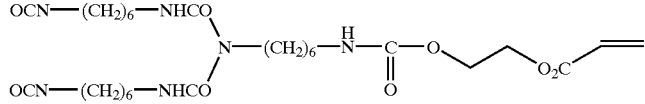
(10)
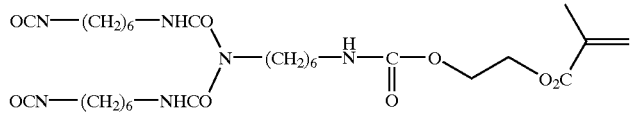
(11)
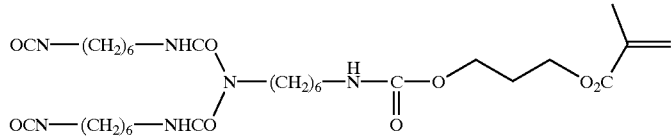
(12)
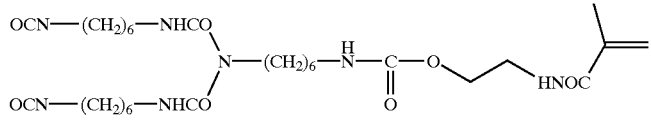
(13)

(14)
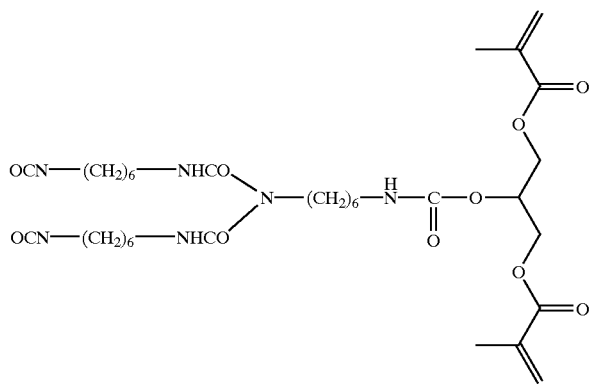
(15)
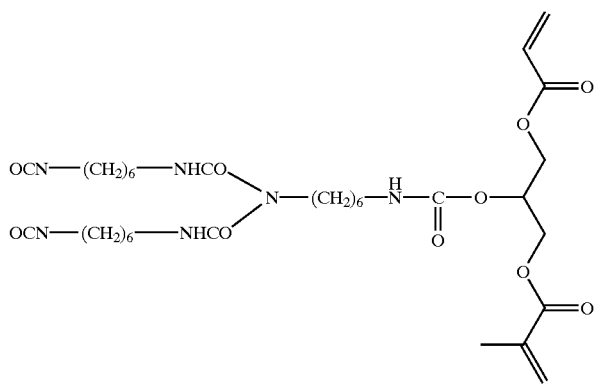
(16)
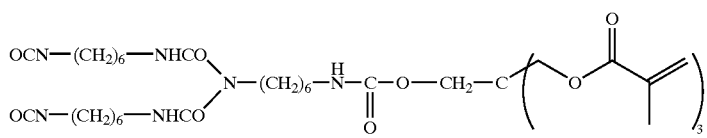
(17)
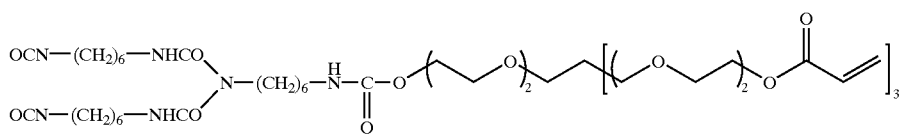
(18)
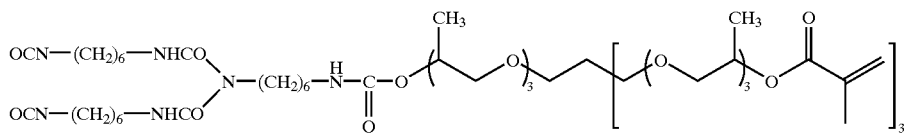
(19)
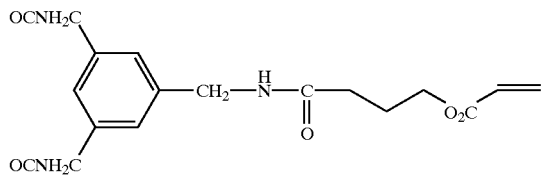
(20)
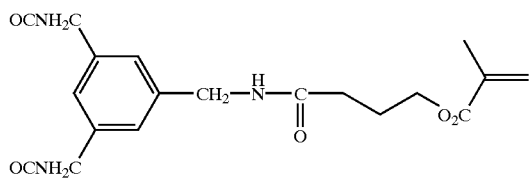

-continued
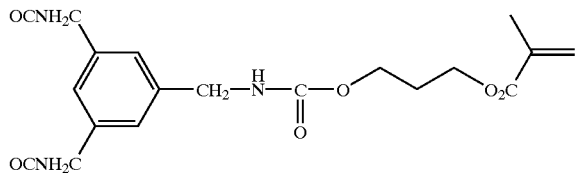
(21)
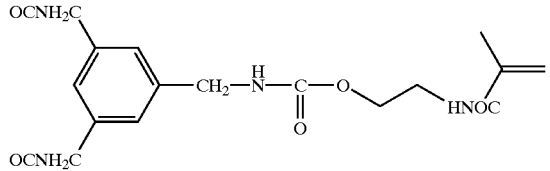
(22)
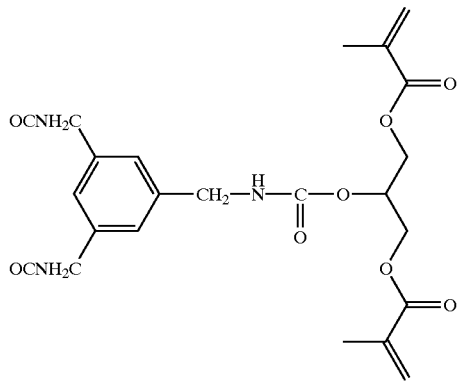
(23)
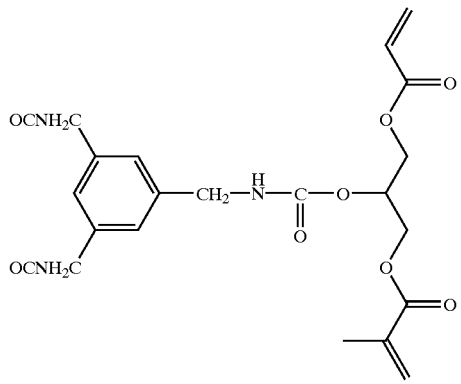
(24)
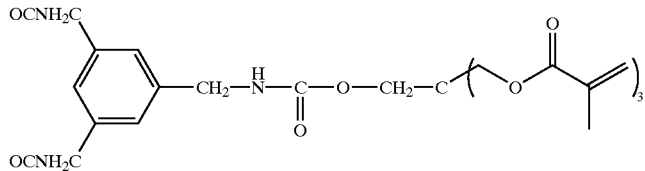
(25)
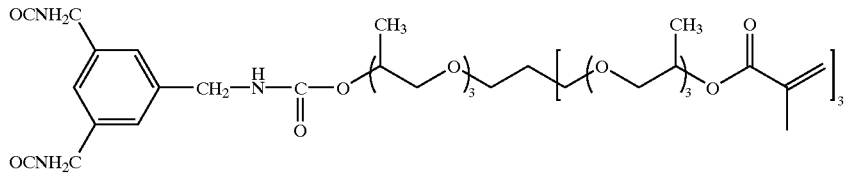
(26)

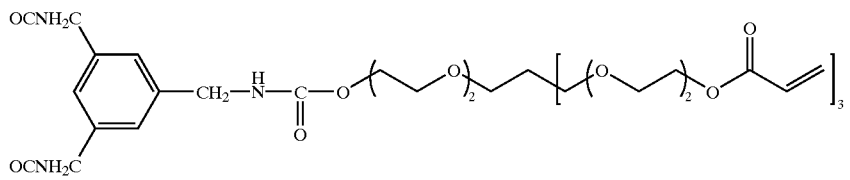
(27)
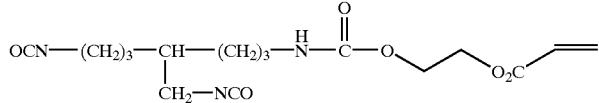
(28)
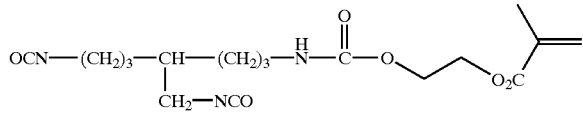
(29)
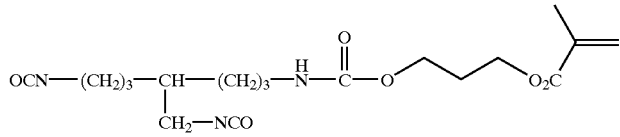
(30)
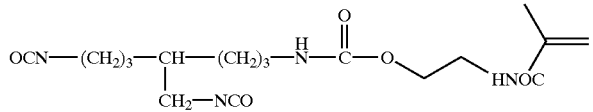
(31)
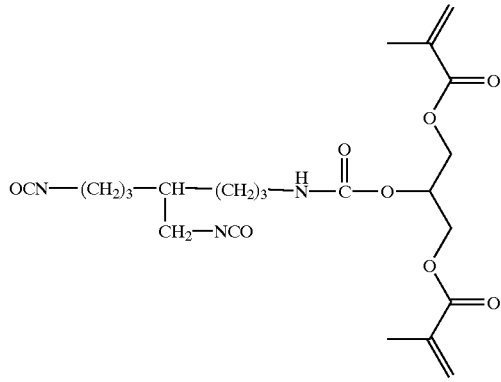
(32)
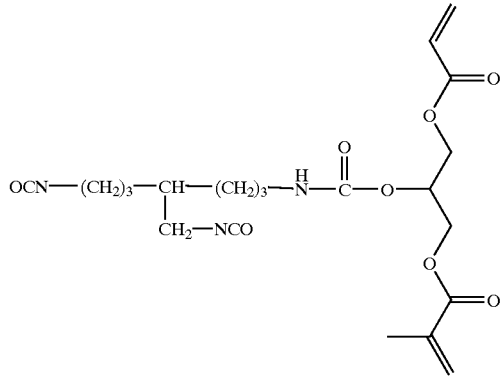
(33)
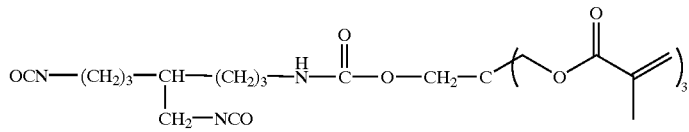
(34)

-continued
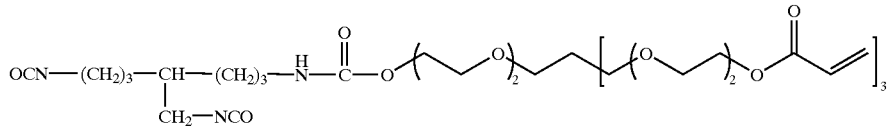
(35)
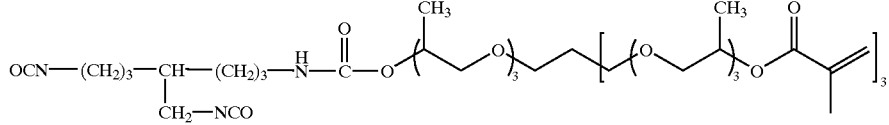
(36)
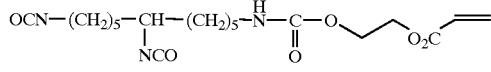
(37)
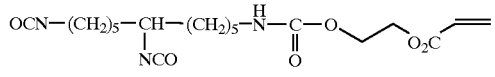
(38)
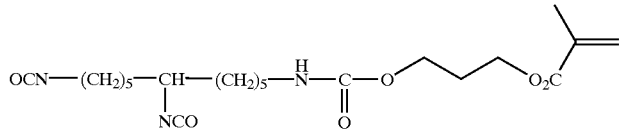
(39)
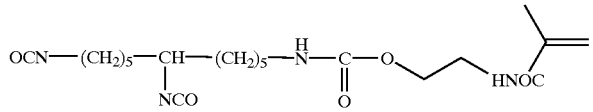
(40)
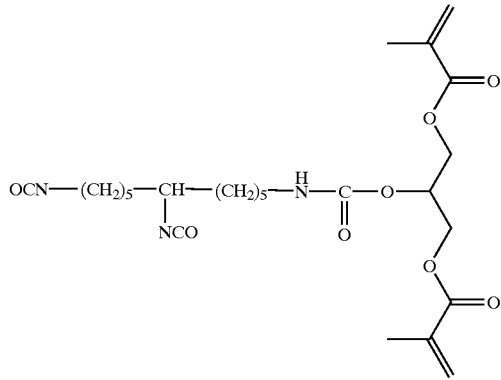
(41)
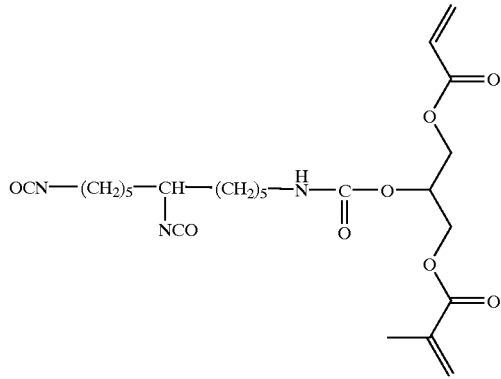
(42)
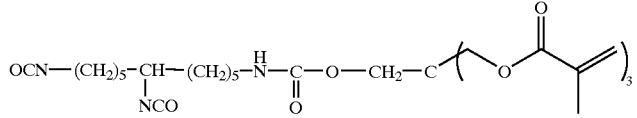
(43)

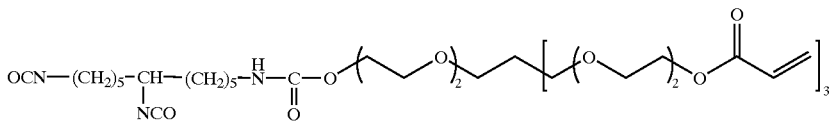

(44)

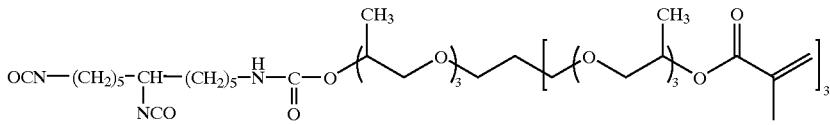

(45)

(B) Alkali-soluble Group-containing Diol Compound

The alkali-soluble group of the diol compound (B) is not particularly limited and includes a carboxyl group, a sulfonamido group, and a phenolic hydroxyl group. A carboxyl group is particularly preferred for securing excellent alkali solubility.

Illustrative examples of carboxyl-containing diol compounds (B') include those represented by formulae (1), (2) and (3) shown below:

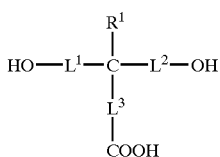

(1)

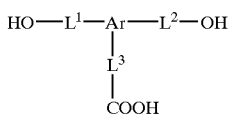

(2)

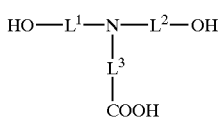

(3)

wherein $R^1$ represents a hydrogen atom or a substituted or unsubstituted alkyl, aralkyl, aryl, alkoxy or aryloxy group (the substitutent includes a cyano group, a nitro group, a halogen atom (i.e., —F, —Cl, —Br or —I), —$CONH_2$, —$COOR^2$, —$OR^2$, —$NHCONHR^2$, —$NHCOOR^2$, —$NHCOR^2$, —$OCONHR^2$ (wherein $R^2$ represents an alkyl group having 1 to 10 carbon atoms or an aralkyl group having 7 to 15 carbon atoms), preferably a hydrogen atom, an alkyl group having 1 to 8 carbon atoms or an aryl group having 6 to 15 carbon atoms; $L^1$, $L^2$, and $L^3$, which may be the same or different, each represent a single bond or a substituted or unsubstituted divalent aliphatic or aromatic hydrocarbon group (the substituent preferably includes an alkyl group, an aralkyl group, an aryl group, an alkoxy group and a halogen atom), preferably an alkylene group having 1 to 20 carbon atoms or an arylene group having 6 to 15 carbon atoms, still preferably an alkylene group having 1 to 8 carbon atoms; if desired, $L^1$, $L^2$ or $L^3$ can contain other functional groups inert to an isocyanate group, e.g., a carbonyl group, an ester group, a urethane group, an amido group, a ureido group or an ether group; two or three of $R^1$, $L^1$, $L^2$, and $L^3$ can be taken together to form a ring; and Ar represents a substituted or unsubstituted trivalent aromatic hydrocarbon group, preferably an aromatic group having 6 to 15 carbon atoms.

Specific examples of the carboxyl-containing diol compound (B') are 3,5-dihydroxybenzoic acid, 2,2-bis (hydroxymethyl)propionic acid, 2,2-bis(2-hydroxyethyl) propionic acid, 2,2-bis(3-hydroxypropyl) propionic acid, bis (hydroxymethyl) acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine, and N,N-bis(2-hydroxyethyl)-3-carboxy-propionamide.

In conformity with a purpose, for example, in order to reduce the unsaturated group content in the resin thereby to improve storage stability, the polyurethane resin binder may further comprise, as comonomer units, other diisocyanate compounds than the ethylenically unsaturated group-containing diisocyanate compounds (A) or other alkali-soluble group-containing diol compounds than the diol compounds (B).

Useful diisocyanate compounds other than the compounds (A) include those represented by formula (4):

$$OCN—L^4—NCO \qquad (4)$$

wherein $L^4$ represents a substituted or unsubstituted divalent aliphatic or aromatic hydrocarbon group; if desired, $L^4$ can contain a functional group inert to an isocyanate group, such as an ester group, a urethane group, an amido group or a ureido group.

Specific examples of the diisocyanate compounds of formula (4) are aromatic diisocyanate compounds, such as 2,4-tolylene diisocyanate, dimerized 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, and 3,3'-dimethylbiphenyl-4,4'-diisocyanate; aliphatic diisocyanate compounds, such as hexamethylene diisocyanate, trimethylhexamethylene diisocyanate, lysine diisocyanate, and a dimeric acid diisocyanate; alicyclic diisocyanate compounds, such as isophorone diisocyanate, 4,4'-methylenebis(cyclohexylisocyanate), methylcyclohexane-2,4(or 2,6)-diisocyanate, and 1,3-(isocyanatomethyl)cyclohexane; and reaction products between a diol and a diisocyanate compound, such as an adduct of 1,3-butylene glycol (1 mol) and tolylene diisocyanate (2 mol).

Useful diol compounds other than the compounds (B) include, but are not limited to, those represented by formula (5):

$$HO—Y^0—OH \qquad (5)$$

wherein $Y^0$ represents a divalent organic residue.

The diol compounds of formula (5) include polyether diol compounds, polyester diol compounds, and polycarbonate diol compounds.

The polyether diol compounds include compounds represented by formulae (6) through (10) shown below and hydroxyl-terminated ethylene oxide/propylene oxide random copolymers.

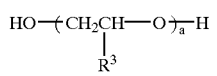
(6)

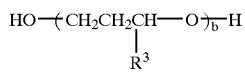
(7)

(8)

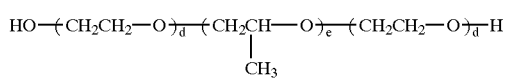
(9)

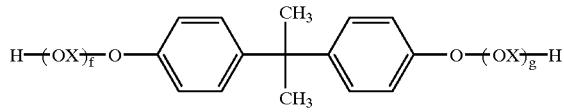
(10)

wherein $R^3$ represents a hydrogen atom or a methyl group; X represents

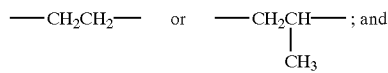
; and a, b, c, d, e, f, and g each represent an integer of 2 or greater, preferably an integer of from 2 to 100.

Specific examples of the polyether diol compounds of formulae (6) and (7) are diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol (PEG) (1000; average molecular weight, hereinafter the same), PEG (1500), PEG (2000), PEG (3000), PEG (7500), polypropylene glycol (PPG) (40), (PPG) (700), (PPG) (1000), PPG (2000), PPG (3000), and PPG (4000).

The polyether diol compounds represented by formula (8) include PTMG 650, PTMG 1000, PTMG 2000 and PTMG 3000 (all available from Sanyo Chemical Industries, Ltd.).

The polyether diol compounds represented by formula (9) include Newpol PE-61, Newpol PE-62, Newpol PE-64, Newpol PE-68, Newpol PE-71, Newpol PE-74, Newpol PE-75, Newpol PE-78, Newpol PE-108, Newpol PE-128, and Newpol PE-61 (all available from Sanyo Chemical Ind., Ltd.).

The polyether diol compounds represented by formula (10) include Newpol BPE-20, Newpol BPE-20F, Newpol BPE-2ONK, Newpol BPE-20T, Newpol BPE-20G, Newpol BPE-40, Newpol BPE-60, Newpol BPE-100, Newpol BPE-180, Newpol BPE-2P, Newpol BPE-23P, Newpol BPE-3P, and Newpol BPE-5P (all available from Sanyo Chemical Ind., Ltd.).

The hydroxyl-terminated ethylene oxide/propylene oxide random copolymers include Newpol 50HB-100, Newpol 50HB-260, Newpol 50HB-400, Newpol 50HB-660, Newpol 50HB-2000, and Newpol 50HB-5100 (all available from Sanyo Chemical Ind., Ltd.).

The polyester diol compounds include those represented by formulae (11) and (12):

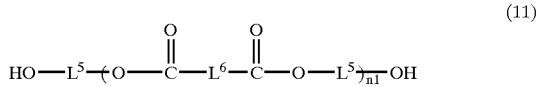
(11)

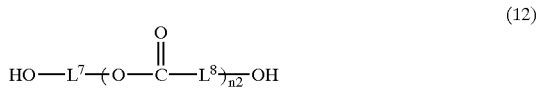
(12)

wherein $L^5$, $L^6$, and $L^7$, which may be the same or different, each represent a divalent aliphatic or aromatic hydrocarbon group, preferably an alkylene group, an alkenylene group, an alkynylene group or an arylene group; $L^8$ represents a divalent aliphatic hydrocarbon group, preferably an alkylene group; $L^5$, $L^6$, $L^7$, and $L^8$ can contain a functional group inert to an isocyanate group, such as an ether group, a carbonyl group, an ester group, a cyano group, an olefinic group, a urethane group, an amido group, a ureido group, a halogen atom, etc.; and n1 and n2 each represent an integer of 2 or greater, preferably an integer of 2 to 100.

The polycarbonate diol compounds include compounds represented by formula (13):

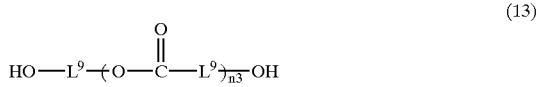
(13)

wherein $L^9$'s, which may be the same or different, each represent a divalent aliphatic or aromatic hydrocarbon group, preferably an alkylene group, an alkenylene group, an alkynylene group or an arylene group; $L^9$ can contain a functional group inert to an isocyanate group, such as an ether group, a carbonyl group, an ester group, a cyano group, an olefinic group, a urethane group, an amido group, a ureido group, a halogen atom, etc.; and n3 represents an integer of 2 or greater, preferably an integer of 2 to 100.

Specific examples of the diol compounds represented by formula (11), (12) or (13) are shown below, in which n represents an integer of 2 or greater.

(No. 1)

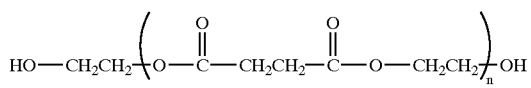

(No. 2)

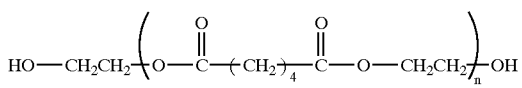

-continued
(No. 3)
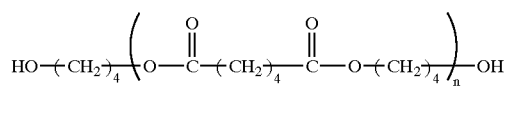
(No. 4)
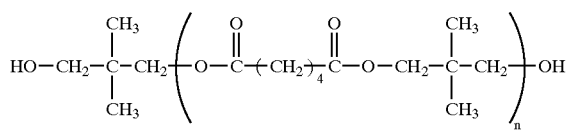
(No. 5)
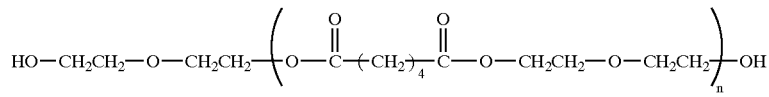
(No. 6)
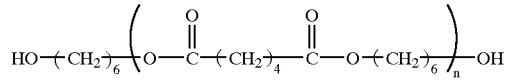
(No. 7)
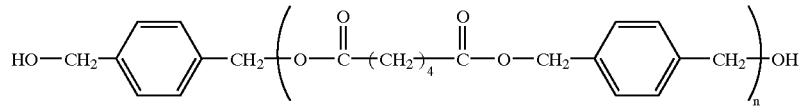
(No. 8)
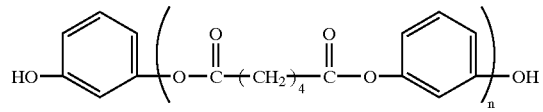
(No. 9)
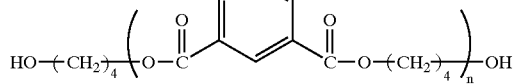
(No. 10)
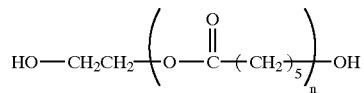
(No. 11)
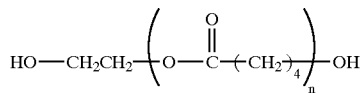
(No. 12)
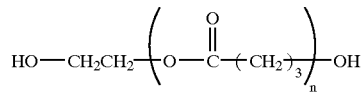
(No. 13)
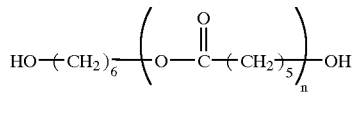
(No. 14)
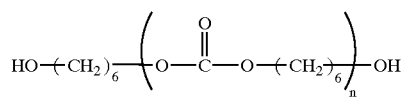
(No. 15)
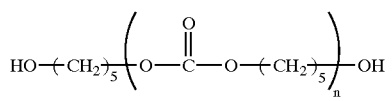
(No. 16)
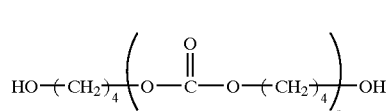
(No. 17)
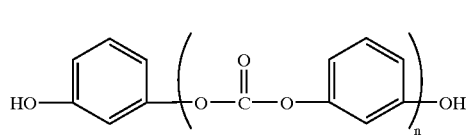
(No. 18)
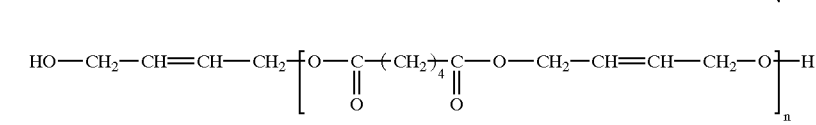
(No. 19)
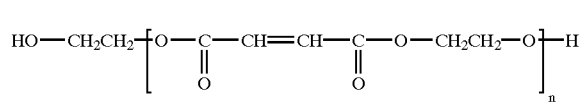
(No. 20)
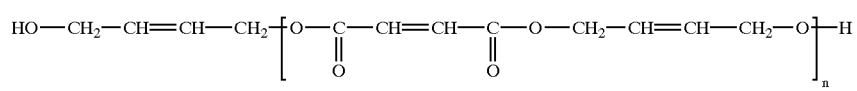

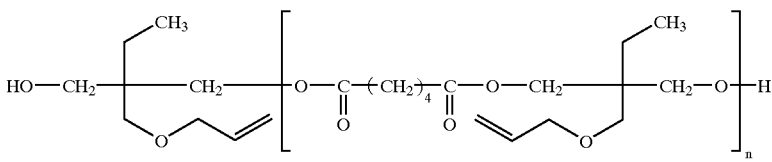

(No. 21)

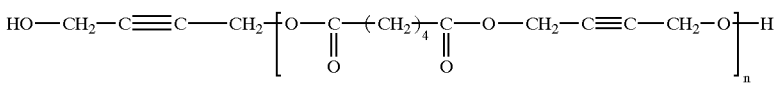

(No. 22)

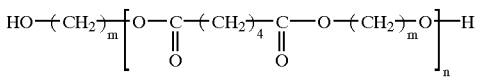

(No. 23)

m = 2,4

The polyurethane resin which can be used in the invention is still preferably a polyurethane resin having a carboxyl group. Suitable polyurethane resins are ones comprising at least one repeating unit derived from diol compounds represented by formulae (14), (15) and (16) shown below and/or a repeating unit derived from a compound obtained by ring opening a tetracarboxylic acid dianhydride with a diol compound.

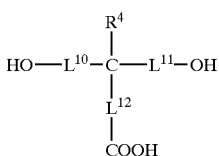

(14)

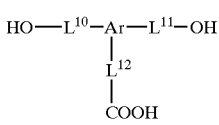

(15)

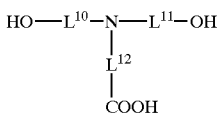

(16)

wherein $R^4$ represents a hydrogen atom or a substituted or unsubstituted alkyl, aralkyl, aryl, alkoxy or aryloxy group (the substitutent includes a cyano group, a nitro group, a halogen atom (i.e., —F, —Cl, —Br or —I), —CONH$_2$, —COOR$^5$, —OR$^5$, —NHCONHR$^5$, —NHCOOR$^5$, —NHCOR$^5$, —OCONHR$^5$ (wherein $R^5$ represents an alkyl group having 1 to 10 carbon atoms or an aralkyl group having 7 to 15 carbon atoms), preferably a hydrogen atom, an alkyl group having 1 to 8 carbon atoms or an aryl group having 6 to 15 carbon atoms; $L^{10}$, $L^{11}$, and $L^{12}$, which may be the same or different, each represent a single bond or a substituted or unsubstituted divalent aliphatic or aromatic hydrocarbon group (the substituent preferably includes an alkyl group, an aralkyl group, an aryl group, an alkoxy group and a halogen atom), preferably an alkylene group having 1 to 20 carbon atoms or an arylene group having 6 to 15 carbon atoms, still preferably an alkylene group having 1 to 8 carbon atoms; if desired, $L^{10}$, $L^{11}$ or $L^{12}$ can contain other functional groups inert to an isocyanate group, e.g., a carbonyl group, an ester group, a urethane group, an amido group, a ureido group or an ether group; two or three of $R^4$, $L^{10}$, $L^{11}$, and L can be taken together to form a ring; and Ar represents a substituted or unsubstituted trivalent aromatic hydrocarbon group, preferably an aromatic group having 6 to 15 carbon atoms.

Specific examples of the carboxyl-containing diol compounds of formula (14), (15) or (16) are 3,5-dihydroxybenzoic acid, 2,2-bis (hydroxymethyl)propionic acid, 2,2-bis(2-hydroxyethyl)propionic acid, 2,2-bis(3-hydroxypropyl) propionic acid, bis (hydroxymethyl) acetic acid, bis(4-hydroxyphenyl)acetic acid, 2,2-bis (hydroxymethyl)butyric acid, 4,4-bis(4-hydroxyphenyl) pentanoic acid, tartaric acid, N,N-dihydroxyethylglycine, and N,N-bis(2-hydroxyethyl)-3-carboxy-propionamide.

The tetracarboxylic acid dianhydride which can preferably be used for synthesis of the preferred polyurethane resin include those represented by formulae (17), (18), and (19):

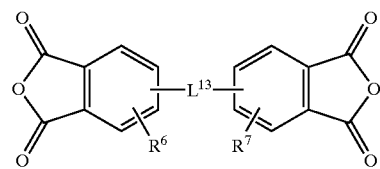

(17)

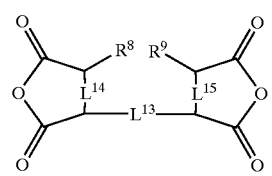

(18)

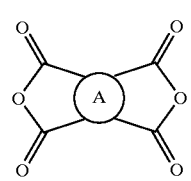

(19)

wherein $L^{13}$ represents a single bond, a substituted or unsubstituted divalent aliphatic or aromatic hydrocarbon group (the substituent includes an alkyl group, an aralkyl group, an aryl group, an alkoxy group, a halogen atom, an ester group, and an amido group), —CO—, —SO—, —SO$_2$—, —O— or —S—, preferably a single bond, a divalent aliphatic hydrocarbon group having 1 to 15 carbon atoms, —CO—, —SO$_2$—, —O— or —S—; $R^6$ and $R^7$, which may be the same or different, each represent a hydrogen atom, an alkyl group, an aralkyl group, an aryl group, an alkoxy group or a halogen atom, preferably a hydrogen atom, an alkyl group having 1 to 8 carbon atoms, an aryl group having 6 to 15 carbon atoms, an alkoxy group having 1 to 8 carbon atoms or a halogen atom; two of $L^{13}$, $R^6$, and $R^7$ may be taken (i.e., may be linked) together to form a ring; $R^3$ and $R^9$, which may be the same or different, each represent a hydrogen atom, an alkyl group, an aralkyl group, an aryl group or a halogen atom, preferably a hydrogen atom, an alkyl group having 1 to 8 carbon atoms or an aryl group having 6 to 15 carbon atoms; two of $L^{13}$, $R^8$, and $R^9$ may be taken together to form a ring; $L^{14}$ and $L^5$, which may be the same or different, each represent a single bond, a double bond or a divalent aliphatic hydrocarbon group, preferably a single bond, a double bond or a methylene group; and A represents a mononucleic or polynucleic aromatic ring, preferably an aromatic ring having 6 to 18 carbon atoms.

Specific examples of the tetracarboxylic dianhydrides of formulae (17), (18) or (19) include aromatic tetracarboxylic acid dianhydride, such as pyromellitic dianhydride, 3,3',4,4'-benzophenonetetracarboxylic dianhydride, 3,3',4,4'-diphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic anhydride, 2,2-bis(3,4-dicarboxyphenyl)propane dianhydride, bis(3,4-dicarboxyphenyl) ether dianhydride, 4,4'-[3,3'-(alkylphosphoryldiphenylene)-bis(iminocarbonyl)]diphthalic dianhydride, an adduct of hydroquinone diacetate and trimellitic anhydride, and an adduct of diacetyldiamine and trimellitic anhydride; alicyclic tetracarboxylic acid dianhydrides, such as 5-(2,5-dioxotetrahydrofuryl)-3-methyl-3-cyclohexene-1,2-dicarboxylic anhydride (Epiclon B-4400, available from Dainippon Ink & Chemicals, Ind.), 1,2,3,4-cyclopentanetetracarboxylic dianhydride, 1,2,4,5-cyclohexanetetracarboxylic dianhydride, and tetrahydrofurantetracarboxylic dianhydride; and aliphatic tetracarboxylic acid dianhydrides, such as 1,2,3,4-butanetetracarboxylic dianhydride and 1,2,4,5-pentanetetracarboxylic dianhydride.

The repeating unit derived from the compound obtained by ring opening the tetracarboxylic acid dianhydride with a diol compound can be introduced into a polyurethane resin by, for example, (i) a method in which an alcohol-terminated compound obtained by ring opening the tetracarboxylic acid dianhydride with a diol compound and a diisocyanate compound are allowed to react or (ii) a method in which an alcohol-terminated urethane compound obtained by the reaction between a diisocyanate compound and an excessive diol compound and the tetracarboxylic acid dianhydride are allowed to react.

The diol compound used for the ring opening of the tetracarboxylic acid dianhydride in the methods (i) and (ii) includes ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrogenated bisphenol A, a propylene oxide adduct of hydrogenated bisphenol A, hydroquinone dihydroxyethyl ether, p-xylylene glycol, dihydroxyethyl sulfone, bis(2-hydroxyethyl)-2,4-tolylene dicarbamate, 2,4-tolylenebis(2-hydroxyethylcarbamide), bis(2-hydroxyethyl)-m-xylylene dicarbamate, and bis(2-hydroxyethyl) isophthalate.

The above-described diol compound having a carboxyl group can be used in combination with a diol compound which does not have a carboxyl group and may have a substituent inert to an isocyanate group. Such a diol compound includes those represented by formulae (20) and (21):

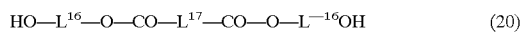  (20)

  (21)

wherein $L^{16}$ and $L^{17}$, which may be the same or different, each represent a substituted or unsubstituted divalent aliphatic or aromatic hydrocarbon group or a substituted or unsubstituted divalent heterocyclic group (the substituent includes an alkyl group, an aralkyl group, an aryl group, an alkoxy group, an aryloxy group, and a halogen atom (i.e., —F, —Cl, —Br or —I)); if desired, $L^{16}$ and $L^{17}$ can contain a functional group inert to an isocyanate group, such as a carbonyl group, an ester group, a urethane group, an amido group or a ureido group; and $L^{16}$ and $L^{17}$ may be taken together to form a ring.

Specific examples of the diol compounds represented by formula (20) or (21) are shown below.

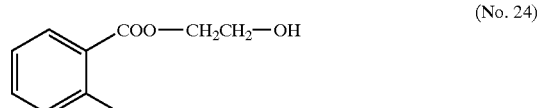 (No. 24)

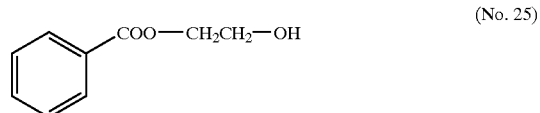 (No. 25)

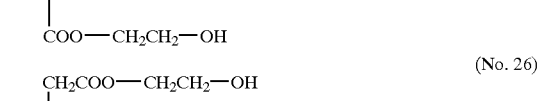 (No. 26)

 (No. 27)

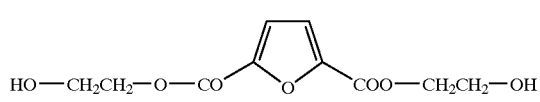

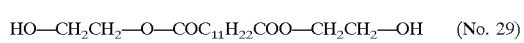 (No. 28)

 (No. 29)

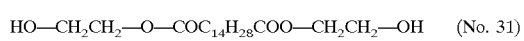

HO—CH$_2$CH$_2$—O—COC$_{12}$H$_{24}$COO—CH$_2$CH$_2$—OH   (No. 30)

HO—CH$_2$CH$_2$—O—COC$_{14}$H$_{28}$COO—CH$_2$CH$_2$—OH   (No. 31)

(No. 32)
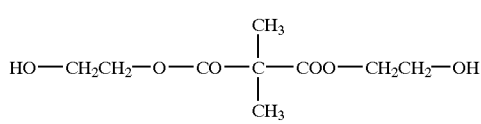

(No. 33)
HO—CH₂CH₂—O—CO—C≡C—COO—CH₂CH₂—OH (No. 34)
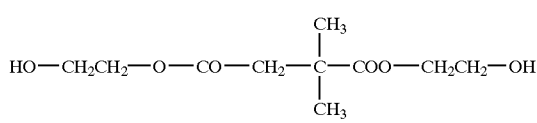

(No. 35)
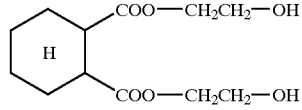

(No. 36)
HO—CH₂CH₂—O—CO—CH₂—O—CH₂—COO—CH₂CH₂—OH (No. 37)
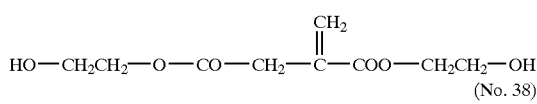

(No. 38)
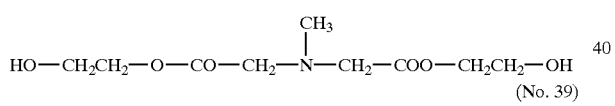

(No. 39)
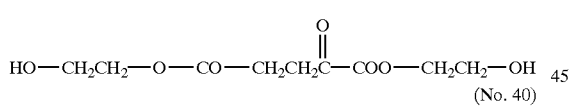

(No. 40)
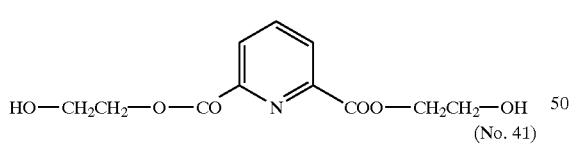

(No. 41)
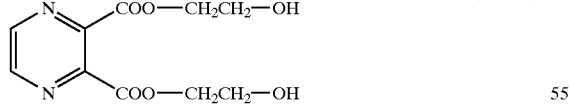

(No. 42)
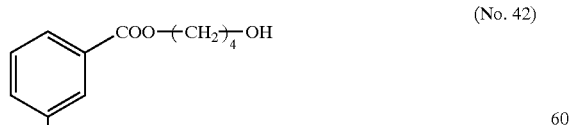

(No. 43)

(No. 44)
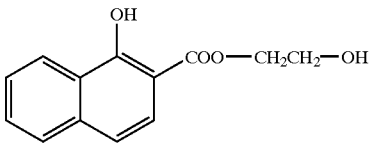

(No. 45)
HO—⟨⟩—CH=CH—COO—CH₂CH₂—OH (No. 46)
HO—CH₂CH₂—COO—CH₂CH₂—OH (No. 47)
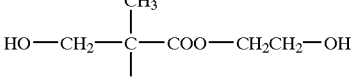

(No. 48)
HO—⟨⟩—CH₂COO—CH₂CH₂—OH (No. 49)
CH₃—CH—CH₂—COO—CH₂CH₂—OH
      |
      OH (No. 50)
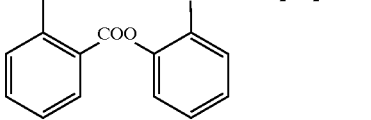

(No. 51)
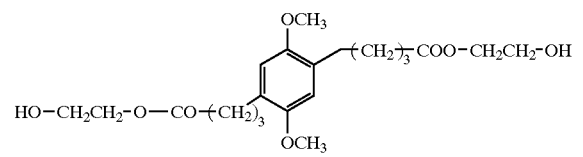

The following diol compounds are also suitable.

HO(CH₂)꜀OH　　　　　　　　　　(22)

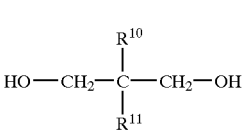　　　　　　　　(23)

wherein $R^{10}$ and $R^{11}$, which may be the same or different, each represent a substituted or unsubstituted alkyl group; and c represents an integer of 2 or greater, preferably an integer of 2 to 100.

Specific examples of the diol compounds of formula (22) are ethylene glycol, 1,3-propanediol, 1,4-butanediol, 1,5-pentanediol, 1,6-hexanediol, 1,7-heptanediol, and 1,8-octanediol.

Specific examples of the diol compounds of formula (23) are shown below.

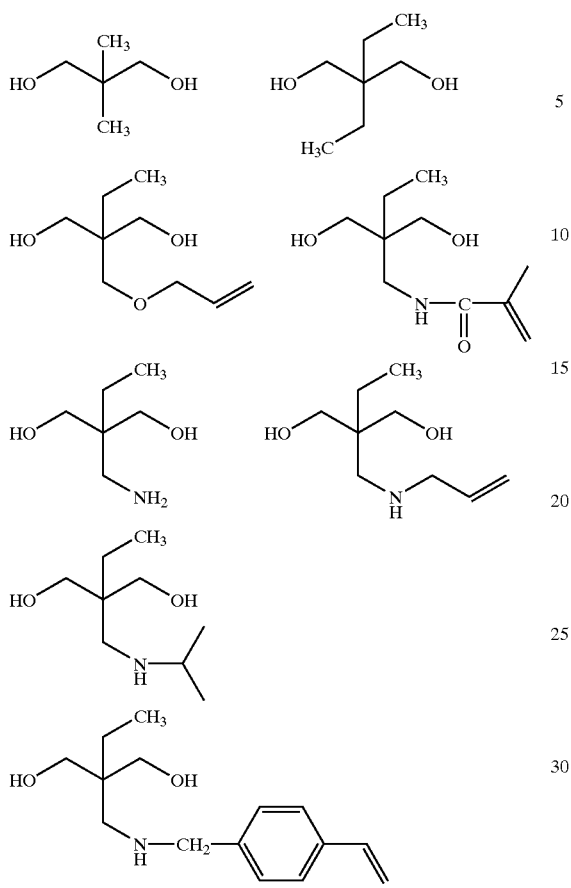

The following diol compounds are also suitable.

HO—L$^{18}$—NH—CO—L$^{19}$—CO—NH—L$^{18}$—OH  (24)

HO—L$^{19}$—CO—NH—L$^{18}$—OH  (25)

wherein L$^{18}$ and L$^{19}$, which may be the same or different, each represent a substituted or unsubstituted divalent aliphatic or aromatic hydrocarbon group or a substituted or unsubstituted divalent heterocyclic group (the substituent includes an alkyl group, an aralkyl group, an aryl group, an alkoxy group, an aryloxy group, and a halogen atom (i.e., —F, —Cl, —Br or —I)); if desired, L$^{18}$ and L$^{19}$ can contain a functional group inert to an isocyanate group, such as a carbonyl group, an ester group, a urethane group, an amido group or a ureido group; and L$^{18}$ and L$^{19}$ may be taken together to form a ring.

Specific examples of the diol compounds represented by formulae (24) and (25) are shown below.

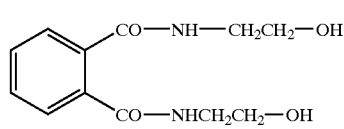 (No. 52)

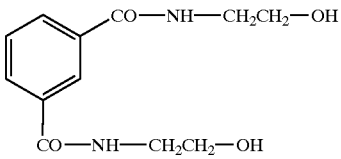 (No. 53)

HO—CH$_2$CH$_2$—NH—CO—CH=CH—CO—NH—CH$_2$CH$_2$—OH  (No. 54)

HO—CH$_2$CH$_2$—NH—CO—C≡C—CO—NH—CH$_2$CH$_2$—OH  (No. 55)

HO—CH$_2$CH$_2$—NH—CO—(CH$_2$)$_2$—CO—NH—CH$_2$CH$_2$—OH  (No. 56)

HO—CH$_2$CH$_2$—NH—CO—(CH$_2$)$_3$CO—NH—CH$_2$CH$_2$—OH  (No. 57)

HO—CH$_2$CH$_2$—NH—CO—(CH$_2$)$_5$CO—NH—CH$_2$CH$_2$—OH  (No. 58)

HO—CH$_2$CH$_2$—NH—CO—(CH$_2$)$_8$CO—NH—CH$_2$CH$_2$—OH  (No. 59)

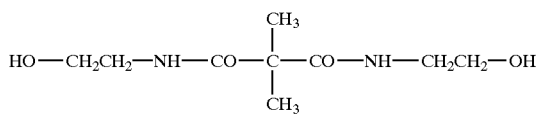 (No. 60)

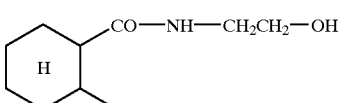 (No. 61)

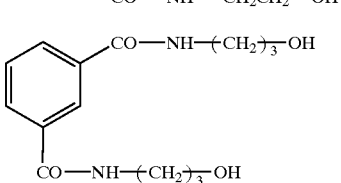 (No. 62)

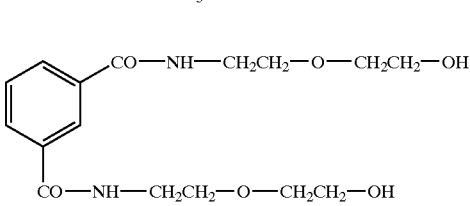 (No. 63)

HO—(CH$_2$)$_3$NH—(CH$_2$)$_3$NH—CO—(CH$_2$)$_2$CO—NH—(CH$_2$)$_3$—OH (No. 64)

HO—CH$_2$CH$_2$—O—CH$_2$CH$_2$—NH—CO—(CH$_2$)$_4$CO—NH—CH$_2$CH$_2$—O—CH$_2$CH$_2$—OH  (No. 65)

HO—CH$_2$CH$_2$—NH—CO—CH$_2$—O—CH$_2$—CO—NH—CH$_2$CH$_2$—OH  (No. 66)

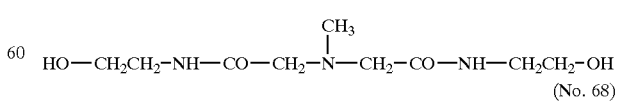 (No. 67)

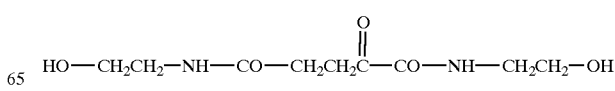 (No. 68)

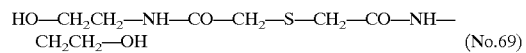   (No. 69)

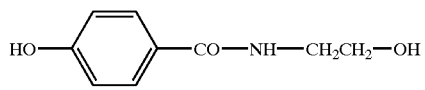   (No. 70)

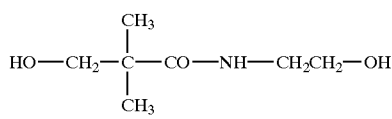   (No. 71)

The following diol compounds are also suitably used.

   (26)

   (27)

wherein $L^{20}$ represents a substituted or unsubstituted divalent aliphatic hydrocarbon group (the substituent preferably includes an alkyl group, an aralkyl group, an aryl group, an alkoxy group, an aryloxy group, and a halogen atom); if desired, $L^{20}$ can contain a functional group inert to an isocyanate group, such as an ester group, a urethane group, an amido group or a ureido group; $Ar^2$ and $Ar^3$, which may be the same or different, each represent a substituted or unsubstituted divalent aromatic hydrocarbon group, preferably an aromatic group having 6 to 15 carbon atoms; and n represents an integer of 0 to 10.

Specific examples of the diol compounds of formula (26) or (27) are catechol, resorcin, hydroquinone, 4-methylcatechol, 4-t-butylcatechol, 4-acetylcatechol, 3-methoxycatechol, 4-phenylcatechol, 4-methylresorcin, 4-ethylresorcin, 4-t-butylresorcin, 4-hexylresorcin, 4-chlororesorcin, 4-benzylresorcin, 4-acetylresorcin, 4-carbomethoxyresorcin, 2-methylresorcin, 5-methylresorcin, 5-butylhydroquinone, 2,5-di-t-butylhydroquinone, 2,5-di-t-amylhydroquinone, tetramethylhydroquinone, tetrachlorohydroquinone, methylcarboaminohydroquinone, methylureidohydroquinone, methylthiohydroquinone, benznorbornene-3,6-diol, bisphenol A, bisphenol S, 3,3'-dichlorbisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl)hexane, 1,4-bis(2-(p-hydroxyphenyl)propyl)benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybenzyl alcohol, 4-hydroxybenzyl alcohol, 2-hydroxy-3,5-di-t-butylbenzyl alcohol, 4-hydroxyl-3,5-di-t-butylbenzyl alcohol, 4-hydroxyphenethyl alcohol, 2-hydroxyethyl 4-hydroxybenzoate, 2-hydroxyethyl 4-hydroxyphenylacetate, and resorcin mono-2-hydroxyethyl ether.

The following diol compounds are also suitable.

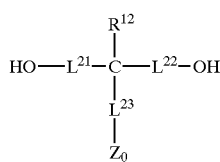   (28)

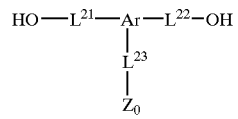   (29)

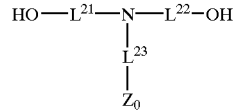   (30)

wherein $R^{12}$ represents a hydrogen atom or a substituted or unsubstituted alkyl, aralkyl, aryl, alkoxy or aryloxy group (the substitutent includes a cyano group, a nitro group, a halogen atom (i.e., —F, —Cl, —Br or —I), —CONH$_2$, —COOR$^{13}$, —OR$^{13}$, —NHCONHR$^{13}$, —NHCOOR$^{13}$, —NHCOR$^{13}$, —OCONHR$^{13}$ and —CONHR$^{13}$ (wherein $R^{13}$ represents an alkyl group having 1 to 10 carbon atoms or an aralkyl group having 7 to 15 carbon atoms)), preferably a hydrogen atom, an alkyl group having 1 to 8 carbon atoms or an aryl group having 6 to 15 carbon atoms; $L^{21}$, $L^{22}$, and $L^{23}$, which may be the same or different, each represent a single bond or a substituted or unsubstituted divalent aliphatic or aromatic hydrocarbon group (the substituent preferably includes an alkyl group, an aralkyl group, an aryl group, an alkoxy group and a halogen atom), preferably an alkylene group having 1 to 20 carbon atoms or an arylene group having 6 to 15 carbon atoms, still preferably an alkylene group having 1 to 8 carbon atoms; if desired, $L^{21}$, $L^{22}$ or $L^{23}$ can contain a functional group inert to an isocyanate group, e.g., a carbonyl group, an ester group, a urethane group, an amido group, a ureido group or an ether group; two or three of $R^{12}$, $L^{21}$, $L^{22}$, and $L^{23}$ can be taken together to form a ring; Ar represents a substituted or unsubstituted trivalent aromatic hydrocarbon group, preferably an aromatic group having 6 to 15 carbon atoms; and $Z_0$ represents

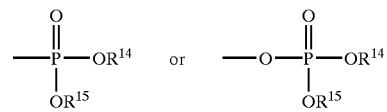

wherein $R^{14}$ and $R^{15}$, which may be the same or different, each represent a hydrogen atom, a sodium atom, a potassium atom, an alkyl group or an aryl group, preferably a hydrogen atom, an alkyl group having 1 to 8 carbon atoms or an aryl group having 6 to 15 carbon atoms.

The diol compound of formula (28), (29) or (30) having a phosphonic acid group, a phosphoric acid group and/or an ester thereof can be synthesized by, for example, a process comprising esterifying a halogen compound represented by formula (31), (32) or (33), if necessary with its hydroxyl group protected, into a phosphonate by a Michaelis-Arbuzov reaction represented by reaction formula (34), and, if desired, hydrolyzing the ester with hydrogen bromide, etc.

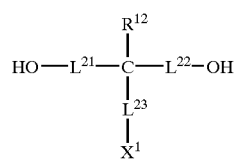   (31)

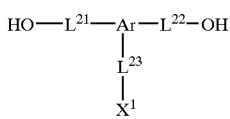
(32)

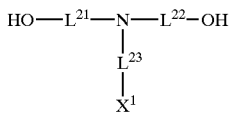
(33)

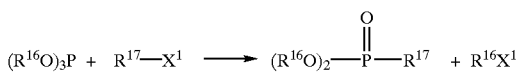
(34)

wherein $R^{12}$, $L^{21}$, $L^{22}$, $L^{23}$, and Ar are as defined above; $R^{16}$ represents an alkyl group or an aryl group, preferably an alkyl group having 1 to 8 carbon atoms or an aryl group having 6 to 15 carbon atoms; $R^{17}$ represents a residue of the formula (31), (32) or (33) from which $X^1$ is removed; and $X^1$ represents a halogen atom, preferably Cl, Br or I.

The diol compound of formula (28), (29) or (30) can also be synthesized by allowing $R^{17}$—OH and phosphorus oxychloride to react and hydrolyzing the resulting product as shown by reaction formula (35):

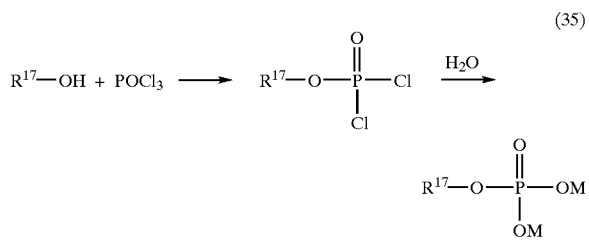
(35)

wherein $R^{17}$ is as defined above; and M represents a hydrogen atom, a sodium atom or a potassium atom.

The polyurethane resin which has a phosphonic acid group may be synthesized by allowing the diisocyanate compound of formula (4), the above-described diol compound having an unsaturated group, and the phosphonic ester group-containing diol compound of formula (28), (29) or (30) to react to form a polyurethane resin and hydrolyzing the resulting polyurethane resin with hydrogen bromide, etc.

An amino-containing compound represented by formula (36) or (37) shown below can also be incorporated into the polyurethane resin binder similarly to the diisocyanate compound other than the ethylenically unsaturated group-containing diisocyanate compound (A) and the diol compound other than the alkali-soluble group-containing diol compound (B). The amino-containing compound is allowed to react with the ethylenically unsaturated group-containing diisocyanate compound (A) and the alkali-soluble group-containing diol compound (B) to form a urea structure.

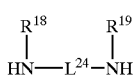
(36)

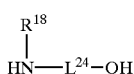
(37)

wherein $R^{18}$ and $R^{19}$ which may be the same or different, each represent a hydrogen atom or a substituted or unsubstituted alkyl, aralkyl or aryl group (the substitutent includes an alkoxy group, a halogen atom (i.e., —F, —Cl, —Br or —I), an ester group, and a carboxyl group), preferably a hydrogen atom, a carboxyl-substituted or unsubstituted alkyl group having 1 to 8 carbon atom or a carboxyl-substituted or unsubstituted aryl group having 6 to 15 carbon atoms; $L^{24}$ represents a substituted or unsubstituted divalent aliphatic or aromatic hydrocarbon group or a substituted or unsubstituted divalent heterocyclic group (the substituent includes an alkyl group, an aralkyl group, an aryl group, an alkoxy group, an aryloxy group, a halogen atom (i.e., —F, —Cl, —Br, or —I)) and a carboxyl group); if desired, $L^{24}$ can contain a functional group inert to an isocyanate group, e.g., a carbonyl group, an ester group, a urethane group or an amido group; and two of $R^{18}$, $L^{24}$, and $R^{19}$ may be taken together to form a ring.

Specific examples of the amino-containing compounds represented by formula (36) or (37) include aliphatic diamine compounds, such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl) tetramethylsiloxane, piperazine, 2,5-dimethylpiperazine, N-(2-aminoethyl)piperazine, 4-amino-2,2,6,6-tetramethylpiperidine, N,N-dimethylethylenediamine, lysine, L-cystine, and isophoronediamine; aromatic diamine compounds, such as o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis(4-aminophenyl)sulfone, 4-carboxy-o-phenylenediamine, 3-carboxy-m-phenylenediamine, 4,4'-diaminophenyl ether, and 1,8-naphthalenediamine; heterocyclic amine compounds, such as 2-aminoimidazole, 3-aminotriazole, 5-amino-1H-tetrazole, 4-aminopyrazole, 2-aminobenzimidazole, 2-amino-5-carboxytriazole, 2,4-diamino-6-methyl-s-triazine, 2,6-diaminopyridine, L-histidine, DL-tryptophan, and adenine; and amino-alcohol or aminophenol compounds, such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycine, 2-aminobenzyl alcohol, 4-aminophenethyl alcohol, 2-carboxy-5-amino-1-naphthol, and L-tyrosine.

The polyurethane resin binder which can be used in the present invention is synthesized by allowing the above-described diisocyanate compound, diol compound, etc. to react under heating in an aprotic solvent in the presence of a known catalyst having an appropriate activity in agreement with the reactivity. The molar ratio of the diisocyanate compound to the diol compound is preferably 0.8:1 to 1.2:1. Where an isocyanate group remains at the resulting polymer terminal, the polymer is treated with an alcohol or an amine to obtain a final product having no isocyanate group at the terminals.

It is preferred that the polyurethane resin binder comprises at least one of the units derived from polyether diol compounds, polyester diol compounds and polycarbonate diol compounds as a comonomer unit. A preferred content of that unit in the polyurethane resin is 1 to 80% by weight, particularly 5 to 60% by weight.

It is preferred that the polyurethane resin binder be one having a carboxyl group. A preferred carboxyl group content is 0.4 meq./g or more, particularly 0.4 to 3.5 meq./g.

The polyurethane resin binder used in the invention preferably has a weight average molecular weight of 1000 or more, particularly 10,000 to 300,000.

[II] Addition Polymerizable Compound Having Ethylenically Unsaturated Double Bond The addition polymerizable compound having ethylenically unsaturated double bond (hereinafter simply referred to as an addition polymerizable compound) which can be used in the photopolymerizable photosensitive layer is not particularly limited as far as it has an addition polymerizable ethylenically unsaturated double bond. Preferably it is selected from those having at least one ethylenically unsaturated bond at the terminal thereof, particularly those having two or more ethylenically unsaturated bonds. Such a group of compounds are well known in the art, any of which is useful in the invention with no restriction. The chemical forms these compounds can take include a monomer, a prepolymer (i.e., a dimer, a trimer, and an oligomer), a mixture thereof, and a copolymer of these forms. Addition polymerizable compounds in the form of a monomer include unsaturated carboxylic acids, such as acrylic acid, methacrylic acid, itaconic acid, crotonic acid, isocrotonic acid, and maleic acid, and esters and amides thereof, and preferably esters of the unsaturated carboxylic acid and an aliphatic polyalcohol and amides of the unsaturated carboxylic acid and an aliphatic polyamine. Addition reaction products between an unsaturated carboxylic ester or amide having a nucleophilic substituent, e.g., a hydroxyl group, an amino group or a mercapto group, and a mono- or polyfunctional isocyanate or epoxy compound and dehydrating condensation products between such an unsaturated carboxylic ester or amide and a mono- or polyfunctional carboxylic acid are also suitable. Addition reaction products between an unsaturated carboxylic ester or amide having an electrophilic substituent, e.g., an isocyanate group or an epoxy group, and a mono- or polyfunctional alcohol, amine or thiol and substitution reaction products between an unsaturated carboxylic ester or amide having a releasable substituent, e.g., a halogen atom or a tosyloxy group, with a mono- or polyfunctional alcohol, amine or thiol are also suitable. Additionally, compounds obtained by the same reactions as described above except for replacing the unsaturated carboxylic acid with an unsaturated phosphonic acid, styrene, a vinyl ether, etc. are also employable.

Particularly preferred addition polymerizable compounds are urethane type addition polymerizable compounds prepared by addition reaction between an isocyanate group and a hydroxyl group. Included in such compounds are vinylurethane compounds disclosed in JP-B-48-41708, which have two or more polymerizable vinyl groups per molecule and are obtained by adding a hydroxyl-containing vinyl monomer represented by formula:

CH$_2$=C(R)COOCH$_2$CH(R')OH    (38)

wherein R and R' each represent a hydrogen atom or a methyl group, to a polyisocyanate compound having two or more isocyanate groups per molecule.

Also included are the urethane (meth)acrylates disclosed in JP-A-51-37193 (the term "JP-A" as used herein means an unexamined published Japanese Patent application), JP-B-2-32293 and JP-B-2-16765 and the urethane compounds having an ethylene oxide skeleton disclosed in JP-B-58-49860, JP-B-56-17654, JP-B-62-39417 (the term "JP-B" as used herein means an examined published Japanese Patent publication), and JP-B-62-39418. Particularly preferred of them are reaction products between a polyisocyanate compound selected from group (1) shown below and an alcohol compound selected from group (2) shown below.

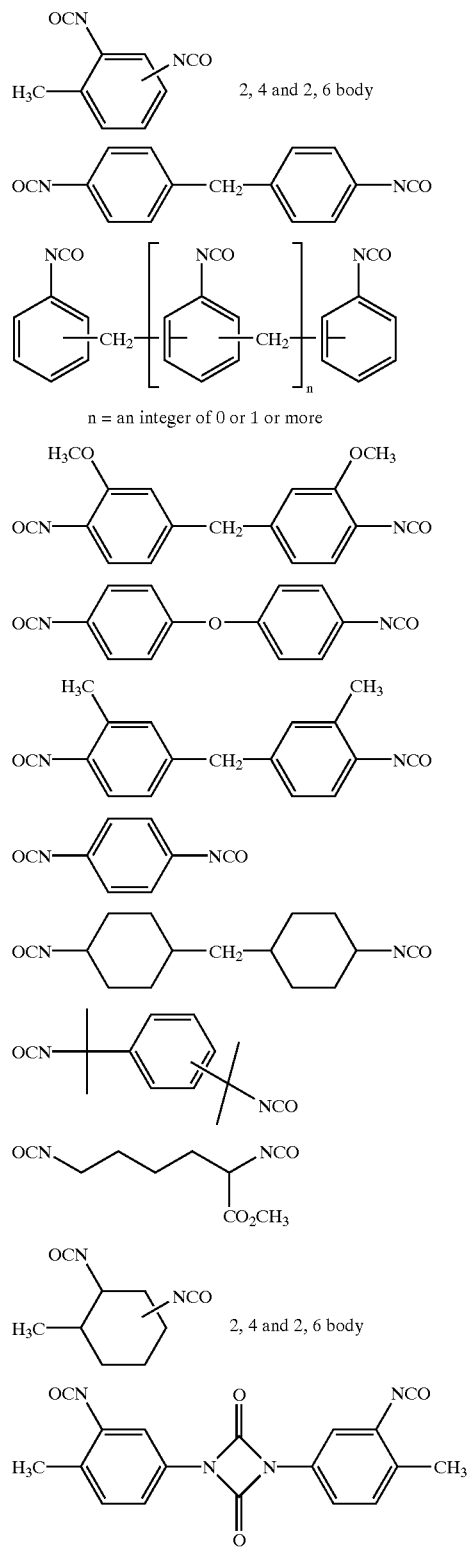

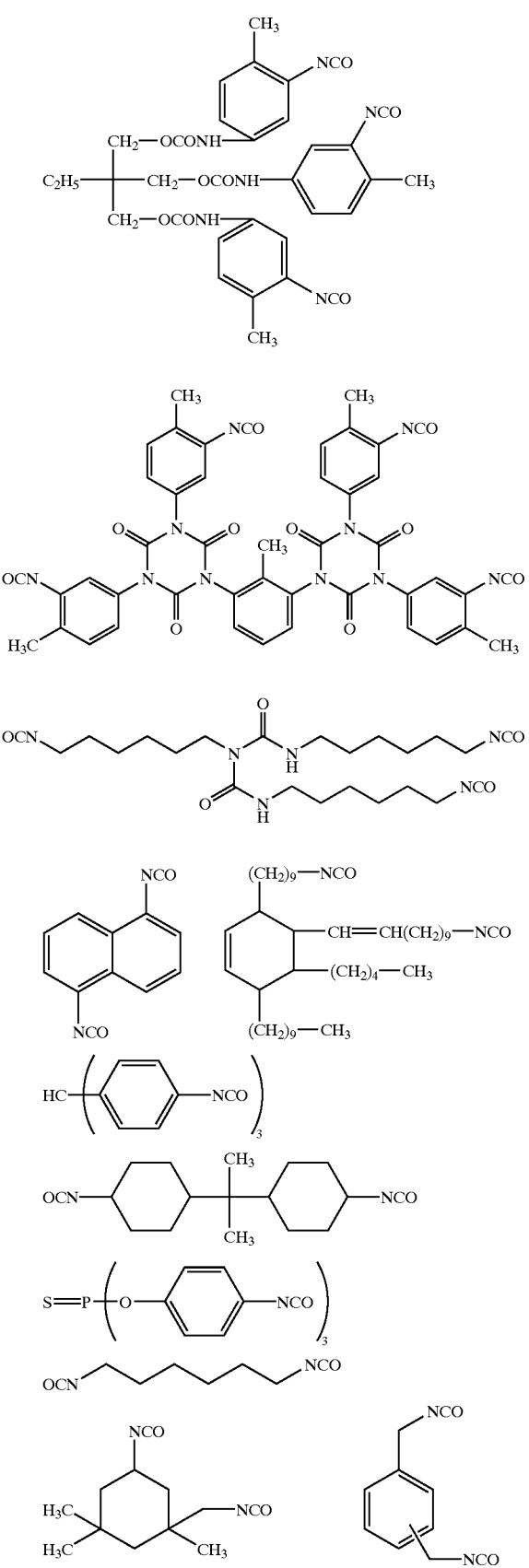
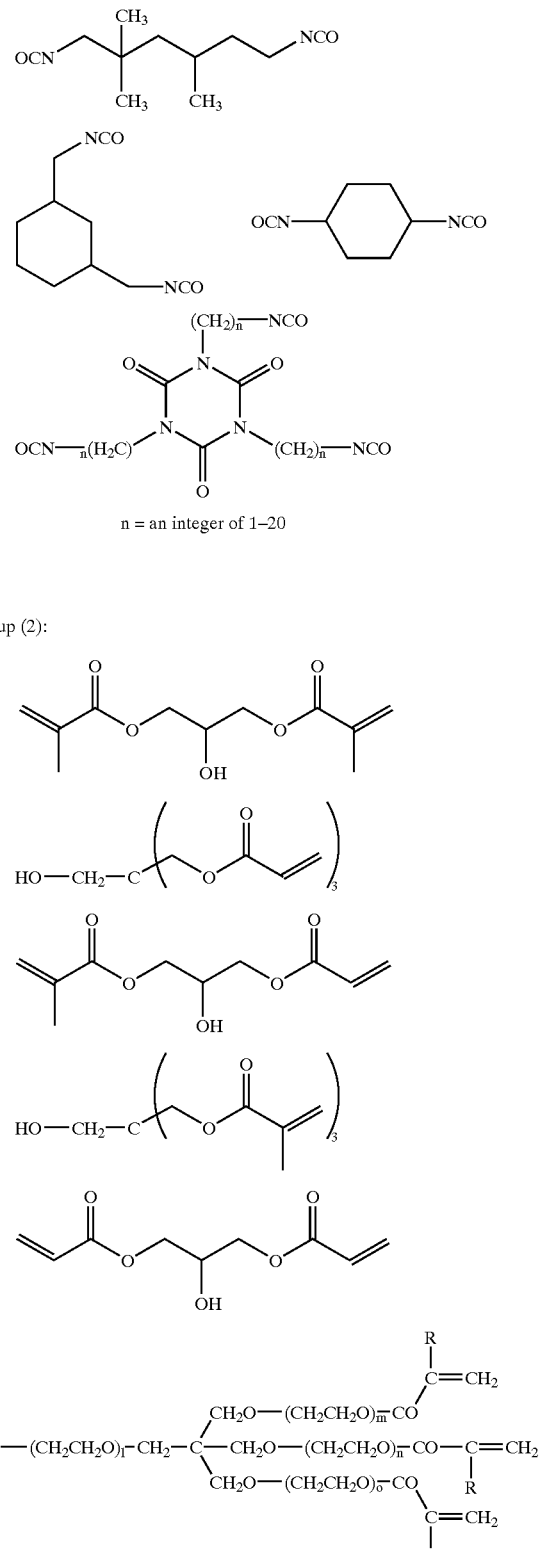
n = an integer of 1–20
Group (2):
R = a hydrogen atom or a methyl group;
l, m, n, o = an integer of 1–20

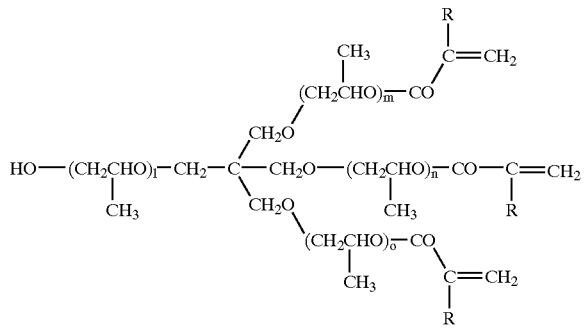

R = a hydrogen atom or a methyl group;
l, m, n, o = an integer of 1–20

Specific examples of these urethane compounds which are commercially available are Urethane Acrylate M-1100, M-1200, M-1210, M-1300 (available from Toagosei Chemical Industry Co., Ltd.); Urethane Acrylate EB210, EB4827, EB6700, and EB220 (available from Daicel UCB K.K.); UVITHANE-782, UVITHANE-783, UVITHANE-788 and UVITHANE-893 (available from Morton Thiokol Inc.); Art Resin UN-9000EP, Art Resin UN-9200A, Art Resin UN-9000H, Art Resin UN-1255, Art Resin UN-5000, Art Resin UN-2111A, Art Resin UN-2500, Art Resin UN-3320HA, Art Resin UN-3320HB, Art Resin UN-3320HC, Art Resin UN-3320HS, Art Resin UN-6060P, Art Resin UN-6060PTM, Art Resin SH-380G, Art Resin SH-500, and Art Resin SH-9832 (available from Negami Kogyo K.K.); NK Oligo U-4H, NK Oligo U-4HA, NK Oligo U-4P, NK Oligo U-4PA, NK Oligo U-4TX, NK Oligo U-4TXA, NK Oligo U-6LHA, NK Oligo U-6LPA-N and NK Oligo U-6LTXA, NK Oligo UA-6ELP, NK Oligo UA-6ELH, NK Oligo UA-6ELTX, NK Oligo UA-6PLP, NK Oligo U-6ELP, NK Oligo U-6ELH, NK Oligo U-8MDA, NK Oligo U-8MD, NK Oligo U-12LMA, NK Oligo U-12LM, NK Oligo U-6HA, NK Oligo U-108A, NK Oligo U-1084A, NK Oligo U-200AX, NK Oligo U-122A, NK Oligo U-340A, NK Oligo U-324A, and NK Oligo UA-100 (available from Shin-Nakamura Kagaku K.K.); and AH-600, AT-600, UA-306H, AI-600, UA-101T, UA-1011, UA-101H, UA-306T, UA-306I, UF-8001, and UF-8003 (available from Kyoei Kagaku K.K.).

Specific examples of the unsaturated carboxylic acid esters with an aliphatic polyalcohol are acrylic esters, such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomers; methacrylic esters, such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane; itaconic esters, such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate; crotonic esters, such as ethylene glycol dicrotonate, tetramethylene glycol dicrotonate, pentaerythritol dicrotonate, and sorbitol tetradicrotonate; isocrotonic esters, such as ethylene glycol diisocrotonate, pentaerythritol diisocrotonate, and sorbitol tetraisocrotonate; maleic esters, such as ethylene glycol dimaleate, triethylene glycol dimaleate, pentaerythritol dimaleate, and sorbitol tetramaleate; and the aliphatic alcohol esters described in JP-B-46-27926, JP-B-51-47334, and JP-A-57-196231; the esters having an aromatic skeleton described in JP-A-59-5240, JP-A-59-5241, and JP-A-2-226149; and the esters having an amino group described in JP-A-1-165613. These ester monomers may be used as a mixture thereof.

Specific examples of the amides of the unsaturated carboxylic acid and an aliphatic polyamine are methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide. The amide monomers having a cyclohexylene structure disclosed in JP-B-54-21726 are also preferred.

Further, the addition polymerizable compounds having an amino structure or a sulfide structure in the molecule described in JP-A-63-277653, JP-A-63-260909, and JP-A-1-105238 provide photopolymerizable compositions exhibiting a very high photosensitive speed.

Additional useful addition polymerizable compounds include polyfunctional acrylates and methacrylates, such as the polyester acrylates described in JP-A-48-64183, JP-B-49-43191, and JP-B-52-30490 and epoxy acrylates obtained by the reaction of an epoxy resin and (meth)acrylic acid; the unsaturated compounds described in JP-B-46-43946, JP-B-1-40337 and JP-B-1-40336; and the vinylsulfonic acid compounds described in JP-A-2-25493. The perfluoroalkyl-containing structure described in JP-A-61-22048 are suitable in some cases. The compounds presented as a photocuring monomer or oligomer in Nippon Secchaku Kyokaishi vol. 20, No. 7, pp. 300–308 (1984) are also useful.

The particulars of usage of these addition polymerizable compounds as to the structure and the amount to be used, whether they are used individually or in combination, and the like can arbitrarily be determined according to the performance design of a finished lithographic printing plate. For example, the particulars are decided from the following viewpoint. From the standpoint of photosensitive speed, structures with a higher unsaturated group content per molecule are preferred. In many cases, bi- or higher functionality is preferred. To obtain high film strength on curing, tri- or higher functionality is desirable. It is an effective manipulation to use a plurality of addition polymerizable compounds different in functionality or polymerizable group (e.g., acrylic esters, methacrylic esters, styrene compounds, and vinyl ether compounds) to have the photosensitivity and the film strength controlled in balance. Addition polymerizable compounds having a large molecular weight or high hydrophobic properties are, while excellent in photosensitive speed or film strength, sometimes unfavorable for developing speed or tend to precipitate in a developer.

Further, compatibility and dispersibility with other components of the photosensitive layer (such as a binder, a titanocene compound used as a photopolymerization initiator, a colorant, etc.) are also important factors to be taken into consideration in selecting the kind and usage of the addition polymerizable compound. For example, compatibility could be improved by use of a low purity compound or a combined use of two or more compounds. A specific compound structure could be chosen for the purpose of improving adhesion to the support, a topcoat, etc. Although a higher compounding ratio of the addition polymerizable compound in the photosensitive layer is more effective on sensitivity, too much the compound can cause unfavorable phase separation or make the film sticky (stickiness can cause troubles in the production process, such as rejection due to transfer of the photosensitive layer components or blocking of the photosensitive layer) or precipitate in a developer. From these viewpoints, a preferred ratio of the addition polymerizable compound is 5 to 80% by weight, particularly 25 to 75% by weight, based on the total weight of the photosensitive layer components. The above-described addition polymerizable compounds can be used either individually or as a combination of two or more thereof. Additional factors to be taken into consideration in selecting an appropriate structure, combination, and compounding ratio of the addition polymerizable compounds include polymerization inhibition by oxygen, resolving power, fogging properties, change of refractive index, surface stickiness, and the like. In some cases, the layer structure (e.g., an undercoat or a topcoat) or the method of coating can be selected appropriately in connection with the usage of the addition polymerizable compounds.

[III] Photopolymerization Initiator

Known radical generators can be used as a photopolymerization initiator of the photopolymerizable photosensitive layer. Radical generators suitable for use in the invention include (a) aromatic ketones, (b) aromatic onium salt compounds, (c) organic peroxides, (d) hexaarylbiimidazole compounds (e) ketoxime ester compounds, (f) borate compounds, (g) azinium compounds, (h) active ester compounds, (i) compounds having a carbon-halogen bond, and (j) metallocene compounds.

The aromatic ketones (a) include the benzoin ether compounds described in JP-B-47-3981, such as

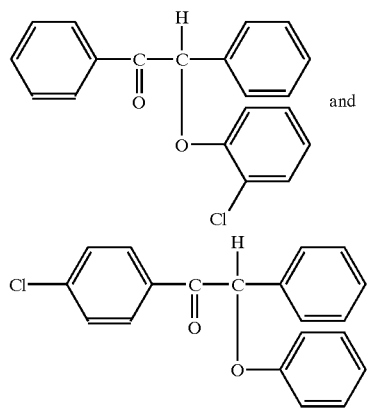

the α-substituted benzoin compounds disclosed in JP-B-47-22326, such as

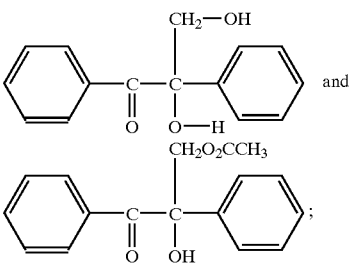

the dialkoxybenzophenone compounds disclosed in JP-B-60-26483, such as

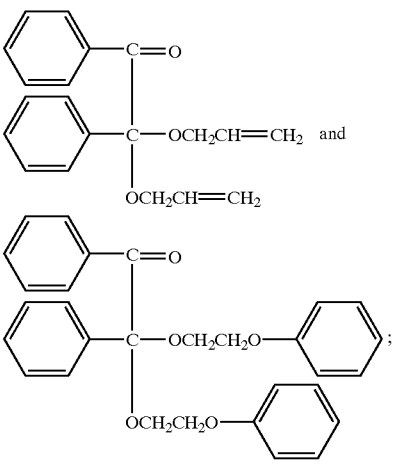

the benzoin ether compounds described in JP-B-60-26403 and JP-A-62-81345, such as

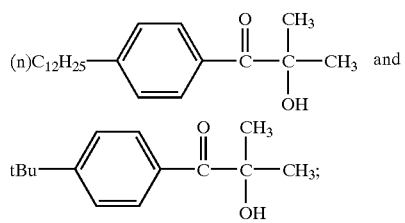

the α-aminobenzophenone compounds described in JP-B-1-34242, U.S. Pat. No. 4,318,791, and EP 0234561A, such as

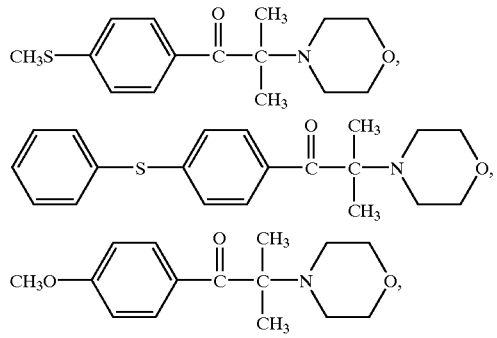

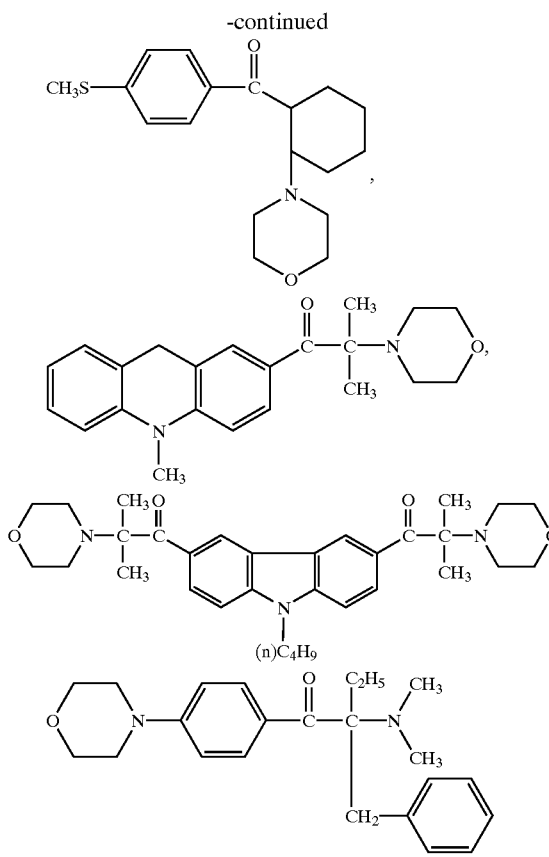

the p-di(dimethylaminobenzoyl)benzene compounds described in JP-A-2-211452, such as

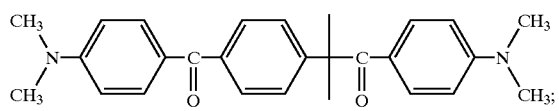

the thio-substituted aromatic ketone compounds described in JP-A-61-194062, such as

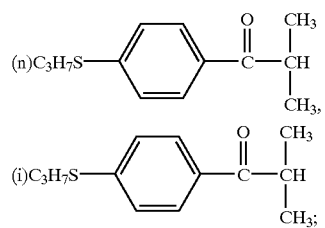

the acylphosphine sulfide compounds described in JP-B-2-9597, such as

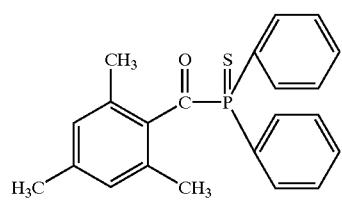

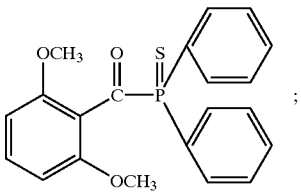

the acylphosphine compounds described in JP-B-2-9596, such as

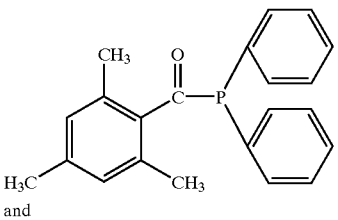

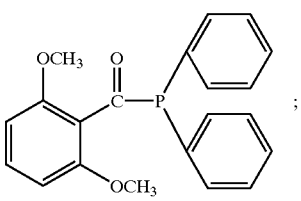

the thioxanthone compounds described in JP-B-63-61950, and the coumarin compounds described in JP-B-59-42864.

The aromatic onium salts (b) include those of the group V, VI and VII elements of the Periodic Table, specifically N. P, As, Sb, Bi, O, S, Se, Te, and I. Such aromatic onium salts are disclosed in JP-B-52-14277, JP-B-52-14278, and JP-B-52-14279. Specific examples are shown below.

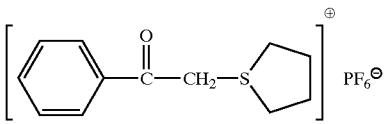

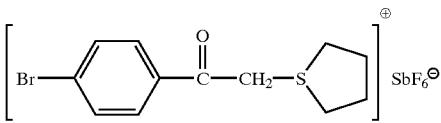

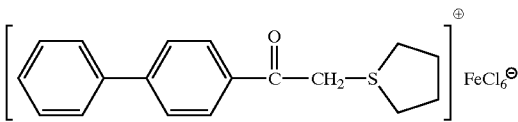

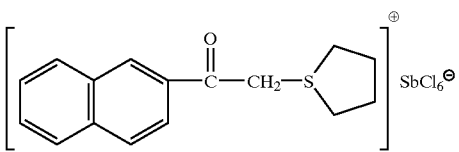

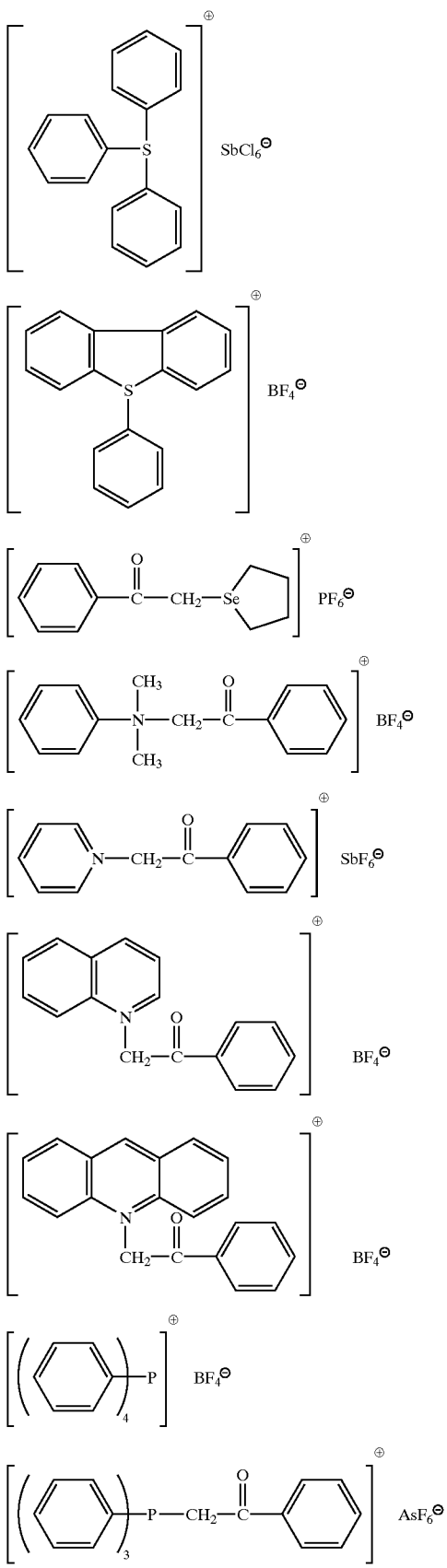
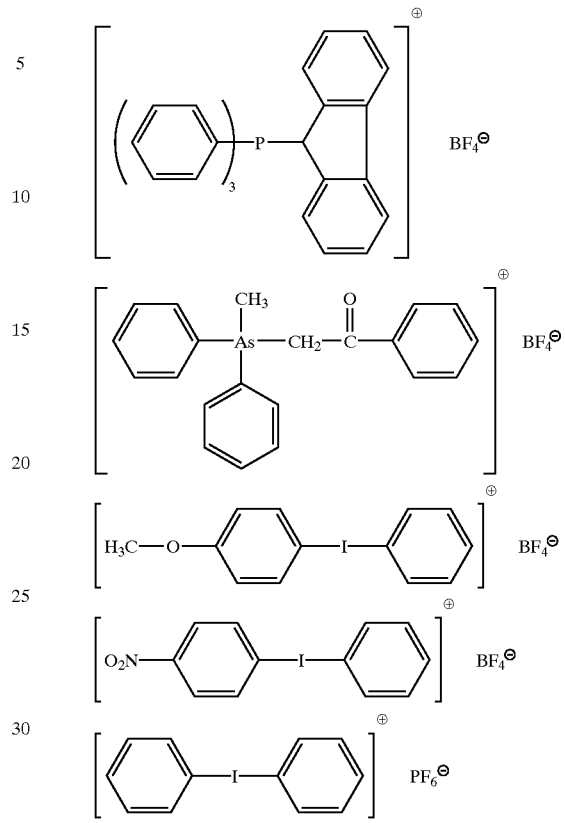

Included in the organic peroxides (c) are almost all organic compounds having at least one oxygen-oxygen bond in the molecule. Preferred are peroxy esters, such as 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, and di-t-butyl diperoxyisophthalate.

The hexaarylbiimidazole compounds (e) include the lophine dimers described in JP-B-45-37377 and JP-B-44-86516, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

The ketoxime ester compounds (e) include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one, and 2-ethoxycarbonyloxyimino-1-phenylpropan-1-one.

The borate compounds (f) include compounds represented by formula (39):

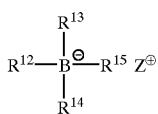 (39)

wherein $R^{12}$, $R^{13}$, $R^{14}$, and $R^{15}$, which may be the same or different, each represent a substituted or unsubstituted alkyl group, a substituted or unsubstituted aryl group, a substituted or unsubstituted alkenyl group, a substituted or unsubstituted alkynyl group, or a substituted or unsubstituted heterocyclic group; two or more of $R^{12}$, $R^{13}$, $R^{14}$, and $R^{15}$ may be taken together to form a ring; provided that at least one of $R^{12}$, $R^{13}$, $R^{14}$, and $R^{15}$ is a substituted or unsubstituted alkyl group; and $Z^+$ represents an alkali metal cation or a quaternary ammonium cation.

U.S. Pat. Nos. 3,567,453 and 4,343,891 and European Patents 109,772 and 109,773 give specific examples of the compound of formula (39) Some of them are shown below.

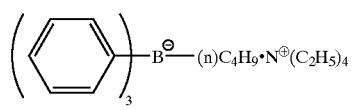
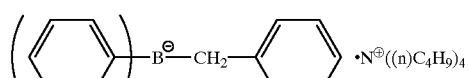
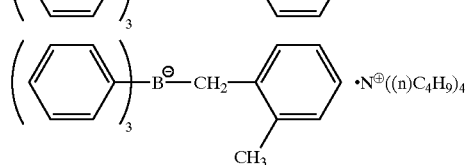
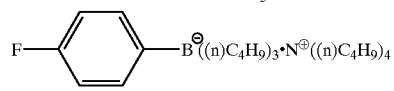

The azinium salt compounds (g) include the compounds having an N-O bond disclosed in JP-A-63-138345, JP-A-63-142345, JP-A-63-142346, JP-A-63-14.3537, and JP-B-46-42363.

The active ester compounds (h) include the imidosulfonate compounds described in JP-B-62-6223 and the active sulfonates described in JP-B-63-14340 and JP-A-59-174831.

The carbon-halogen bond-containing compounds (i) include the compounds reported by Wakabayashi, et al. in *Bull. Chem. Soc., Japan*, vol. 42, p. 2924 (1969), the compounds of British Patent 1388492, the compounds of JP-A-53-133428, the compounds of German Patent 3337024, the compounds of F.C. Schaefer, et al, *J. Org. Chem.*, vol. 29, p. 1527 (1964), the compounds of JP-A-62-58241, and the compounds of JP-A-5-281728. Specific examples are shown below.

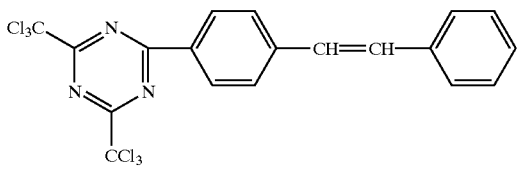
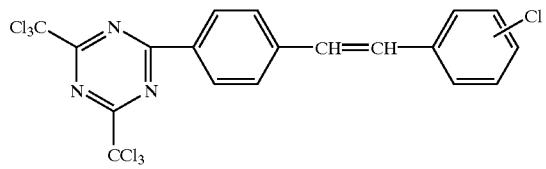
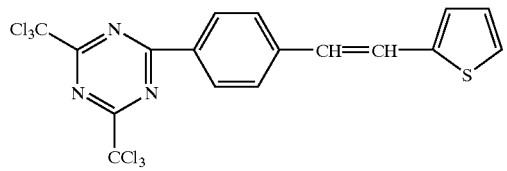
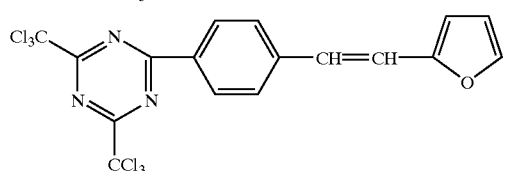
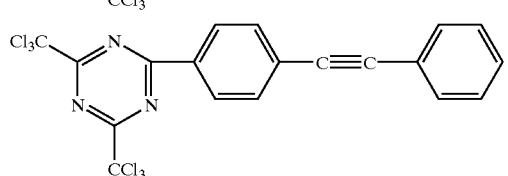
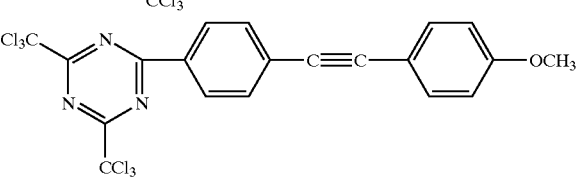
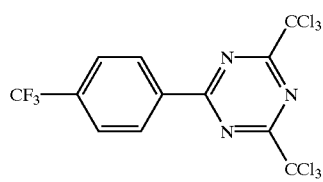
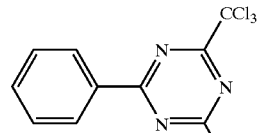
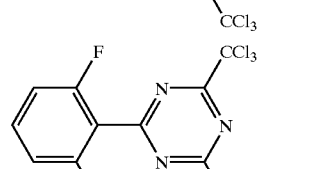
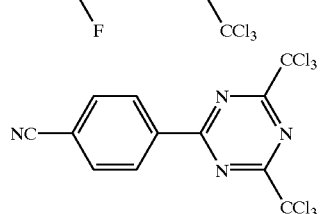

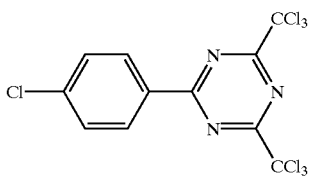

The carbon-halogen bond-containing compounds (i) further include those easily synthesized by one skilled in the art in accordance with the process taught by M. P. Hutt, E. F. Elslager and L. M. Herbel,. *Journal of Heterocyclic Chemistry*, vol.7, No.3, pp. 511 et seq. (1970), and the compounds disclosed in German Patents 2641100, 3333450, 3021590, and 3021599. Specific examples of these compounds are:

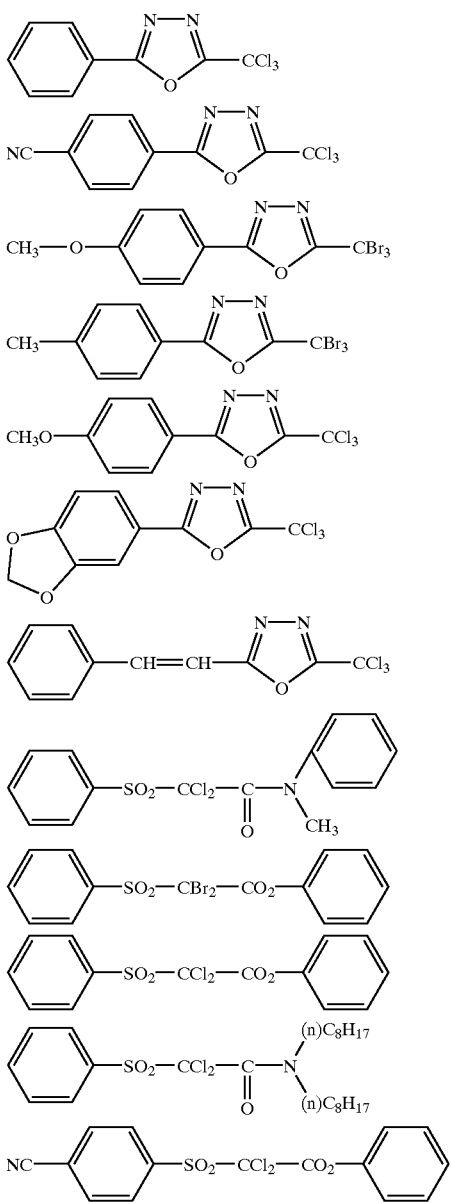

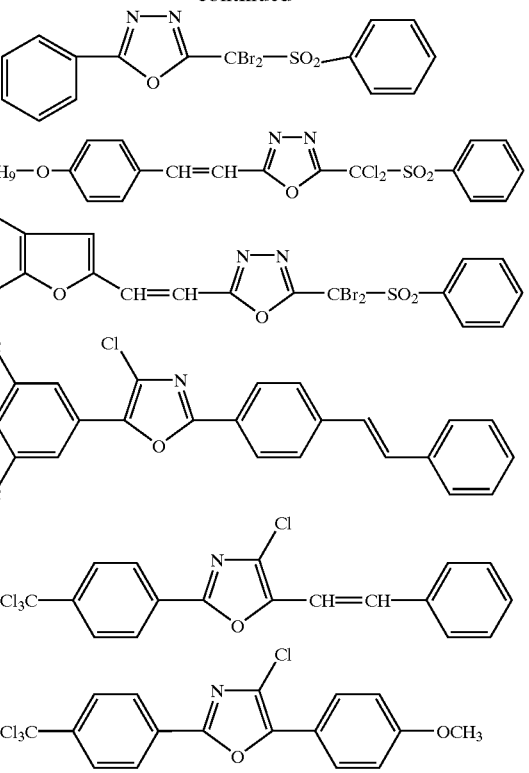

The metallocene compounds (j) include the titanocene compounds disclosed in JP-A-59-152396, JP-A-61-151197, JP-A-63-41483, JP-A-63-41484, JP-A-2-249, JP-A-2-291, JP-A-3-27393, JP-A-3-12403, and JP-A-6-41170 and the iron-allene complex compounds disclosed in JP-A-1-304453 and JP-A-1-152109.

Examples of the titanocene compounds are di-cyclopentadienyl-Ti-dichloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl), di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,4-difluorophen-1-yl, and bis(cyclopentadienyl)bis(2,6-difluoro-3-(pyr-1-yl) phenyl)titanium.

Of the above-described radical generators preferred are the carbon-halogen bond-containing compounds (i) and the metallocene compounds (j)

The radical generators can be used either individually or as a combination of two or more thereof.

It is possible to add various chemical modifications to the radical generator to improve the characteristics of the photosensitive layer. Conceivable chemical modifications include binding to a sensitizing dye (hereinafter described), the aforementioned addition polymerizable unsaturated compound or other radical generating parts, introduction of a hydrophilic moiety, introduction of a substituent for compatibility improvement or precipitation inhibition, introduction of a substituent for adhesion improvement, and polymerization.

The usage of the radical generator can arbitrarily be selected in agreement with the performance design of a lithographic printing plate precursor. For example, a combined use of two or more radical generators will enhance the compatibility in the photosensitive layer. It is advantageous for photosensitivity to use an increased amount of the radical generator. Sufficient photosensitivity will be secured by using 0.5 to 80 parts by weight, preferably 1 to 50 parts by weight, of the radical generator per 100 parts by weight of the photosensitive layer components.

The photopolymerizable photosensitive layer can contain a sensitizing dye in combination with the photopolymerization initiator. It is convenient to use sensitizing dyes effective in the visible region because, under the present situation, a visible light laser having a wavelength of 400 to 700 nm is excellent for use as a scanning light source for platemaking.

Suitable visible light sensitizing dyes include (a) cyanine dyes, (b) merocyanine dyes, (c) xanthene dyes, (d) ketocoumarin dyes, and (e) benzopyran dyes.

Preferred cyanine dyes (a) include, but are not limited to, those having the following structure, which are disclosed in JP-A-8-234428:

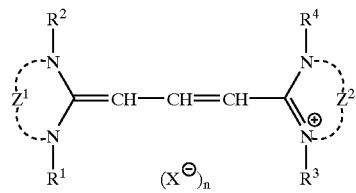

wherein $Z^1$ and $Z^2$, which may be the same or different, each represent a non-metal atomic group necessary to form a benzimidazole ring or a naphthoimidazole ring; $R^1$, $R^2$, $R^3$, and $R^4$ each represent a substituted or unsubstituted alkyl group; $X^-$ represents a counter anion; and n represents 0 or 1.

Specific examples of the cyanine dyes are listed in Table 1 below.

The merocyanine dyes (b) preferably include, but are not limited to, those having the following structures, which are described in JP-A-8-234429, JP-A-8-220758, and JP-A-8-220757.

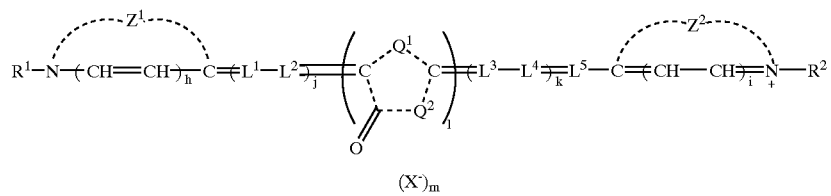

wherein $Z^1$ and $Z^2$ each represent a non-metal atomic group necessary to for a 5- and/or 6-membered nitrogen-containing heterocyclic ring generally used in cyanine dyes; $R^1$ and $R^2$ each represent an alkyl group; $Q^1$ and $Q^2$ represent, as combined, an atomic group necessary to complete a 4-thiazolidinone ring, a 5-thiazolidinone ring, a 4-imidazolidinone ring, a 4-oxazolidinone ring, a 5-oxazolidinone ring, a 5-imidazolidinone ring or a 4-dithiolanone ring; m represents 1 or 2; i and h each rep-resent 0 or 1; l represent 1 or 2; j and k each represent 0, 1, 2 or 3; and $X^-$ represents a counter anion.

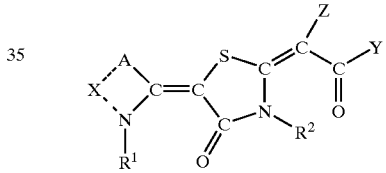

wherein $R^1$ and $R^2$ each represent a hydrogen atom, a substituted- or unsubstituted alkyl group, a substituted or unsubstituted alkenyl group, a substituted or unsubstituted alkynyl group, an alkoxycarbonyl group, a substituted or unsubstituted aryl group or an aralkyl group; A represents an oxygen atom, a sulfur atom, a selenium atom, a tellurium atom, an alkyl- or aryl-substituted nitrogen atom, or a dialkyl-substituted carbon atom; X represents a non-metal

TABLE 1

| $R^1$ | $R^2$ | $R^3$ | $R^4$ | A | B | C | D | X | n |
|---|---|---|---|---|---|---|---|---|---|
| $C_2H_5$ | $C_2H_5$ | $C_2H_5$ | $C_2H_5$ | Cl | Cl | Cl | Cl | I$^-$ | 1 |
| $C_2H_5$ | $C_2H_5$ | $C_2H_5$ | $C_2H_5$ | H | $CF_3$ | H | $CF_3$ | I$^-$ | 1 |
| $(CH_2)_2SO_3Na$ | $C_2H_5$ | $(CH_2)_2SO_3$ | $C_2H_5$ | Cl | Cl | Cl | Cl | — | 0 | atomic group necessary to form a 5-membered nitrogen-containing heterocyclic ring; Y represents a substituted phenyl group, a substituted or undubstituted polynucleic aromatic ring or a substituted or unsubstituted heterocyclic aromatic ring; Z represents a hydrogen atom, a substituted or unsubstituted alkyl group, a substituted or unsubstituted aryl group, an aralkyl group, an alkoxy group, an alkylthio group,.an arylthio group, a substituted amino group, an acyl group or an alkoxycarbonyl group; and Z and Y may be taken together to form a ring.

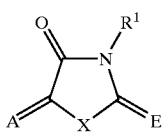

wherein A represents a substituted or unsubstituted 2(3H)-thiazolylidene group or a 2-thiazolidinylidene group; X represents —O—, —S—, —NR$^2$— or —CONR$^3$—; R$^1$, R$^2{}_1$, and R$^3$ each represent a hydrogen atom, a substituted or unsubstituted alkyl group, a substituted or unsubstituted aryl group, a substituted or unsubstituted alkenyl group or a substituted or unsubstituted alkynyl group; and E represents a substituted or unsubstituted 1,3-dihydro-1-oxo-2H-inden-2-ylidene group.

Specific example of the merocyanine dyes are shown below.

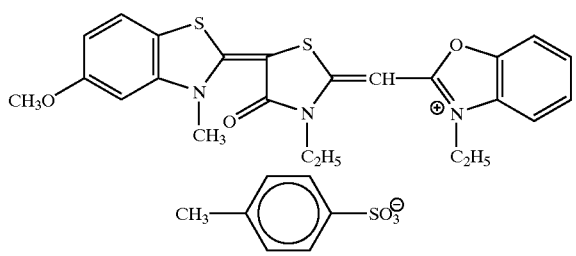

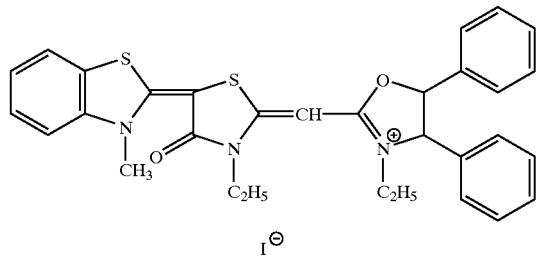

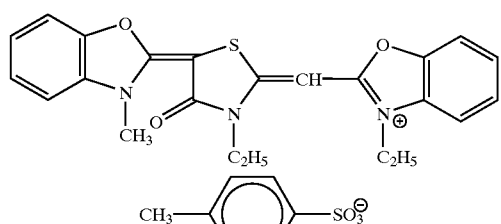

-continued

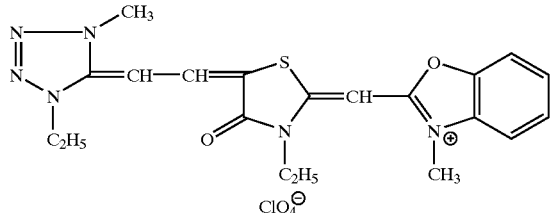

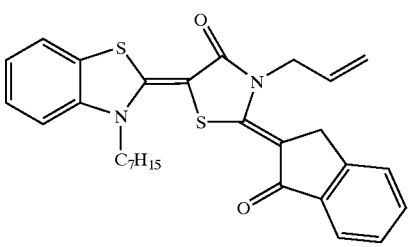

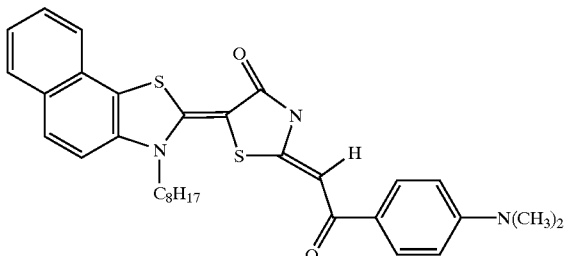

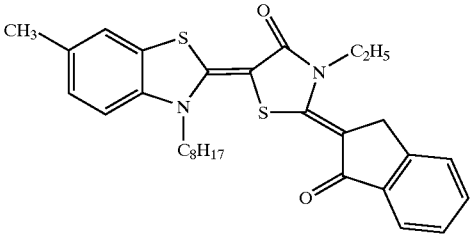

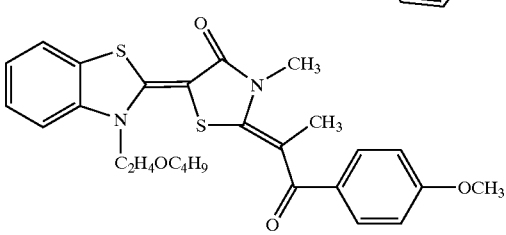

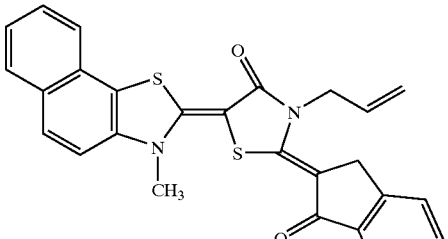

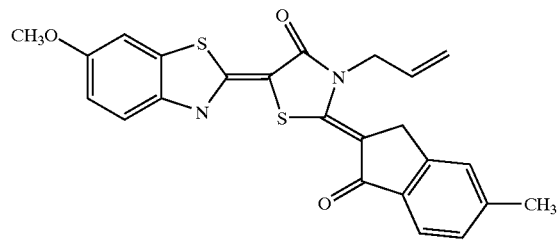

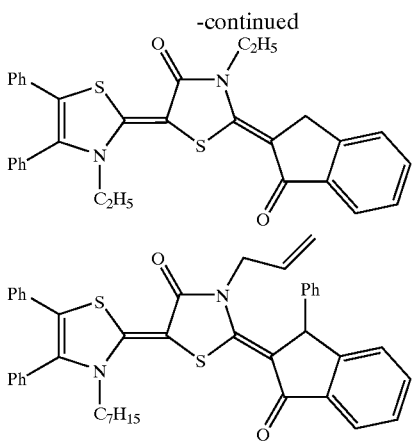

The xanthene dyes (c) preferably include Rhodamine B, Rhodamine 6G, Ethyl Eosin, alcohol-soluble Eosin, Pyronin Y, and Pyronin B.

The ketocoumarin dyes (d) preferably include, but are not limited to, those having the following structure, which are disclosed in JP-A-63-221110.

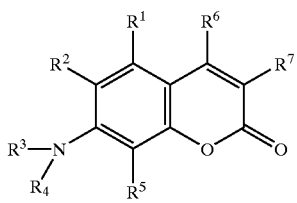

wherein $R^1$, $R^2$, and $R^3$ each represent a hydrogen atom, a halogen atom, an alkyl group or an alkoxy group; $R^4$ and $R^5$ each represent an alkyl group, at least one of which is an alkyl group having 4 to 16 carbon atoms; $R^2$ and $R^3$, or $R^4$ and $R^5$ may be taken together to form a ring; $R^6$ represents a hydrogen atom, an alkyl group, an alkoxy group, an acyl group, a cyano group, a carboxyl group or an ester or amide of a carboxyl group; and $R^7$ represents a heterocyclic ring residue having 3 to 17 carbon atoms which is represented by —CO—$R^8$, wherein $R^8$ represents an alkoxy group or a group of formula:

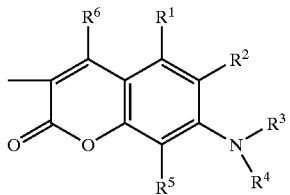

Specific examples of the ketocoumarin dyes are shown below.

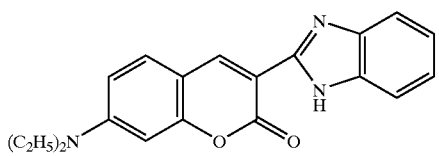

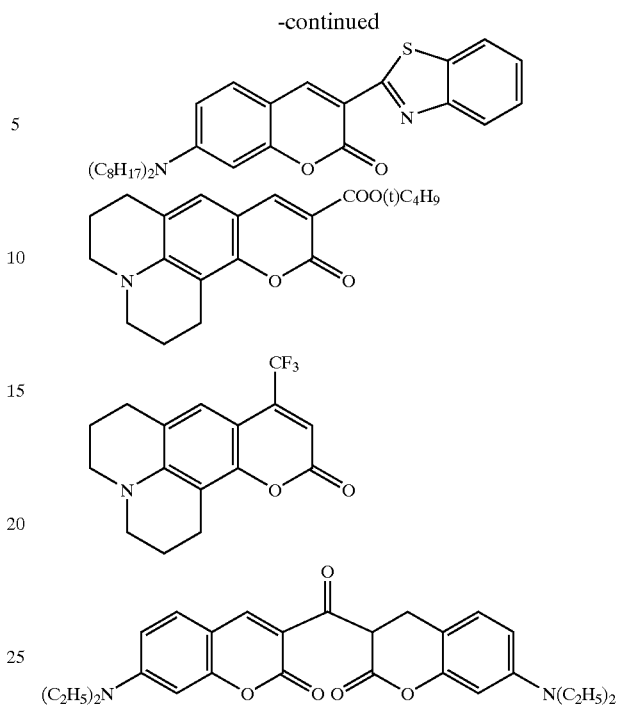

The benzopyran dyes (e) preferably include, but are not limited to, the compounds having the following structure which are disclosed in JP-A-8-334897.

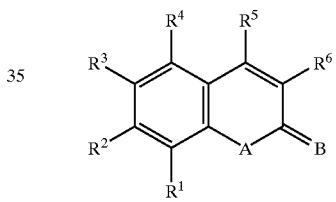

wherein $R^1$, $R^2$, $R^3$, and $R^4$ each represent a hydrogen atom, a halogen atom, an alkyl group, an aryl group, a hydroxyl group, an alkoxy group or an amino group; $R^1$, $R^2$, $R^3$, and $R^4$ may be taken with an available carbon atom to form a ring made up of non-metal atoms; $R^5$ represents a hydrogen atom, an alkyl group, an aryl group, a heterocyclic aromatic group, a cyano group, an alkoxy group, a carboxyl group or an alkenyl group; $R^6$ represents a group represented by $R^5$ or —Z—$R^5$; Z represents a carbonyl group, a sulfonyl group, a sulfinyl group or an arylenedicarbonyl group; and $R^5$ and $R^6$ may be taken together to form a ring made up of non-metal atoms; A represents O, S, NH or a nitrogen atom having a substituent; and B represents an oxygen atom or a group of formula:

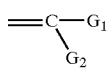

wherein $G_1$, and $G_2$, which may the same or different, each represent a hydrogen atom, a cyano group, an alkoxycarbonyl group, an aryloxycarbonyl group, an acyl group an arylcarbonyl group, an alkylthio group, an arylthio group, an alkylsulfonyl group, an arylsulfonyl group or a fluorosulfonyl group; provided that $G_1$ and $G_2$ do not simultaneously represent a hydrogen atom; and $G_1$ and $G_2$ may be taken together to form a ring made up of non-metal atoms.

Specific examples of the benzopyran dyes are shown below.

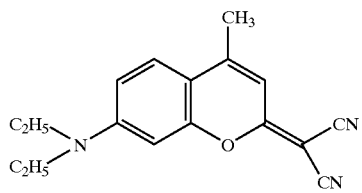

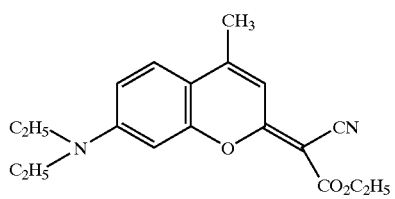

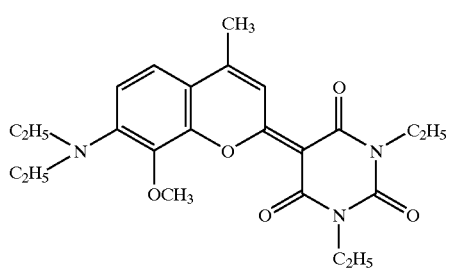

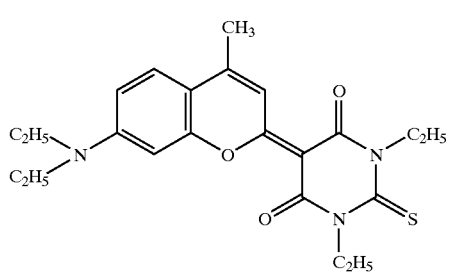

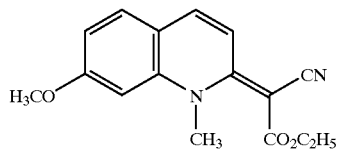

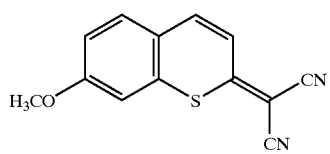

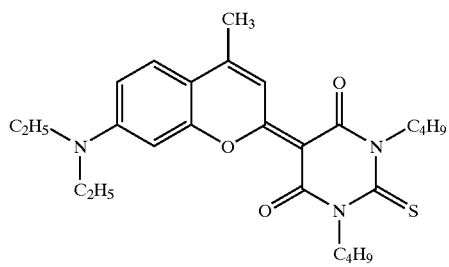

(D-1)

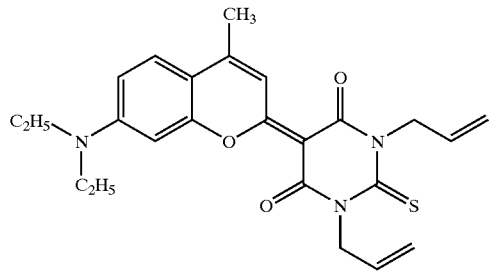

(D-2)

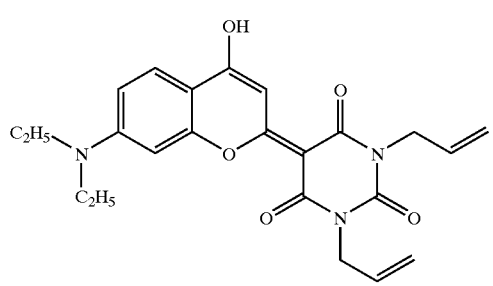

(D-3)

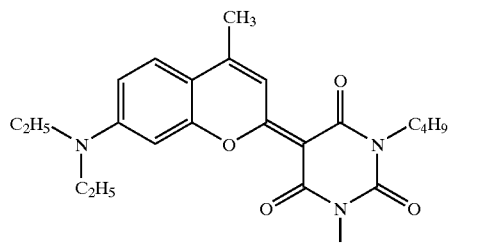

(D-4)

Preferred of the above-described sensitizing dyes are the merocyanine dyes (b) and the benzopyran dyes (e). The sensitizing dyes can be used either individually or in combination of two or more thereof.

Various chemical modifications can be made to the sensitizing dyes for the purpose of improving the characteristics of the photosensitive layer. For example, the aforementioned addition polymerizable compound structure (e.g., an acryloyl group or a methacryloyl group) can be bonded to the sensitizing dye through covalent bonding, ionic bonding or hydrogen bonding to enhance the film strength after exposure or to inhibit unnecessary precipitation of the dye from the exposed film. The radical generating part of the aforementioned radical generator or other radical generating part (e.g., a reduction-decomposable moiety such as an alkyl halide, an onium, a peroxide or a biimidazole moiety, or an oxidation-cleavage moiety such as a borate, an amine, a trimethylsilylmethyl, a carboxymethyl, a carbonyl or an imine moiety) can be bonded to the sensitizing dye to markedly improve the photosensitivity particularly in a low concentration of a photopolymerization initiation system. Introduction of a hydrophilic moiety (e.g., an acid radical or a polar group, such as a carboxyl group or an ester thereof, a sulfonic acid group or an ester thereof, and an ethylene oxide group) is effective in enhancing suitability to processing with an (alkali) aqueous developer which is a preferred embodiment of the use of the photosensitive layer. In particular, a hydrophilic group of ester type is characterized by excellent compatibility in the photosensitive layer owing to its relatively hydrophobic structure and by capability of generating an acid radical on hydrolysis in the developer thereby to gain in hydrophilic properties. Further, appropriate substituents can be introduced to the sensitizing dye to improve the compatibility in the photosensitive layer and to inhibit precipitation. For example, an unsaturated bond of an aryl group, an allyl group, etc. is very effective in improving compatibility in some photosensitive systems. Introduction of a steric hindrance between p-planes of a dye by, for example, introduction of a branched alkyl structure is effective in markedly inhibiting crystal precipitation. Introduction of a phosphonic acid group, an epoxy group, a trialkoxysilyl group, etc. brings about improved adhesion to inorganic substances such as metal or metal oxides. Polymerization of the sensitizing dye is also effective for some purposes.

Similarly to the radical generators, the usage of the sensitizing dyes can arbitrarily be decided according to the performance design of the lithographic printing plate precursor. For example, a combination of two or more sensitizing dyes will have improved compatibility in the photosensitive layer. In making a choice of the sensitizing dyes, the molar absorptivity at the wavelength of the light emitted from the light source used as well as photosensitivity are important factors. Dyes having a larger molar absorptivity are effective at a lower amount, which is not only economical but advantageous for the film properties. Because the photosensitivity and resolution of the photosensitive layer and the physical properties of the layer after exposure are largely influenced by the absorbance of the layer at the light source wavelength, the amount of the sensitizing dyes to be added should be decided appropriately with these factors taken into consideration. For example, a photosensitive layer whose absorbance is 0.1 or smaller has a low sensitivity and also exhibits a low resolving power due to the influence of halation. On the other hand, for the purpose of hardening a thick film of 5 μm or greater, such a low absorbance is sometimes rather effective in increasing the degree of hardening. Where the absorbance of a photosensitive layer is as high as 3 or more, most of light will be absorbed by the surface portion of the photosensitive layer so that hardening inside the layer may be hindered, which results in insufficient film strength and insufficient adhesion to the support for use as a printing plate. Where a photosensitive layer has a relatively small film thickness, the sensitizing dyes are preferably added in-such an amount that the photosensitive layer may have an absorbance of from 0.1 to 1.5, particularly 0.25 to 1, which generally corresponds to 0.05 to 30 parts by weight, preferably 0.1 to 20 parts by weight, still preferably 0.2 to 10 parts by weight, per 100 parts by weight of the photosensitive layer components.

For the purpose of improving the sensitivity, the photopolymerizable photosensitive layer can contain a co-initiator, such as amine compounds, thiol compounds, and oxime ether compounds.

Preferred examples of the oxime ether compounds include, but are not limited to, those having formula (I):

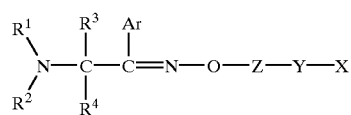

(I)

wherein $R^1$, $R^2$, $R^3$, and $R^4$ each represent an alkyl group or an aryl group; Ar represents an aryl group; $R^1$ and $R^2$, or $R^3$ and $R^4$ may be taken together to form a ring; Z represents a substituted or unsubstituted divalent linking group containing a hydrocarbon group; Y represents a single bond or a divalent linking group containing at least one of:

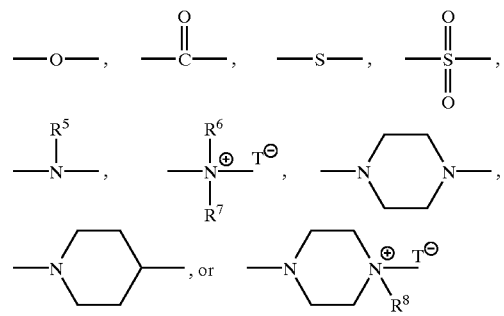

(wherein $R^5$ represents a hydrogen atom, a substituted or unsubstituted saturated or unsaturated hydrocarbon group, a carbonyl group or a sulfonyl group; $R^5$, $R^6$, $R^7$ and $R^8$, which may be the same or different, each represent a substituted or unsubstituted saturated or unsaturated hydrocarbon group; $T^-$ represents a halide anion or a sulfonate anion); and X represents an addition polymerizable group represented by formula (I-a):

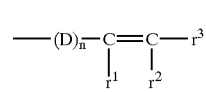

(I-a)

(wherein D represents

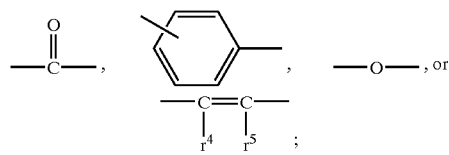

$r^1$, $r^2$, and $r^3$, which may be the same or different, each represent a hydrogen atom, a methyl group, an ethyl group, a phenyl group, a halogen atom, a cyano group or —C(=O)—OR$^9$; n represents 0 or 1; provided that when n=0, $r^1$, $r^2$, and $r^3$ do not simultaneously represent a hydrogen atom; $r^4$ and $r^5$, which may be the same or different, each represent a hydrogen atom, a methyl group, an ethyl group or a phenyl group; and $R^9$ represent an alkyl group or an aryl group)

Specific examples of the oxime ether compounds are listed in Table 2 below.

TABLE 2

Structure:
SCH₃-phenyl attached to C(CH₃)(CH₃) connected to morpholine-N and to C=N—O—Z—Y—X

| Compound No. | —Z—Y—X |
|---|---|
| I-1 | —CH₂CH₂—O—C(=O)—CH=CH₂ |
| I-2 | —CH₂CH₂—O—C(=O)—C(CH₃)=CH₂ |
| I-3 | —CH₂—C₆H₄—CH=CH₂ |
| I-4 | —CH₂—C(=O)—O—CH₂—C₆H₄—CH=CH₂ |
| I-5 | —CH₂CH₂CH₂O—C(=O)—C₆H₄—CH=CH₂ |
| I-6 | —CH₂CH₂CH₂—N((n)C₄H₉)—CH₂—C₆H₄—CH=CH₂ |
| I-7 | —CH₂—C₆H₄—C(CH₃)=CH₂ |
| I-8 | —CH₂—C₆H₄—CH=CH—C₆H₅ |
| I-9 | —CH₂CH₂—O—C₆H₄—CH=CH₂ |
| I-10 | —CH₂CH₂—C(=O)—O—C₆H₄—CH=CH₂ |

The above-described oxime ether compounds are particularly preferred co-initiators.

Similarly to the sensitizing dyes, various chemical modifications can be made to the co-initiators to bring about improvements on the characteristics of the photosensitive layer. Conceivable chemical modifications include binding to the sensitizing dye, the radical generator, the addition polymerizable unsaturated compound or other radical generating parts, introduction of a hydrophilic moiety, introduction of a substituent for compatibility improvement or precipitation inhibition, introduction of a substituent for adhesion improvement, and polymerization.

The co-initiators can be used either individually or as a combination of two or more thereof. The co-initiators are suitably added in an amount of 0.05 to 100 parts by weight, preferably 1 to 80 parts by weight, still preferably 3 to 50 parts by weight, per 100 parts by weight of the ethylenically unsaturated group-containing compound.

It is preferred for the photopolymerizable photosensitive layer of the lithographic printing plate, precursor to further contain a small amount of a thermal polymerization inhibitor to inhibit unnecessary thermal polymerization of the addition polymerizable compound during preparation or storage of the composition for forming the photosensitive layer. Suitable thermal polymerization inhibitors are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine primary cerium salt, and N-nitrosophenylhydroxylamine aluminum salt. The thermal polymerization inhibitor is preferably added in an amount of about 0.01 to 5% by weight based on the total weight of the composition. If desired, a higher fatty acid or a derivative thereof, such as behenic acid or its amide, etc. may be added to the composition and be localized in the surface portion of the photosensitive layer after drying so as to prevent polymerization hindrance by oxygen. The higher fatty acid (or a derivative thereof) is preferably added in an amount of about 0.5 to 10% by weight based on the total composition.

The photopolymerizable photosensitive layer can be colored by addition of a colorant Useful colorants include pigments such as phthalocyanine pigments (C.I. Pigment Blue 15:3, 15:4 or 15:6), azo pigments, carbon black, and titanium oxide; and dyes such as Ethyl Violet, Crystal Violet, azo dyes, anthraquinone dyes, and cyanine dyes. The colorants are preferably added in an amount of about 0.5 to 20% by weight based on the total composition.

The composition can further contain customary additives, such as inorganic fillers and plasticizers (e.g., dioctyl phthalate, dimethyl phthalate, and tricresyl phosphate) to improve the physical properties of the hardened film. The amount of the additives is preferably not more than 10% by weight based on the total composition.

The photopolymerizable photosensitive layer can be formed by coating a support (hereinafter described in detail) with a coating composition comprising the above-mentioned various essential and optional components as dissolved in an appropriate organic solvent. Examples of solvents suitable for coating are acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These solvents can be used either individually or as a mixture thereof. The solvent is suitably used in such an amount to as give a solids concentration of 1 to 50% by weight.

The coating composition can contain a surface active agent to improve the coating properties.

The coating composition is suitably applied to the support to a dry coating weight of about 0.1 to 10 g/m$^2$, preferably 0.3 to 5 g/m$^2$, still preferably 0.5 to 3 g/m$^2$.

[IV] Aluminum Support

The aluminum support which can be used in the invention is selected from a plate made of pure aluminum, which is stable in dimensions, or an aluminum alloy containing a trace amount of other elements and a plastic film or paper laminated or deposited with aluminum or an aluminum alloy. A composite sheet comprising a polyethylene terephthalate film and an aluminum sheet as described in JP-B-41-8327 also serves as an aluminum support.

In what follows, the above-mentioned unfinished plate comprising aluminum or an aluminum alloy will be inclusively referred to as an aluminum plate. The alloying elements that can constitute the aluminum alloy include silicon, iron, manganese, copper, magnesium, chromium, zinc, bismuth, nickel, and titanium. The total amount of these hetero elements is not more than 10% by weight. While a pure aluminum plate is suitable, existence of a trace amount of hetero elements is acceptable because of technical difficulty in obtaining pure aluminum. That is, the aluminum plate to be used in the invention is not specified in its composition, and known materials that have been conventionally used in the art, such as JIS A1050, JIS A1100, JIS A3103, and JIS A3005, can be utilized.

The thickness of the aluminum plate is subject to variation according to the size of the printing machine, the size of the printing plate or users demand and preferably ranges from about 0.1 to 0.6 mm.

An aluminum plate having the following surface properties is particularly preferred for use in the present invention.
(i) Surface profile (according to JIS, measured with a profilometer, Surfcom 575 (supplied by Tokyo Seimitu K.K.) under conditions of a cut-off value of 0.8 mm, a scanning speed of 0.3 mm/sec, a probe radius of 2 $\mu$m, and an assessment length of 3 mm)

Ra (center-line average roughness): 0.20 to 0.70 mm

Rtm (10 point average roughness): 1.0 to 5.0 $\mu$m

Rq (root mean square (rms) parameter corresponding to Ra): 0.2 to 2.0 $\mu$m

Sm (mean spacing between profile peaks): 20 to 80 $\mu$m

Pc (peak count, number of local peaks which project through a band of ±0.5 $\mu$m centered about the center line): 10 to 70

Δa (rms slope of the profile): 5 to 12°

Mr1 (initial wear bearing ratio): 10 to 15%

(ii) Crystallographic Structure

When a polished surface of an aluminum plate is observed under an optical microscope, an average width of 100 surface recrystallized grains falls within a range of from 3 to 60 $\mu$m.

(iii) Surface Density

Value L*: 40 to 80 (as measured with a color difference meter)

Density: 0.15 to 0.35 (as measured with a Macbeth densitometer)

(Silicate Treatment)

The aluminum plate is subjected to a surface graining treatment, etc. (hereinafter described in detail), followed by a treatment with a silicate for making the surface water wettable. The silicate treatment conducted in the present invention is formation of a silicate film having a silicon content of 0.5 to 40 mg/m$^2$, preferably 1 to 30 mg/m$^2$. The amount of silicon applied onto the aluminum plate can be measured by X-ray fluorescence analysis.

The silicate treatment can be carried out conveniently by immersing an aluminum plate having been subjected to anodizing in an aqueous solution of an alkali metal silicate as taught in JP-B-47-5125. The method disclosed in U.S. Pat. Nos. 2,714,066, 3,181,461,3,280,734, and 3,902,734, which uses an alkali metal silicate (e.g., a sodium silicate aqueous solution), is also applicable. According to the disclosed method, an aluminum plate having an anodized layer is immersed in an alkali metal silicate aqueous solution having a concentration of 1 to 30% by weight, preferably 2 to 15% by weight, and a pH of 10 to 13 (25°) at, e.g., 15 to 80° C. for 0.5 to 120 seconds.

The alkali metal silicates useful for the silicate treatment include sodium silicate, potassium silicate, and lithium silicate. The pH of the alkali silicate aqueous solution is adjusted with sodium hydroxide, potassium hydroxide, lithium hydroxide, etc.

The alkali silicate aqueous solution may contain an alkaline earth metal salt or a salt of a metal of the group IVB. The alkaline earth metal salt includes water-soluble salts, such as nitrates (e.g., calcium nitrate, strontium nitrate, magnesium nitrate, and barium nitrate), sulfates, hydrochlorides, phosphates, acetates, oxalates, and borates.

The group IVB metal salts include titanium tetrachloride, titanium trichloride, potassium titanium fluoride, potassium titanium oxalate, titanium sulfate, titanium tetraiodide, zirconium oxychloride, zirconium dioxide, and zirconium tetrachloride.

The alkaline earth metal salts or the group IVB metal salts can be used either individually or as a combination of two or more thereof. These metal salts are preferably added in an amount of 0.01 to 10% by weight, particularly 0.05 to 5.0% by weight.

Silicate electrodeposition as described in U.S. Pat. No. 3,658,662 is also an effective silicate treatment for making the aluminum plate water-wettable. A combination of an anodizing treatment and a sodium silicate treatment on an electrolytically grained aluminum plate as disclosed in JP-B-46-27481, JP-A-52-58602, and JP-A-52-30503 is also useful.

(Acid Treatment)

The silicate-treated aluminum plate is then treated with an acidic solution to improve adhesion to a photopolymerizable photosensitive layer. Acids used for the acid treatment include hydrochloric acid, sulfuric acid, nitric acid, phosphoric acid, oxalic acid, chromic acid, sulfamic acid, benzenesulfonic acid, etc. and mixtures thereof. A preferred pH of the acidic solution is 0 to 6. Acidic solutions at a lower pH than 0 are dangerous to handle, and those at a higher pH than 6 fail to sufficiently improve adhesion. The acid treatment is suitably carried out at a temperature of 10 to 80° C. for an immersion time of 1 to 300 seconds.

While not clear, the reason why an acid treatment improves adhesion seems to be as follows. It has been confirmed by X-ray fluorescence analysis or electron spectroscopy for chemical analysis (ESCA) that the acid treatment reduces the silicate having been adsorbed by 5 to 30% and also reduces metal ions which are present in small amounts in the silicate film, e.g., Na and Ca. Further, in order to estimate the SiOH amount of the silicate film, the inventors treated the film with 1N $Na_2CO_3$ at 25° C. for 10 seconds to convert SiOH into SiONa, and after washing with distilled water and drying, measured the Na content by ESCA. As a result, it was found that the acid treatment results in increase of Na. In other words, it is considered that the acid treatment increases the SiOH content on the silicate film surface.

It has also been found that an aluminum support prepared by subjecting the aluminum plate to a series of treatments up to the acid treatment exhibits considerably reduced dyeability when allowed to stand in a 0.5% aqueous solution of Crystal Violet, which is a cationic dye, for 12 hours as compared with an aluminum plate having been subjected to the same treatments except an acid treatment. This implies that the acid treatment reduces the negative charges on the film surface to make the surface less capable of adsorbing Crystal Violet, a cationic dye.

That is, the acid treatment reduces the metal ions (Na, Ca, etc.) present in small amounts on the silicate surface and increases an SiOH content to provide increased sites for chemical bonding to an adhesive layer applied thereon (hereinafter described), which seems to account for the improved adhesion between the aluminum-support and the photopolymerizable photosensitive layer.

(Adhesive Layer)

The silicate-treated and acid-treated aluminum plate is coated with an adhesive layer containing a silicone compound having a functional group capable of radical-induced addition reaction (hereinafter referred to an addition-reactive functional group).

The adhesive layer containing a silicone compound having an addition-reactive functional group is preferable formed by using an organosilicone compound as a starting material. Specifically, an organosilicone compound represented by formula (40):

$$R^{18}Si(OR^{19})_3 \quad (40)$$

wherein $R^{18}$ represents an addition-reactive functional group; and $-OR^{19}$ represents a hydrolyzable alkoxy group or $-OCOCH_3$, is applied to the aluminum plate and allowed to react with a metal, a metal oxide, a hydroxide, a hydroxyl group, a silanol group formed through a chemical treatment of the plate, and the like to form a covalent bond with the surface of the plate, whereby a functional group represented by formula (41):

$$(R^{20}O)_2(R^{18})Si- \quad (41)$$

wherein $R^{18}$ is as defined above; and $R^{20}$ represents an alkyl group, either the same as or different from the alkyl moiety $R^{19}$, a hydrogen atom or a bond to another Si atom, is bonded to or implanted into the plate surface.

In place of the compound of formula (40), organosilicone compounds having two or three addition-reactive functional groups $R^{18}$'s bonded to the center Si atom which are represented by formula (42) or (43):

$$(R^{18})_2Si(OR^{19})_2 \quad (42)$$

$$(R^{18})_3SiOR_{19} \quad (43)$$

wherein $R^{18}$ and $R^{19}$ are as defined above, are also useful.

Organosilicone compounds having four addition-reactive functional groups $R^{18}$'s which are represented by formula (44):

$$(R^{18})_4Si \quad (44)$$

are also useful. In this case a functional group having the addition-reactive functional groups $R^{18}$'s bonded to the center Si atom via an oxygen atom is bonded or implanted to the aluminum plate.

The organosilicone compound of formula (40) should be applied to the-aluminum plate while at least one of the three $OR^{19}$'s bonded to the center Si atom remains non-hydrolyzed.

The organosilicone compound of formula (40) can be applied as such or, if desired, as diluted with an appropriate solvent. Water and/or a catalyst can be added to have the organosilicone compound bonded to the aluminum plate more firmly. Useful solvents include alcohols, such as methanol, ethanol, propanol, isopropyl alcohol, ethylene glycol, and hexylene glycol. Useful catalysts include acids, such as hydrochloric acid, acetic acid, phosphoric acid, and sulfuric acid, and bases, such as ammonia and tetramethylammonium hydroxide.

The amount (number) of the addition-reactive functional group bonded onto the aluminum plate is usually 0.01 to 1000, preferably 0.05 to 200, still preferably 0.1 to 50, per 10 $nm^2$, while varying according to the kind of the functional group. Less than 0.01 addition-reactive functional group per 10 $nm^2$ may fail to give sufficient photo-adhesion strength. It is possible to increase the amount of the addition-reactive functional groups per unit area by repeatedly applying the organosilicone compound to form a thick layer, but too large a coating thickness would be a waste because only about 10 addition-reactive functional groups per 10 $nm^2$ could be exposed at the most on the surface. Considering that too many addition-reactive functional groups on an aluminum support tend to cause insufficient water wettability of non-image areas of a lithographic printing plate, a suitable number of the addition-reactive functional group is within 1000 per 10 $nm^2$.

Accordingly, when the organosilicone compound is applied to provide the aluminum plate with the addition-reactive functional groups, it is required to select various process parameters so that the amount of the functional groups per unit area may fall within the above range. The process parameters include the kind and amount of a solvent for diluting the organosilicone compound, the amount of water if added for hydrolysis on the aluminum plate, the kind and amount of a catalyst if added for accelerating hydrolysis on the plate, the method of applying the organosilicone compound (solution), the conditions of drying after application (e.g., atmosphere, temperature and time), and so forth.

The amount of the addition-reactive functional groups held on the aluminum support is obtained from the surface Si atom content, the surface carbon-carbon multiple bond content, etc. as quantitatively determined by an appropriate method, for example, X-ray fluorescence analysis or infrared absorption analysis.

In the above-described manner, an anodized layer and a silicate film are formed on the aluminum plate, and addition-reactive functional groups are bonded to the surface to complete the support for use in the invention. It is noted, however, that a lithographic printing plate prepared by using the resulting support, which can be said to be an addition-reactive support, tends to suffer from ink staining as follows. A lithographic printing plate is prepared by imagewise exposing the photopolymerizable photosensitive layer of a printing plate precursor to cause interfacial photo-adhesion in the exposed areas, removing the unexposed photosensitive layer with a developer to leave the photopolymerized film adhered to the support in the light pattern. On applying ink and water to the printing plate thus produced, ink adheres to the image areas (exposed areas), and water to the non-image areas (unexposed areas). Where the above-described organosilicone compound is used alone to provide the addition-reactive functional groups, an excess of the organic functional groups may tend to exist on the unexposed areas, making the unexposed areas receptive to not only water but printing ink, which is observed as stains. on printed matter.

In order to prevent such stains, it is therefore desirable to fix many hydroxyl groups onto the aluminum plate in addition to the addition-reactive functional groups ($R^{18}$). This can be achieved by using, in combination with the organosilicone compound of formula (40): $R^{18}Si(OR^{19})_3$, an organosilicone compound represented by formula (45):

$$Si(OR^{21})_4 \qquad (45)$$

wherein —$OR^{21}$ represents a hydrolyzable group selected from an alkoxy group, an alkoxyalkoxy group,. an aryloxy group and —$OCOCH_3$; $R^{21}$ may be the same as or different from $R^{19}$, so that hydrophilic sites represented by formula (46):

$$(R^{22}O)_2(OH)Si— \qquad (46)$$

wherein $R^{22}$ represents an alkyl group, a hydrogen atom or a bond to another Si atom, as well as the reactive sites represented by formula (41) may be bonded to the surface of the aluminum plate. From the standpoint of hydrophilicity (water wettability), $R^{22}$ in formula (46) is most preferably a hydrogen atom. Where $R^{22}$ is other than a hydrogen atom, the surface of the plate may be washed with an alkali solution to enhance the water wettability if necessary.

The mixing ratio of the organosilicone compound of formula (40) and the organosilicone compound of formula (45) cannot be specified generally because the bonding (implanting) efficiency of the respective functional groups varies depending on the surface chemical properties of the aluminum plate. In the practice, an optimum mixing ratio that secures a good balance between the photo-adhesion attributed to the addition-reactive functional group ($R^{18}$) and the water wettability attributed to the partial structure of formula (46) is to be decided through experimentation on varied mixing ratios. Anyway, the mixing ratio is desirably such that the density of the addition-reactive functional groups falls within the above-specified range. More specifically, a suitable mixing molar ratio of the organosilicone compound (45) to the organosilicone compound (40) is 0.05 to 500, preferably 0.2 to 200, still preferably 1 to 100. The water wettability of the non-image areas increases with the amount of the hydrophilic group derived from the compound of formula (45) increasing within this range. Even where the density of the hydrophilic. groups is low, it is possible to increase that density by rendering the addition-reactive functional group hydrophilic.

The method of bonding the addition-reactive functional group to the aluminum plate is roughly divided into (i) a method in which the organosilicone compound is used as such (hereinafter referred to as a SC method), which has been described above, and (ii) a method in which the organosilicone compound is hydrolyzed and polycondensed to form an organic/inorganic composite comprising an inorganic polymer containing an —Si—O—Si— bond and having the addition-reactive functional groups fixed to the inorganic polymer (hereinafter referred to as an SG method). On applying the organic/inorganic composite to an aluminum plate and drying, the inorganic polymer portion adheres to the plate while the addition-reactive functional groups remain on the plate surface.

Where the SC method is followed, bonding of the addition-reactive functional groups tends to be localized at the sites of the aluminum plate having specific properties, making it difficult to uniformly distribute the functional groups on the support. That is, the silicon atoms are likely to form a covalent bond at specific acidic sites or basic sites, so that the distribution of the addition-reactive functional groups tends to be governed by the distribution of acidic sites or basic sites of the aluminum plate. Such an uneven distribution of the functional groups may cause unevenness in photo-adhesive strength of image areas or water wettability of non-image areas. In cases where such tendency is observed, the SG method is advantageously followed.

Intermediate modes between the SC method and the SG method are also employable. For example, an organosilicone compound composed of two or three molecules of the compound of formula (40): $R^{18}Si(OR^{19})_3$ with all or a part of the $OR^{19}$ groups hydrolyzed can be used.

According to the SG method, the organosilicone compound of formula (40), either alone or as a mixture with'the organosilicone compound of formula (45) at a certain mixing ratio, is hydrolyzed in liquid in the presence or absence of a catalyst in such a manner that the reaction may not take place at the addition-reactive functional groups $R^{18}$ but at the —$OR^{19}$ (and —$OR^{21}$) groups and, at the same time, polycondensed to obtain a liquid composition comprising an inorganic polymer having the center Si atoms linked through an —Si—O—Si— bond. The resulting liquid composition is applied to the aluminum plate, and if necessary dried, to bond the addition-reactive functional groups to the plate.

In this case, the distribution of the addition-reactive functional groups fixed onto the aluminum plate is less influenced by the chemical properties of the plate, such as distribution of acidic sites or basic sites. Where the organosilicone compound of formula (45) is used in combination with the organosilicone compound of formula (40) as starting materials, the ratio of the addition-reactive functional group-bound sites and the hydrophilic group-bound sites on the aluminum support is substantially ruled by the charging ratio of the organosilicone compound (40) to the organosilicone compound (45). This means that the process parameters for obtaining an optimum surface can be designed more orderly than in the SC method.

Specific examples of the organosilicone compounds of formula (40) which can be used in the invention are:

$CH_2$=CH—Si($OCOCH_3$)$_3$,
$CH_2$=CH—Si($OC_2H_5$)$_3$,
$CH_2$=CH—Si($OCH_3$)$_3$,
$CH_2$=CHCH$_2$—Si($OC_2H_5$)$_3$,
$CH_2$=CHCH$_2$NH ($CH_2$)$_3$—Si($OCH_3$)$_3$,
$CH_2$=CHCOO—($CH_2$)$_3$—Si($OCH_3$)$_3$,
$CH_2$=CHCOO—($CH_2$)$_3$—Si($OC_2H_5$)$_3$,
$CH_2$=C($CH_3$)COO—($CH_2$)$_3$—Si($OCH_3$)$_3$,
$CH_2$=C($CH_3$)COO—($CH_2$)$_3$—Si($OC_2H_5$)$_3$,
$CH_2$=C($CH_3$)COO—($CH_2$)$_4$—Si($OCH_3$)$_3$,
$CH_2$=C($CH_3$)COO—($CH_2$)$_5$—Si($OCH_3$)$_3$,
$CH_2$=CHCOO—($CH_2$)$_4$—Si($OCH_3$)$_3$,
($CH_2$=C($CH_3$)COO—($CH_2$)$_2$)$_2$—Si($OCH_3$)$_2$,
$CH_2$=C(CH=$CH_2$)—Si($OCH_3$)$_3$,
$CH_2$=CH—$SO_2$NH—($CH_2$)$_3$—Si($OCH_3$)$_3$,
$CH_2$=CH—ph—O—Si($OCH_3$)$_3$ (ph: benzene ring),
$CH_2$=CH—ph—CONH—($CH_2$)$_3$—Si($OCH_3$)$_3$, CH$_2$=CH—ph13 CH$_2$NH—(CH$_2$)$_3$13 Si(OCH$_3$)$_3$,
HC≡C—Si(OC$_2$H$_5$)$_3$,
CH$_3$C≡C—Si(OC$_2$H$_5$)$_3$,

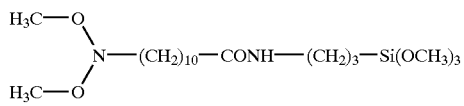

CH$_2$=CHCH$_2$O—Si(OCH$_3$O)$_3$,
(CH$_2$=CHCH$_2$)$_4$Si,
HO—CH$_2$—C≡C—Si(OC$_2$H$_5$)$_3$,
CH$_3$CH$_2$CO—C≡C—Si(OC$_2$H$_5$)$_3$,
CH$_2$=CHS—(CH$_2$)$_3$—Si(OCH$_3$)$_3$,
CH$_2$=CHCH$_2$O—(CH$_2$)$_2$—SCH$_2$—Si(OCH$_3$)$_3$,
CH$_2$=CHCH$_2$S—(CH$_2$)$_3$—S—Si(OCH$_3$)$_3$,
(CH$_3$)$_3$CCO—C≡C—Si(OC$_2$H$_5$)$_3$,
(CH$_2$=CH)$_2$N—(CH$_2$)$_2$—SCH$_2$—Si(OCH$_3$)$_3$, and
CH$_3$COCH=C(CH$_3$)—O—Si(OCH$_3$)$_3$.

Specific examples of the organosilicone compounds represented by formula (45) are tetramethoxysilane, tetraethoxysilane, tetraisopropoxysilane, tetra(n-propoxy)silane, tetra(n-butoxy)silane, tetrakis(2-ethylbutoxy)silane, tetrakis(2-ethylhexyloxy)silane, tetrakis(2-methoxyethoxy)silane, tetraphenoxysilane, and tetraacetoxysilane, with tetraethoxysilane being preferred.

Whether the SC method or the SG method is adopted to bond the addition-reactive functional groups to the aluminum plate, the kind of the solvent, the method of applying to the plate, the drying method, and the like are common, except that the SG method needs previous preparation of the inorganic polymer composition. A preferred embodiment of the SG method will be described below with particular reference to the combined use of the organosilicone compounds of formulae (40) and (45).

Alcohols, such as methanol, ethanol, propanol, isopropyl alcohol, ethylene glycol, and hexyleneglycol, are used as a solvent for the hydrolysis and polycondensation of the organosilicone compounds of formulae (40) and (45) into a liquid composition suited to the SG method.

The solvent is usually used in an amount 0.2 to 500 times, preferably 0.5 to 100 times, still preferably 1 to 20 times, the total weight of the organosilicone compounds. If the weight ratio of the solvent is less than 0.2, the reaction system is apt to become gel and instable with time. If it exceeds 500, the reaction takes several days t o complete.

Water for hydrolysis is added in an amount of 0.1 to 1000 mol, preferably 0.5 to 200 mol, still preferably 1.5 to 100 mol, per mole of the total of the organosilicone compounds. With less than 0.1 mol of water, the hydrolysis and the successive polycondensation are slow, requiring several days to achieve stable surface treatment. With more than 1000 mol of water, on the other hand, the resulting composition not, only shows contact failure when applied onto an aluminum surf ace but exhibits poor stability with time, of ten turning into gel during coating.

The reaction temperature convenient for preparing a suitable composition is usually from room temperature up to about 100° C. Temperatures out of this range are usable in the presence of some of the catalysts hereinafter described. Temperatures above the boiling point of the solvent used are also adoptable, in which cases a refluxing condenser can be fitted to the reactor if necessary.

Catalysts which can be used according to necessity include acids, such as hydrochloric acid, sulfuric acid, nitric acid, phosphoric acid, acetic acid, malic acid, and oxalic acid; and bases, such as ammonia, tetramethylammonium hydroxide, potassium hydroxide, and sodium hydroxide.

The catalyst is used in an amount of 0.001 to 1 mol. preferably 0.002 to 0.7 mol. more preferably 0.003 to 0.4 mol, per mole of the total of the organosilicone compounds (40) and (45). Use of more than 1 mol of the catalyst is no benefit for economy.

A convenient reaction temperature in using a weak acid, e.g., acetic acid or malic acid, as a catalyst is 40 to 100° C., while that in using a strong acid, e.g., sulfuric acid or nitric acid is 10 to 60° C. In using phosphoric acid, the reaction temperature can range from 10 to 90° C.

Heat application is usually involved in the preparation of the composition used in the SG method and in drying the applied composition. A volatile acid might evaporate by the heat to corrode the peripheral equipment. Therefore, where the SG method is adopted to a system having an iron material, it is recommended to use sulfuric acid and/or phosphoric acid which are nonvolatile as a catalyst.

The composition comprising the organosilicone compounds of formulae (40) and (45), the organic solvent, water and, if desired, the catalyst is allowed to react at a selected temperature for a selected time while, if necessary, stirring. Whereupon hydrolysis and polycondensation take place to form a polymer or colloidal polymer containing an Si—O—Si bond, and the liquid composition increases the viscosity into sol.

When the organosilicone compounds of formulae (40) and (45) are used in combination as described above, both of them may be put into the reactor from the beginning, or either one of them is allowed to undergo hydrolysis and polycondensation to some extent, whereon the other organosilicone compound is added to complete the reaction.

The sol composition thus prepared sometimes undergoes further polycondensation reaction into gel while left to stand at room temperature. Such gelation can be prevented or retarded by diluting the composition immediately after preparation with a solvent which is to be used in applying to the aluminum plate.

In order to bond a desired amount of the organosilicone compound or the addition-reactive functional group to the aluminum plate and to avoid uneven distribution of the organosilicone compound or the addition-reactive functional group on the support, it is preferable that the concentration of the treating liquid, whether by the SC method or the SG method, be adjusted by addition of a solvent before application. While an alcohol solvent, especially methanol, is suited for the purpose, other solvents, organic compounds, inorganic additives, surface active agents, etc. may be added.

Other solvents that can be added to the treating liquid include methyl ethyl ketone, ethylene glycol monomethyl ether, ethylene glycol monoethyl ether, 2-methoxyethyl acetate, 1-methoxy-2-propyl acetate, dimethoxyethane, methyl lactate, ethyl lactate, acetylacetone, and ethylene glycol.

Organic compounds that can be added to the treating liquid include epoxy resins, acrylic resins, butyral resins, urethane resins, novolak resins, pyrogallol-acetone resins, polyvinylpyrrolidone, polyvinyl alcohol, polyvinyl methyl ether, and polypropylene glycol.

Useful inorganic additives include colloidal silica and colloidal alumina.

High-boiling solvents, such as ethylene glycol and ethylene glycol monomethyl ether, serve to improve the stability of the liquid diluted to the concentration for application to the support and to assure the reactivity reproduction of the bonded addition-reactive functional group. Organic compounds, such as novolak resins and pyrogallol-acetone resins, produce the same effects but have a side action of reducing the water wettability of the support and therefore need strict control on the amount to be added.

When the sol or liquid composition suitable for the SG method is applied on the aluminum plate and dried in air or under heat, the inorganic polymer having an Si—O—Si bond turns into gel and forms a covalent bond with the surface of the aluminum plate. The step of drying, which is for removal of the solvent residual water and, in some cases, the catalyst, may be omitted for some uses of the resulting support. In the SC method, the step of drying is contemplated for not only removal of the solvent, residual water, etc. but securing the adhesion between the organosilicone compound and the aluminum plate. Accordingly, for some purposes, heat application may be continued after completion of drying.

The maximum temperature in the drying step or in the continued heating is preferably such that the addition-reactive functional group $R^{18}$ may not decompose. From this viewpoint a useful drying or heating temperature ranges from room temperature to 200° C., preferably up to 150° C., particularly up to 120° C.

The drying time is usually 1 second to 30 minutes, preferably 5 seconds to 10 minutes, still preferably 10 seconds to 3 minutes.

The treating liquid (the organosilicone compounds per se or a solution or a sol solution thereof) is applied by various known coating techniques, such as brush coating, dip coating, atomizing, spin coating, doctor blade coating, and the like. A suitable coating technique is chosen taking into consideration the surface shape of the aluminum plate, a contemplated film thickness, and so forth.

The surface treatments such as graining and anodizing which are given to the aluminum plate before the above-described silicate treatment will be explained below in detail.

(Graining Treatment)

Graining can be carried out by mechanical graining, chemical graining, electrolytic graining (electrochemical graining in a hydrochloric acid or nitric acid electrolytic solution), or a like technique as taught in JP-A-56-28893. Mechanical graining includes wire brush graining (scratching with a metal wire brush), ball graining with abrasive balls and an abrasive agent, brush graining with a nylon brush and an abrasive agent. Two or more of these graining methods can be used in combination.

In particular, electrochemical graining in a hydrochloric acid or nitric acid electrolytic solution is suitable for making surface roughness useful in the present invention. Electrolysis is preferably carried out in a 0:1 to 50% solution of hydrochloric acid or nitric acid at 20 to 100° C. for 1 second to 30 minutes at a current density of 100 to 400 C/dm$^2$.

The grained aluminum plate is chemically etched with an acid or an alkali. An alkali etchant (i.e., etching agent) is preferred in industrial application of the invention; for acid etchant needs time to destroy the microstructure. Suitable alkali etchant includes 1 to 50% aqueous solutions of sodium hydroxide, sodium carbonate, sodium aluminate, sodium metasilicate, sodium phosphate, potassium hydroxide, lithium hydroxide, etc. The alkali etchant is used at 20 to 100° C. The concentration and the temperature conditions are preferably selected so as to dissolve 5 to 20 g of aluminum per m$^3$.

The chemical etching is followed by desmutting by washing with an acid, such as nitric acid, sulfuric acid, phosphoric acid, chromic acid, hydrofluoric acid, and tetrafluoroboric acid. The method disclosed in JP-A-53-12739 which comprises treating with 15 to 65 wt % sulfuric acid at 50 to 90° C. or the alkali etching method disclosed in JP-B-48-28123 are preferred particularly for desmutting following the electrochemical surface graining.

(Anodization)

The aluminum plate thus treated is preferably subjected to anodizing. Anodizing can be performed by a method conventionally employed in the art. Specifically, a direct current or an alternating current is applied to the aluminum plate in an aqueous or non-aqueous solution of at least one of sulfuric acid, phosphoric acid, chromic acid, oxalic acid, sulfamic acid, benzenesulfonic acid, etc. thereby to form an anodized layer on the aluminum plate.

The anodizing conditions are subject to variation depending on the electrolytic solution used. Generally suitable conditions are 1 to 80% in electrolytic solution concentration; 5 to 70° C. in solution temperature; 0.5 to 60 A/dm$^2$ in current density; 1 to 100 V in voltage; and 10 to 100 seconds in electrolysis time. In particular, anodizing is preferably carried out in accordance with the method disclosed in British Pat. No. 1,412,768 which uses sulfuric acid and a high current density and the method described in U.S. Pat. No. 3,511,661 which uses phosphoric acid.

The anodized layer preferably has a thickness corresponding to 1 to 10 g/m$^2$. A smaller thickness tends to allow the printing plate to receive scratches easily. A larger thickness requires much power to form, which is economically disadvantageous. A preferred thickness is 1.5 to 7 g/m$^2$, particularly 2 to 5 g/m$^2$.

The graining treatment and/or the anodizing treatment can be followed by sealing treatment. Sealing treatment is carried out by immersion in a hot water bath which may contain an inorganic salt or an organic salt or by exposure in a steam bath.

The thus treated aluminum plate is subjected to the silicate treatment, acid treatment, and adhesive layer formation as described hereinabove to complete an aluminum support. The aluminum support is coated with the photopolymerizable photosensitive layer to obtain a lithographic printing plate precursor according to this invention. If desired, an organic undercoat may be provided between the support and the photosensitive layer. An undercoat comprising a water-soluble resin, such as polyvinylphosphonic acid, a polymer or copolymer having a sulfonic acid group in the side chain, polyacrylic acid or a water-soluble metal salt (e.g., zinc borate), a yellow dye, an amine salt, etc. is also suitable.

Organic compounds which can be used as an organic undercoat include carboxymethyl cellulose, dextrin, gum arabic, organic phosphonic acids, such as those having an amino group (e.g., 2-aminoethylphosphonic acid), phenylphosphonic acid, a substituted phenylphosphonic acid, naphthylphosphonic acid, an alkylphosphonic acid, glycerophosphonic acid, methylenediphosphonic acid, and ethylenediphosphonic acid; organic phosphoric acids, such as phenylphosphoric acid, a substituted phenylphosphoric acid, naphthylphosphoric acid, an alkylphosphoric acid, and glycerophosphoric acid; organic phosphinic acids, such as phenylphosphinic acid, a substituted phenylphosphinic acid, naphthylphosphinic acid, an alkylphosphinic acid, and glycerophosphinic acid; amino acids, such as glycine and β-alanine; and amine hydrochlorides having a hydroxyl group, such as triethanolamine hydrochloride. These organic compounds can be used either individually or as a mixture of two or more thereof.

The organic undercoat can be formed by (i) a method in which a solution of the organic compound in water or an organic solvent (e.g., methanol, ethanol, methyl ethyl ketone or a mixture thereof) is applied to the aluminum support and dried or (ii) a method in which the aluminum support is dipped in the above-described organic compound solution, washed with water, etc., and dried. The organic compound solution used in the former method has a concentration of 0.005 to 10% by weight. The solution can be applied by bar coater coating, spin coating, spray coating, curtain coating, or a like coating method. The organic compound solution used in the latter method has a concentration of 0.01 to 20% by weight, preferably 0.05 to 5% by weight, and a temperature of 20 to 90° C., preferably 25 to 50° C. The dipping time is 0.1 second to 20 minutes, preferably 2 seconds to 1 minute.

The pH of the organic compound solution can be adjusted within a range-of 1 to 12 by addition of a basic substance, e.g., ammonia, triethylamine or potassium hydroxide, or an acidic substance, e.g., hydrochloric acid or phosphoric acid. The organic compound solution can contain a yellow dye for the purpose of improving tone reproducibility.

The organic compound solution is suitably applied to a dry thickness (in terms of dry coating weight) of 2 to 200 mg/m$^2$, preferably 5 to 100 mg/m$^2$. A coating thickness less than 2 mg/m$^2$ or more than 200 mg/m$^2$ may fail to assure a sufficient press life.

If desired, additional surface treatments, such as dipping in an aqueous solution of potassium fluorozirconate, a phosphate, etc., can be added to the aluminum plate in the course of preparation of the aluminum support.

(Protective Layer for Oxygen Barrier)

Since the lithographic printing plate precursor is usually exposed to light in the air, it is desirable to provide a protective layer for oxygen barrier on the photopolymerizable photosensitive layer. An oxygen-barrier protective layer serves to prevent low-molecular compounds such as oxygen and basic substances present in the air, which interferes with the image formation reaction of the photosensitive layer caused by exposure, from entering the photosensitive layer, thereby permitting exposure in the air. Therefore, the characteristic required of such a protective layer is low permeability to low-molecular compounds such as oxygen. It is additionally desirable for the protective layer to cause no substantial hindrance to transmission of light for exposure, to have high adhesion to the photosensitive layer, and to be easily removable in the step of development which follows exposure.

The oxygen-barrier protective layer preferably comprises water-soluble vinyl polymers. Useful water-soluble vinyl polymers include polyvinyl alcohol, a partial ester, ether or acetal of polyvinyl alcohol, and copolymers thereof comprising an unsubstituted vinyl alcohol unit in such an amount enough to make the whole copolymers water-soluble to a required degree. Useful polyvinyl alcohol includes one having a degree of hydrolysis of 71 to 100% and a degree of polymerization of 300 to 2400. Such polyvinyl alcohol species are available in the market under trade names of PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-220, PVA-224, PVA-217EE, PVA-217E, PVA-220E, PVA-224E, PVA-405, PVA-420, PVA-613, and L-8, all supplied by Kuraray Co., Ltd. The copolymers referred to above include polyvinyl acetate chloroacetate or propionate having a degree of hydrolysis of 88 to 100%, polyvinyl formal, polyvinyl acetal, and copolymers thereof. In addition, polyvinylpyrrolidone, gelatin, gum arabic, etc. are useful polymers. These compounds can be used either individually or as a combination thereof.

The compounds for forming the oxygen-barrier protective layer are applied as dissolved in a solvent, such as pure water, alcohols (e.g., methanol and ethanol), ketones (e.g., acetone and methyl ethyl ketone), a mixed solvent of pure water and the ketone. A suitable solids content of the solution is 1 to 20% by weight.

The coating solution can further contain known additives, such as surface active agents for improving coating properties and water-soluble plasticizers for improving the physical properties of the protective layer. Useful water-soluble plasticizers include propionamide, cyclohexanediol, glycerol, and sorbitol. Water-soluble (meth)acrylic polymers can be added to the coating solution.

The coating solution for the protective layer is applied suitably to a dry thickness of about 0.1 to 15 mg/m$^2$ preferably about 1.0 to 5.0 mg/m$^2$.

The lithographic printing plate precursor of the present invention is imagewise exposed to light for direct writing by use of the second harmonic of an Ar laser or a semiconductor laser (SHG-LD; 350 to 600 nm), a YAG-SHG laser, an He-Ne laser (633, 543or364 nm) an Ar laser (515 or 488 nm), an FD-YAG laser (532 nm), an InGaN semiconductor laser (360 to 450 nm, especially 405 nm) and subjected to development processing.

Conventional alkali aqueous solutions can be used as a developer. Alkalis generally employed include inorganic ones, such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, potassium hydroxide, ammonium hydroxide, and lithium-hydroxide; and organic ones, such as monomethylamine, dimethylamine, trimethylamine, monoethylamine, diethylamine, triethylamine, monoisopropylamine, diisopropylamine, triisopropylamine:, n-butylamine, monoethanolamine, diethanolamine, triethnanolamine, monoisopropanolamine, diisopropanolamine, ethyleneimine, ethylenediamine, and pyridine. These alkalis can be used either individually or as a combination of two or more thereof.

Among aqueous solutions of the above alkalis, an aqueous solution of an alkali metal silicate having a pH of 12 or higher particularly allows the effects of the invention be manifested. The developing properties of an alkali metal silicate aqueous solution are controllable by the ratio of the silicon oxide ($SiO_2$) of the silicate to the alkali metal oxide ($M_2O$, generally represented in terms of $SiO_2/M_2O$ molar ratio, and the concentration. From this point of view, it is preferable to use a sodium silicate aqueous solution having an $SiO_2/Na_2O$ molar ratio of 1.0 to 1.5 and an $SiO_2$ content of 1 to 4% by weight, which is disclosed in JP-A-54-62004; or an alkali metal silicate aqueous solution having an $SiO_2/M$ molar ratio of 0.5 to 0.75 (i.e., $SiO_2/M_2O$=1.0 to 1.5) and an $SiO_2$ content of 1 to 4% by weight and containing potassium in an amount of at least 20% based on the total gram atom of the alkali metals present in the developer, which is proposed in JP-B-57-7427.

Where development is conducted by use of an automatic developing machine, it is known that developing processing could be continued for an prolonged period of time to treat a larger number of lithographic printing plate precursors without exchanging the developer of a developing tank by replenishing the tank with a replenisher having a higher alkali strength than the running developer. This manipulation is also effective in processing the printing plate precursor of the present invention. For example, in case of using the above-described developer of JP-A-54-62004, a developing tank is replenished with a sodium silicate aqueous solution having an $SiO_2/Na_2O$ molar ratio of 0.5 to 1.5. In case of using the developer of JP-B-57-7427, a developing tank is replenished with an alkali metal silicate aqueous solution having an $Sio_2/M$ molar ratio of 0.25 to 0.75 (i.e., $SiO_2/M_2O$=0.5 to 1.5), and both the running developer and the replenisher contain potassium in an amount of 20% based on the respective total alkali metal content in terms of gram atom.

The resulting lithographic printing plate can be subjected to post treatments, i.e., washing with water, rinsing with a rinsing solution containing a surface active agent, etc., and a desensitizing solution containing gum arabic, a starch derivative, etc., as described in JP-A-54-54-8002, JP-A-55-115045 and JP-A-59-58431. These post treatments can be performed in various combinations.

The lithographic printing plate is mounted on an offset printing machine for large-volume printing. The printing plate can be cleaned with a conventional plate cleaner, such as CL-1, CL-2, CP, CN-4, CN, CG-1, PC-1, SR and IC (all supplied by Fuji Photo Film Co., Ltd.).

EXAMPLE

The present invention will now be illustrated in greater detail by way of Synthesis Examples, Examples and Comparative Examples, but it should be understood that the present invention is not deemed to be limited thereto. Unless otherwise noted, all the percents are by weight.

Synthesis Example 1

Synthesis of Polyurethane Resin 5

In a 500 ml three-necked round flask equipped with a condenser and a stirrer, 11.1 g (0.075 mol) of 2,2-bis (hydroxymethyl)butanoic acid and 25.0 g (0.025 mol) of propylene glycol having an average molecular weight of 1,000 were dissolved in 100 ml of N,N-dimethylacetamide. To the solution were added 20.5 g (0.082 mol) of 4,4'-diphenylmethane diisocyanate and 8.3 g (0.021 mol) of diisocyanate compound (2). The mixture was stirred at 100° C. for 5 hours and then diluted with 200 ml of N,N-dimethylformamide and 400 ml of methanol. The reaction solution was poured into 4 liters of water while stirring to precipitate a white polymer, which was collected by filtration, washed with water, and dried in vacuum to obtain 50 g of the polymer. The resulting polymer had a weight average molecular weight of 78,000 as measured by gel-permeation; chromatography (GPC) on a polystyrene standard (hereinafter the same). The carboxyl content (acid value) of the polymer was found by titration to be 1.33 meq/g.

Synthesis Example 2

Synthesis of Polyurethane Resin 36

In 100 ml of N,N-dimethylacetamide were dissolved 11.1 g (0.075 mol) of 2,2-bis(hydroxymethyl)butanoic acid and 25.0 g (0.025 mol) of polypropylene glycol having an average molecular weight of 1,000. To the solution were added 20.5 g (0.082 mol) of 4,4'-diphenylmethane diisocyanate and 10.6 g (0.021 mol) of diisocyanate compound (41), and the mixture was allowed to react and post-processed in the same manner as in Synthesis Example 1 to give 60 g of a polymer, which was found to have a weight average molecular weight of 78,000 by GPC and a carboxyl content (acid value) of 1.33 meq/g by titration.

Polyurethane resins were synthesized in the same manner as in Synthesis Examples 1 and 2, except for using the diisocyanate compound and the diol compound shown in Table 3. The weight average molecular weight (Mw) and the acid value of the resulting resins are also shown in Table 3.

TABLE 3
| Polyurethane Resin | Diisocyanate Compound (mol %) | Diol Compound (mol %) | Mw | Acid Value (meq/g) |
|---|---|---|---|---|
| 1 | 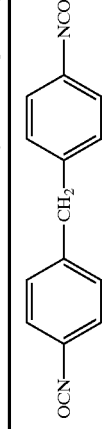 | 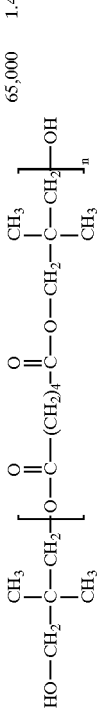 | 78,000 | 1.47 |
| 2 | 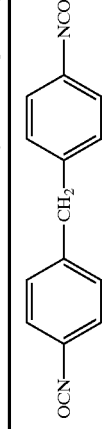 | 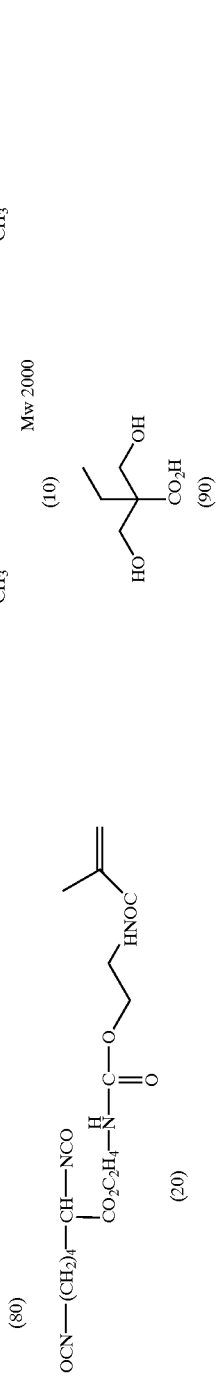 | 65,000 | 1.43 |

TABLE 3-continued

| Poly-urethane Resin | Diisocyanate Compound (mol %) | Diol Compound (mol %) | Mw | Acid Value (meq/g) |
|---|---|---|---|---|
| 3 | [structure: 4,4'-methylenebis(phenyl isocyanate) (70); OCN—(CH$_2$)$_4$—CH(CO$_2$C$_2$H$_4$—NH—C(=O)—O—CH$_2$—CH(O—C(=O)—C(CH$_3$)=CH$_2$)—CH$_2$—O—C(=O)—C(CH$_3$)=CH$_2$)—NCO (30)] | HO—(CH$_2$)$_2$—[O—C(=O)—(CH$_2$)$_4$—C(=O)—O—(CH$_2$)$_2$]$_n$—OH, Mw1500 (80); 2,2-bis(hydroxymethyl)butyric acid (HOCH$_2$)$_2$C(C$_2$H$_5$)(CO$_2$H) (20) | 90,000 | 1.38 |
| 4 | [structure: 4,4'-methylenebis(phenyl isocyanate) (80); OCN—(CH$_2$)$_4$—CH(CO$_2$C$_2$H$_4$—NH—C(=O)—O—CH$_2$CH$_2$—O—C(=O)—C(CH$_3$)=CH$_2$)—NCO (20)] | HO—(CH$_2$CHO)$_n$—H with CH$_3$ branch, Average MW: 1000 (23); 2,2-bis(hydroxymethyl)propionic acid (HOCH$_2$)$_2$C(CH$_3$)(CO$_2$H) (77) | 78,000 | 1.36 |

TABLE 3-continued
| Poly-urethane Resin | Diisocyanate Compound (mol %) | Diol Compound (mol %) | Mw | Acid Value (meq/g) |
|---|---|---|---|---|
| 5 | 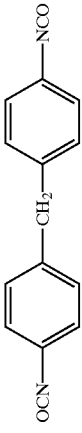 | 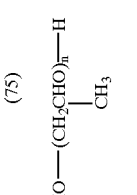 | 78,000 | 1.33 |
| 6 | 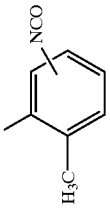 | 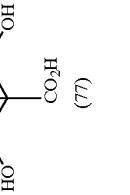 | 70,000 | 1.35 |

TABLE 3-continued
| Polyurethane Resin | Diisocyanate Compound (mol %) | Diol Compound (mol %) | Mw | Acid Value (meq/g) |
|---|---|---|---|---|
| 7 | 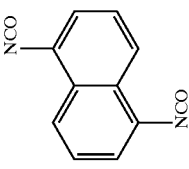 | 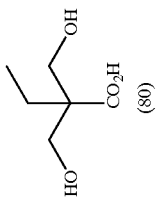 | 68,000 | 1.47 |
| 8 |  | 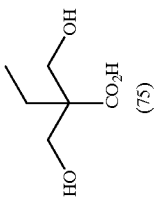 | 75,000 | 1.32 |

TABLE 3-continued
| Polyurethane Resin | Diisocyanate Compound (mol %) | Diol Compound (mol %) | Mw | Acid Value (meq/g) |
|---|---|---|---|---|
| 9 | 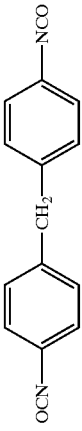 | 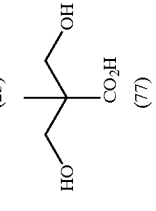 | 69,000 | 1.36 |
| 11 | 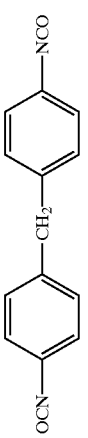 | 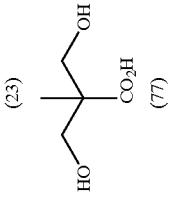 | 69,000 | 1.32 |
| 12 | 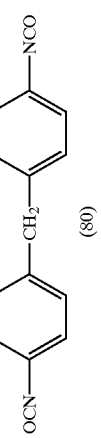 | 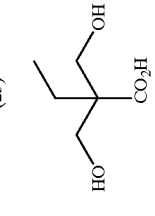 | 75,000 | 1.34 |

TABLE 3-continued
| Poly-urethane Resin | Diisocyanate Compound (mol %) | Diol Compound (mol %) | Mw | Acid Value (meq/g) |
|---|---|---|---|---|
| 13 | 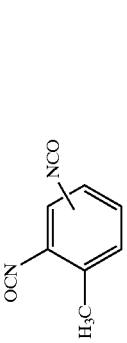 2, 4 and 2, 6 body (70) 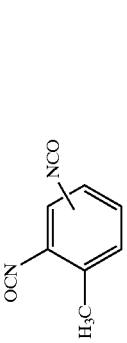 (30) | 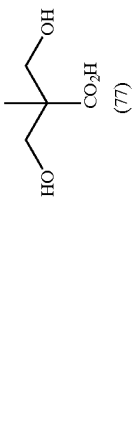 Average MW.: 1000 (23) (77) | 72,000 | 1.33 |
| 14 | 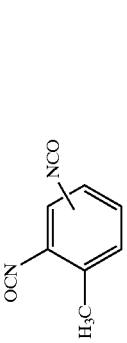 (80) 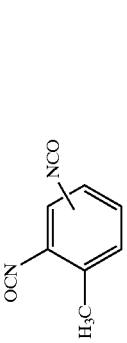 (20) | 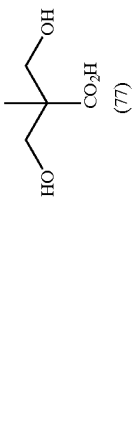 Average MW.: 1000 (23) (77) | 70,000 | 1.34 |

TABLE 3-continued
| Polyurethane Resin | Diisocyanate Compound (mol %) | Diol Compound (mol %) | Mw | Acid Value (meq/g) |
|---|---|---|---|---|
| 15 |  | 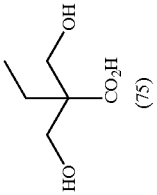 | 80,000 | 1.34 |
| 16 | 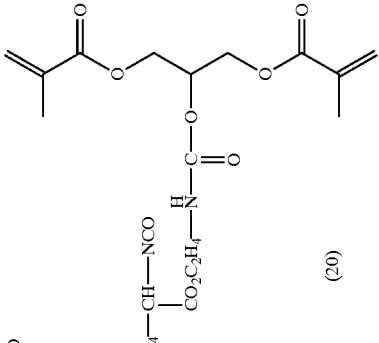 | 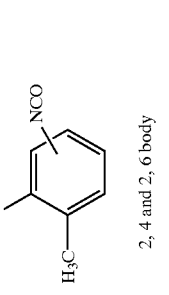 | 68,000 | 1.35 |

TABLE 3-continued
| Polyurethane Resin | Diisocyanate Compound (mol %) | Diol Compound (mol %) | Mw | Acid Value (meq/g) |
|---|---|---|---|---|
| 17 |  | 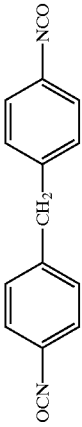 | 58,000 | 1.34 |
| 18 | 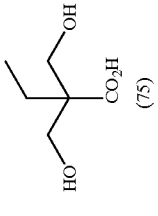 | 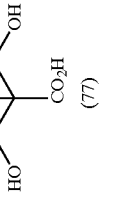 | 68,000 | 1.36 |

TABLE 3-continued
| Poly-urethane Resin | Diisocyanate Compound (mol %) | Diol Compound (mol %) | Mw | Acid Value (meq/g) |
|---|---|---|---|---|
| 19 | 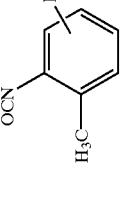 | 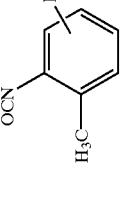 | 65,000 | 1.35 |
| 20 | 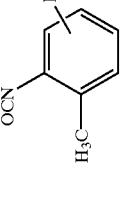 | 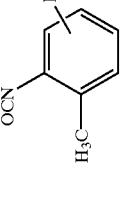 | 55,000 | 1.34 |

TABLE 3-continued
| Poly-urethane Resin | Diisocyanate Compound (mol %) | Diol Compound (mol %) | Mw | Acid Value (meq/g) |
|---|---|---|---|---|
| 21 | 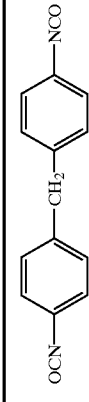 |  | 78,000 | 1.37 |
| 22 | 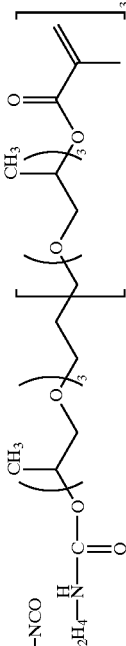 | 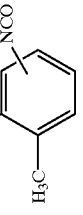 | 60,000 | 1.36 |

TABLE 3-continued
| Polyurethane Resin | Diisocyanate Compound (mol %) | Diol Compound (mol %) | Mw | Acid Value (meq/g) |
|---|---|---|---|---|
| 23 | 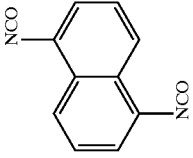 | 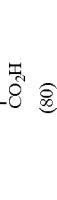 | 71,000 | 1.46 |
| 24 | 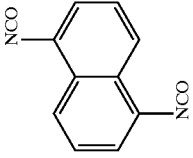 | 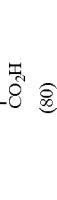 | 60,000 | 1.31 |

TABLE 3-continued
| Polyurethane Resin | Diisocyanate Compound (mol %) | Diol Compound (mol %) | Mw | Acid Value (meq/g) |
|---|---|---|---|---|
| 25 | 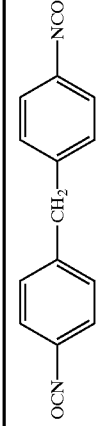 | HO—(CH₂CH₂CH₂CH₂O)ₙ—H  Average MW.: 1000  (23)  <br> HOCH₂-C(CH₃)(CO₂H)-CH₂OH (77) | 70,000 | 1.37 |
| 26 | 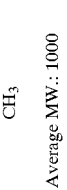 | HO—(CH₂CHO)ₙ—H  |  CH₃  Average MW.: 1000 (20)  <br> 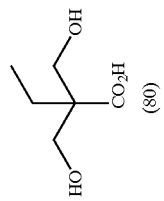 (80) | 85,000 | 1.46 |

TABLE 3-continued

| Poly-urethane Resin | Diisocyanate Compound (mol %) | Diol Compound (mol %) | Mw | Acid Value (meq/g) |
|---|---|---|---|---|
| 27 | IPDI-based diisocyanate with methacrylate groups (70) / OCN—(CH$_2$)$_4$—CH(CO$_2$C$_2$H$_4$-O-C(O)NH-CH$_2$CH(OC(O)C(CH$_3$)=CH$_2$)CH$_2$OC(O)C(CH$_3$)=CH$_2$)—NCO (30) | HO—(CH$_2$CHO)$_n$—H with CH$_3$, Average MW: 1000 (25) / 2,2-bis(hydroxymethyl)butanoic acid-type diol (75) | 58,000 | 1.33 |
| 28 | 4,4'-methylenebis(phenyl isocyanate) (80) / OCN—(CH$_2$)$_4$—CH(CO$_2$C$_2$H$_4$-O-C(O)NH-CH$_2$CH(OC(O)C(CH$_3$)=CH$_2$)CH$_2$OC(O)C(CH$_3$)=CH$_2$)—NCO (20) | HO—(CH$_2$CH$_2$CH$_2$CH$_2$O)$_n$—H, Average MW: 1000 (23) / 2,2-bis(hydroxymethyl)propanoic acid-type diol (77) | 72,000 | 1.36 |

TABLE 3-continued

| Poly-urethane Resin | Diisocyanate Compound (mol %) | Diol Compound (mol %) | Mw | Acid Value (meq/g) |
|---|---|---|---|---|
| 29 | 1,5-naphthalene diisocyanate (70) / OCN—(CH$_2$)$_4$—CH(CO$_2$C$_2$H$_4$—NH—C(=O)—O—CH$_2$—C(CH$_2$—O—C(=O)—C(CH$_3$)=CH$_2$)$_3$)—NCO (30) | HO—(CH$_2$CHO(CH$_3$))$_n$—H, Average MW.: 1000 (20) / 2,2-bis(hydroxymethyl)butanoic acid (80) | 70,000 | 1.43 |
| 30 | isophorone diisocyanate (70) / OCN—(CH$_2$)$_4$—CH(CO$_2$C$_2$H$_4$—NH—C(=O)—O—CH$_2$—C(CH$_2$—O—C(=O)—C(CH$_3$)=CH$_2$)$_3$)—NCO (30) | HO—(CH$_2$CHO(CH$_3$))$_n$—H, Average MW.: 1000 (25) / 2,2-bis(hydroxymethyl)butanoic acid (75) | 50,000 | 1.32 |

TABLE 3-continued
| Poly-urethane Resin | Diisocyanate Compound (mol %) | Diol Compound (mol %) | Mw | Acid Value (meq/g) |
|---|---|---|---|---|
| 31 | 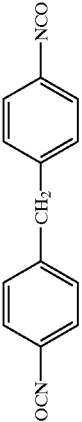 | 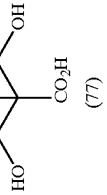 | 60,000 | 1.35 |
| 32 | 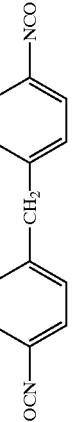 | 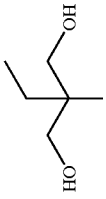 | 61,000 | 1.43 |

TABLE 3-continued
| Polyurethane Resin | Diisocyanate Compound (mol %) | Diol Compound (mol %) | Mw | Acid Value (meq/g) |
|---|---|---|---|---|
| 33 | 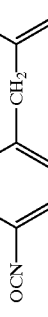 | 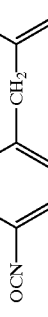 | 58,000 | 1.35 |
| 34 | 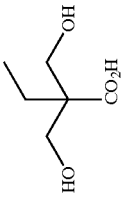 | 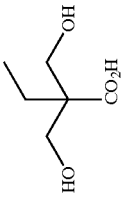 | 60,000 | 1.34 |

TABLE 3-continued
| Polyurethane Resin | Diisocyanate Compound (mol %) | Diol Compound (mol %) | Mw | Acid Value (meq/g) |
|---|---|---|---|---|
| 35 | 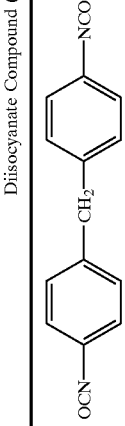 | 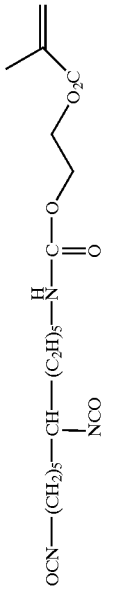 | 73,000 | 1.36 |
| 36 |  |  | 78,000 | 1.33 |

TABLE 3-continued
| Polyurethane Resin | Diisocyanate Compound (mol %) | Diol Compound (mol %) | Mw | Acid Value (meq/g) |
|---|---|---|---|---|
| 37 | 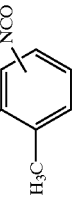 | 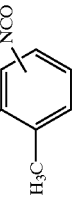 | 75,000 | 1.35 |
| 38 | 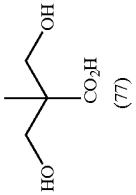 | 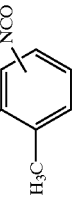 | 69,000 | 1.32 |

TABLE 3-continued
| Polyurethane Resin | Diisocyanate Compound (mol %) | Diol Compound (mol %) | Mw | Acid Value (meq/g) |
|---|---|---|---|---|
| 39 |  (80) 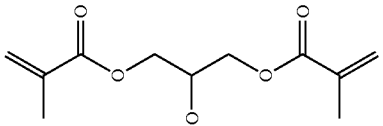 (20) | 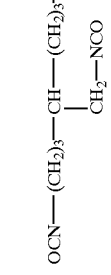 Average MW.: 1000 (25)  (75) | 75,000 | 1.34 |
| 40 | 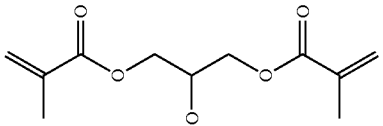 2, 4 and 2, 6 body (70) 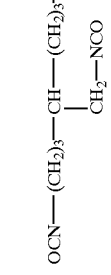 (30) |  Average MW.: 1000 (23) 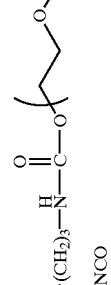 (77) | 72,000 | 1.32 |

TABLE 3-continued

| Poly-urethane Resin | Diisocyanate Compound (mol %) | Diol Compound (mol %) | Mw | Acid Value (meq/g) |
|---|---|---|---|---|
| 41 | (structures, 80/20) | (structures, 23/77), Average MW: 1000 | 62,000 | 1.34 |
| 42 | (structures, 80/20) | (structures, 25/75), Average MW: 1000 | 87,000 | 1.34 |

TABLE 3-continued
| Polyurethane Resin | Diisocyanate Compound (mol %) | Diol Compound (mol %) | Mw | Acid Value (meq/g) |
|---|---|---|---|---|
| 43 |  (70) / 2, 4 and 2, 6 body 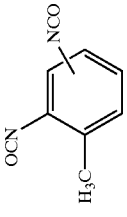 (30) | HO—(CH₂CHO)ₙ—H, CH₃, Average MW.: 1000 (23) / 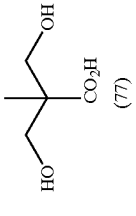 (77) | 70,000 | 1.33 |
| 44 |  (80) / (20) | Mw2000 (25) / (75) | 70,000 | 1.35 |

TABLE 3-continued
| Polyurethane Resin | Diisocyanate Compound (mol %) | Diol Compound (mol %) | Mw | Acid Value (meq/g) |
|---|---|---|---|---|
| 45 | 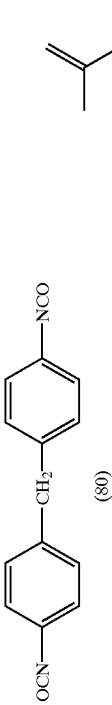 (80) / 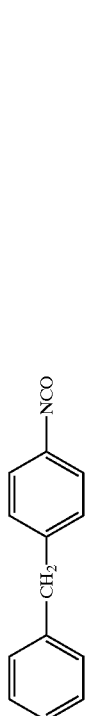 (20) | HO—(CH$_2$)$_6$—O—C(=O)—O—[(CH$_2$)$_6$—O]$_n$—OH Mw2000 (25) / HOCH$_2$—C(CH$_2$OH)(CO$_2$H)—CH$_2$CH$_3$ (75) | 60,000 | 1.36 |
| 46 | 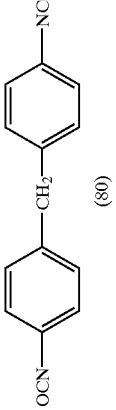 (80) / 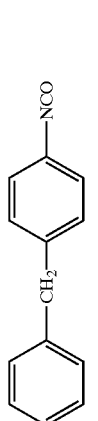 (20) | HO—(CH$_2$)$_6$—O—C(=O)—O—[(CH$_2$)$_6$—O]$_n$—OH Mw2000 (25) / HOCH$_2$—C(CH$_2$OH)(CO$_2$H)—CH$_2$CH$_3$ (75) | 60,000 | 1.34 |

Examples 1 to 11 and Comparative Examples 1 to 3

Preparation of Aluminum Support

A 0.30 mm thick aluminum plate made of aluminum 1S was grained with a nylon brush (No. 8) and an aqueous suspension of pumice (800 mesh). After thorough washing with water, the plate was immersed in a 10% sodium hydroxide aqueous solution at 70° C. for 60 seconds, followed by washing with running water. The plate was washed with 20% nitric acid for neutralization, followed by washing with water. The plate was grained by electrolysis in a 1% nitric acid aqueous solution using a sinusoidal alternating current at a voltage $V_A$ of 12.7 V and an anodic electricity quantity of 300 Coulomb/dm². The resulting plate had a center-line average roughness (Ra) of 0.45 mm. The plate was immersed in a 30% sulfuric acid aqueous solution at 55° C. for 2 minutes for desmutting. Then the plate was anodized in a 20% sulfuric acid aqueous solution at 33° C. for 50 seconds at a current density of 5 A/dm² with a cathode disposed on the side of the grained surface. The formed anodized layer had a thickness of 2.7 g/m².

Formation of Undercoat

A coating composition for an undercoat was prepared by mixing the following components in a beaker by stirring at 25° C. for 20 minutes.

| | |
|---|---|
| Si (OC$_2$H$_5$)$_4$ | 38 g |
| 3-Methacryloxypropyltrimethoxysilane | 13 g |
| 85% Phosphoric acid aqueous solution | 12 g |
| Ion-exchanged water | 15 g |
| Methanol | 100 g |

The resulting solution was transferred to a three-necked flask equipped with a refluxing Condenser. The flask was put into an oil bath at room temperature, and the contents were heated up to 50° C. over 30 minutes while stirring with a magnetic stirrer and further allowed to react for 1 hour while keeping the bath temperature at 50° C. to prepare a coating composition.

The composition was diluted to 0.5% with methanol/ethylene glycol (20/1 by weight) and applied to the aluminum support by wheeler coating and dried at 100° C. for 1 minute. The coating weight in terms of Si as measured by X-ray fluorescence analysis was 3.0 mg/m².

Formation of Photosensitive Layer

A photopolymerizable composition having the following formulation was applied to the aluminum support to a dry coating weight of 1.5 g/m² and dried at 120° C. for 1 minute to form a photosensitive layer.

Formulation of Photopolymerizable Composition

| | |
|---|---|
| NK Oligo U-4H (tetrafunctional urethane acrylate, available from Shin-Nakamura Kagaku K.K.) | 2.0 g |
| Polyurethane resin binder (B1) shown in Table 4 | 2.0 g |
| CGI-784 [bis(cyclopentadienyl)bis(2,6-difluoro-3-(pyr-1-yl))titanium, available from Ciba Specialty Chemicals) | 0.4 g |
| 1,3-Dibutyl-5-[7-(N,N-diethylamino)-4-methyl-2H-chromen-2-ylidene]-2-thioxo-4,6-(1H, 3H, 5H) pyrimidinedione | 0.1 g |
| 2-Methyl-4-(methylthio)-2-morpholinopropiophenone-O-(p-vinylbenzyloxy)carbonylmethyloxime | 0.4 g |
| ε-Phthalocyanine/(B1) dispersion | 0.2 g |
| Megafac F176 (fluorine-type nonionic surface active agent, available from Dainippon Ink & Chemicals, Inc.) | 0.03 g |
| Kupelon AL/tricresyl phosphate (plasticizer) [1/9] (Kupelon AL: nitroso compound available from Wako Pure Chemical Ind.,Ltd.) | 0.05 g |
| Methyl ethyl ketone | 30.0 g |
| Propylene glycol monomethyl ether acetate | 30.0 g |

Formation of Oxygen Barrier Layer

A 5% aqueous solution containing the following components was applied to the photosensitive layer to obtain a dry coating weight of 2.5 g/m² and dried at 120° C. for 2 minutes to form an oxygen barrier layer, thereby to complete a lithographic printing plate precursor for laser writing.

Composition of Oxygen-barrier Layer:

Kuraray Poval PVA-105 (polyvinyl alcohol having a degree of saponification of 98 mol % and a degree of polymerization of 500, available from Kuraray Co,., Ltd.) 95%

Polyvinylpyrrolidone K30 (available from Wako Pure Chemical Ind., Ltd.) 5%

Preparation of Lithographic Printing Plate and Evaluation

The printing plate precursor thus obtained was imagewise exposed to light by use of a plate setter CELIC 8200 CTP (Ar laser (488 nm), supplied by Fuji Photo Film Co., Ltd.) at an output of 0.2 mJ/cm² as focused on the plate surface to give a dot image having a dot percent varying from 1 to 99% at a line density of 175 lines per inch and a dot density of 2540 dpi. The exposed plate was developed on an automatic developing machine LP850P-II (supplied by Fuji Photo Film Co., Ltd.) with a developer (LP-D, available from Fuji Photo Film, 9-fold diluted with water and adjusted to a pH of 12.8, used at a liquid temperature of 25° C.) and a finisher (FP-2W gum solution, available from Fuji Photo Film, 3-fold diluted with water) to produce a lithographic printing plate.

The printing plate was mounted on a f our-color printing machine MOV, manufactured by Heilderberger Druckmaschien AG, and printing was carried out to obtain 120,000 prints using an ink Craph G(N) available from Dainippon Ink & Chemicals. The press life of the printing plate was evaluated from the number of prints which reproduced 2% dots in 175 lines/inch. The results obtained are shown in Table 4.

TABLE 4

| | Binder in Photosensitive Layer | Life |
|---|---|---|
| Example 1 | polyurethane resin 3 | 100,000 |
| Example 2 | polyurethane resin 5 | 90,000 |
| Example 3 | polyurethane resin 13 | 100,000 |
| Example 4 | polyurethane resin 17 | 100,000 |
| Example 5 | polyurethane resin 20 | 110,000 |

TABLE 4-continued

| | Binder in Photosensitive Layer | Life |
|---|---|---|
| Example 6 | polyurethane resin 24 | 100,000 |
| Example 7 | polyurethane resin 26 | 100,000 |
| Example 8 | polyurethane resin 30 | 100,000 |
| Example 9 | polyurethane resin 36 | 90,000 |
| Example 10 | polyurethane resin 39 | 100,000 |
| Example 11 | polyurethane resin 42 | 100,000 |
| Compara. Example 1 | polyurethane resin 5 with the unsaturated group-containing diisocyanate replaced with pentamethylene diisocyanate | 10,000 |
| Compara. Example 2 | polyurethane resin 36 with the unsaturated group-containing diisocyanate replaced with hexamethylene diisocyanate | 10,000 |
| Compara. Example 3 | allyl methacrylate/methacrylic acid copolymer (80/20 by mole; Mw = 40,000) | 10,000 |

It can be seen from the results in Table 4 that the printing plates whose photosensitive layer contains a polyurethane resin binder carrying a polymerizable group in the side chain thereof have a long press life in highlights, whereas polyurethane resin binders having no polymerizable group or other binders than polyurethane resins have a shorter highlight press life.

The lithographic printing plate precursor according to the invention, of which the photopolymerizable photosensitive layer contains, as a binder, a polyurethane having at least one ethylenically unsaturated polymerizable group in the side chain thereof, exhibits high sensitivity and provides a lithographic printing plate with an excellent press life and stain resistance, particularly excellent highlight characteristics.

While the invention has been described in detail and with reference to specific embodiments thereof, it will be apparent to one skilled in the art that various changes and modification can be made therein without departing from the spirit and scope thereof.

What is claimed is:

1. A lithographic printing plate precursor comprising an aluminum support having thereon a photopolymerizable photosensitive layer which contains (1) an alkali-soluble urethane binder having at least one ethylenically unsaturated polymerizable group on the side chain thereof wherein said urethane binder is a reaction product between (A) an ethylenically unsaturated group-containing diisocyanate compound obtained by allowing (A1) a compound having three or more isocyanate groups per molecule and (A2) an ethylenically unsaturated compound having an active hydrogen atom to react and (B) a diol compound having an alkali-soluble group, (2) an addition polymerizable compound having an ethylenically unsaturated double bond, and (3) a photopolymerization initiator.

2. The lithographic printing plate precursor of claim 1, wherein the ethylenically unsaturated compound (A2) is a monofunctional alcohol or a monofunctional amine compound, having an ethylenically unsaturated group.

3. The lithographic printing plate precursor of claim 1, wherein the alkali-soluble group contained in the diol compound (B) is a carboxyl group.

4. The lithographic printing plate precursor of claim 3, wherein the content of the carboxyl group is 0.4 to 3.5 meq/g.

5. The lithographic printing plate precursor of claim 1, wherein the urethane binder has a weight average molecular weight of from 10,000 to 300,000.

6. The lithographic printing plate precursor of claim 1, wherein the addition polymerizable compound is a urethane addition polymerizable compound prepared by addition reaction between an isocyanate group and a hydroxyl group.

7. The lithographic printing plate precursor of claim 1, wherein the photopolymerization initiator is a metallocene compound.

\* \* \* \* \*